United States Patent
Asai et al.

(10) Patent No.: US 9,906,205 B2
(45) Date of Patent: *Feb. 27, 2018

(54) SEMICONDUCTOR DEVICE, MANUFACTURING METHOD OF THE SAME, AND MOBILE PHONE

(71) Applicant: RENESAS ELECTRONICS CORPORATION, Tokyo (JP)

(72) Inventors: Kengo Asai, Tokyo (JP); Atsushi Isobe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 51 days.

This patent is subject to a terminal disclaimer.

(21) Appl. No.: 15/041,368

(22) Filed: Feb. 11, 2016

(65) Prior Publication Data

US 2016/0164478 A1    Jun. 9, 2016

Related U.S. Application Data

(63) Continuation of application No. 14/008,240, filed as application No. PCT/JP2012/055970 on Mar. 8, 2012, now Pat. No. 9,299,914.

(30) Foreign Application Priority Data

Apr. 1, 2011  (JP) .................................. 2011-081573

(51) Int. Cl.
*H03H 9/70* (2006.01)
*H01L 41/332* (2013.01)
(Continued)

(52) U.S. Cl.
CPC ....... *H03H 9/0542* (2013.01); *H01L 23/3192* (2013.01); *H01L 23/36* (2013.01);
(Continued)

(58) Field of Classification Search
CPC .. H03H 9/0538; H03H 9/0542; H03H 9/0566; H03H 9/0571; H03H 9/173;
(Continued)

(56) References Cited

U.S. PATENT DOCUMENTS 3,548,346 A   12/1970  Page
5,075,641 A   12/1991  Weber et al.
(Continued)

FOREIGN PATENT DOCUMENTS

JP   02-58255 A    2/1990
JP   02079516      3/1990
(Continued)

OTHER PUBLICATIONS

Japanese Office Action received in corresponding Japanese Application No. 2013-508799 dated Jan. 13, 2015.
(Continued)

*Primary Examiner* — Barbara Summons
(74) *Attorney, Agent, or Firm* — Mattingly & Malur, PC

(57) ABSTRACT

A technique capable of maintaining the filter characteristics of a transmitting filter and a receiving filter by reducing the influences of heat from the power amplifier given to the transmitting filter and the receiving filter as small as possible in the case where the transmitting filter and the receiving filter are formed on the same semiconductor substrate together with the power amplifier in a mobile communication equipment typified by a mobile phone is provided. A high heat conductivity film HCF is provided on a passivation film PAS over the entire area of a semiconductor substrate 1S including an area AR1 on which an LDMOSFET is formed and an area AR2 on which a thin-film piezoelectric bulk wave resonator BAW is formed. The heat mainly generated in the LDMOSFET is efficiently dissipated in all
(Continued)

directions by the high heat conductivity film HCF formed on the surface of the semiconductor substrate 1S.

9 Claims, 55 Drawing Sheets

(51) Int. Cl.
    *H03H 9/05*     (2006.01)
    *H01L 27/06*     (2006.01)
    *H04B 1/036*     (2006.01)
    *H01L 23/31*     (2006.01)
    *H01L 41/09*     (2006.01)
    *H04B 1/40*     (2015.01)
    *H01L 23/36*     (2006.01)
    *H01L 23/373*     (2006.01)
    *H03F 3/19*     (2006.01)
    *H03F 3/21*     (2006.01)
    *H01L 29/417*     (2006.01)
    *H01L 29/66*     (2006.01)
    *H01L 29/78*     (2006.01)

(52) U.S. Cl.
    CPC ........ *H01L 23/373* (2013.01); *H01L 27/0629* (2013.01); *H01L 41/0926* (2013.01); *H01L 41/332* (2013.01); *H03F 3/19* (2013.01); *H03F 3/211* (2013.01); *H03H 9/0571* (2013.01); *H03H 9/706* (2013.01); *H04B 1/036* (2013.01); *H04B 1/40* (2013.01); *H01L 29/4175* (2013.01); *H01L 29/41758* (2013.01); *H01L 29/66659* (2013.01); *H01L 29/7835* (2013.01); *H01L 2924/0002* (2013.01); *H03F 2200/171* (2013.01); *H03F 2200/294* (2013.01); *H03F 2200/451* (2013.01)

(58) Field of Classification Search
    CPC ........ H03H 9/175; H03H 9/545; H03H 9/706; H04B 1/40; H04B 1/48; H04B 1/3861; H04B 1/036; H04M 1/72519; H01L 23/3192; H01L 23/36; H01L 27/02; H01L 27/0211; H01L 27/0229; H01L 27/0248; H01L 27/04; H01L 27/0611; H01L 29/4175; H01L 29/41758; H01L 2924/1421; H01L 2924/00; H01L 2924/0002; H01L 2924/19015; H01L 41/04; H01L 41/053; H01L 41/0533
    USPC ........ 333/133, 187, 189; 257/197, 205, 254, 257/275, 288, 368, 379, 416, 528; 455/73, 78, 82, 83, 550.1, 571
    See application file for complete search history.

(56) References Cited

U.S. PATENT DOCUMENTS

| | | | |
|---|---|---|---|
| 5,166,646 A | 11/1992 | Avanic et al. | |
| 5,260,596 A | 11/1993 | Dunn et al. | |
| 5,789,845 A | 8/1998 | Wadaka et al. | |
| 6,297,515 B1 | 10/2001 | Yuan | |
| 6,355,498 B1 | 3/2002 | Chan et al. | |
| 6,486,751 B1 | 11/2002 | Barber et al. | |
| 6,905,970 B2 | 6/2005 | Shing et al. | |
| 6,992,400 B2 | 1/2006 | Tikka et al. | |
| 7,240,410 B2 | 7/2007 | Yamada et al. | |
| 7,514,759 B1 | 4/2009 | Mehta et al. | |
| 9,299,914 B2* | 3/2016 | Asai ..................... | H03H 9/0542 |
| 2001/0045603 A1 | 11/2001 | Yamazaki et al. | |
| 2002/0105079 A1 | 8/2002 | Yamaguchi et al. | |
| 2003/0132683 A1 | 7/2003 | Yamada et al. | |
| 2005/0085201 A1 | 4/2005 | Martin et al. | |
| 2005/0151600 A1 | 7/2005 | Takeuchi et al. | |
| 2006/0098059 A1 | 5/2006 | Ohguro et al. | |
| 2006/0139122 A1 | 6/2006 | Asai et al. | |
| 2007/0090892 A1 | 4/2007 | Larson, III | |
| 2007/0093229 A1 | 4/2007 | Yamakawa et al. | |
| 2007/0194863 A1 | 8/2007 | Shibata et al. | |
| 2008/0169728 A1 | 7/2008 | Asai et al. | |
| 2008/0237736 A1 | 10/2008 | Sakurai et al. | |
| 2008/0315392 A1 | 12/2008 | Farrell et al. | |
| 2009/0322186 A1 | 12/2009 | Iwashita et al. | |

FOREIGN PATENT DOCUMENTS

| | | |
|---|---|---|
| JP | 03-295267 A | 12/1991 |
| JP | 06-177386 A | 6/1994 |
| JP | 10-209464 A | 8/1998 |
| JP | 2001-305584 A | 10/2001 |
| JP | 2002-175081 A | 6/2002 |
| JP | 2002-185007 A | 6/2002 |
| JP | 2002-231721 A | 8/2002 |
| JP | 2003-100989 A | 4/2003 |
| JP | 2004282514 | 10/2004 |
| JP | 2005-101366 A | 4/2005 |
| JP | 2006-140271 A | 6/2006 |
| JP | 2006-180304 A | 7/2006 |
| JP | 2007-511115 A | 4/2007 |
| JP | 2007-143127 A | 6/2007 |
| JP | 2007-143128 A | 6/2007 |
| JP | 2007-184691 A | 7/2007 |
| JP | 2007-221588 A | 8/2007 |
| JP | 2010-531060 A | 9/2010 |
| KR | 2003-0036534 A | 5/2003 |
| WO | 2008032543 A1 | 3/2008 |

OTHER PUBLICATIONS

English language machine translation of JP 2004-282514, published on Oct. 7, 2004.

Chinese Office Action received in corresponding Chinese Application No. 201280015308.2 dated Feb. 3, 2016.

Korean Office Action received in corresponding Korean Application No. 10-2013-7025468 dated Dec. 20, 2017.

\* cited by examiner ium tantalate (LiTaO_3), quartz, or the like.

SEMICONDUCTOR DEVICE, MANUFACTURING METHOD OF THE SAME, AND MOBILE PHONE

TECHNICAL FIELD

The present invention relates to a semiconductor device, a manufacturing method of the same, and a mobile phone, and more particularly to a technique effectively applied to a technique for forming a thin-film piezoelectric bulk wave resonator and a semiconductor element in the same semiconductor chip.

BACKGROUND

Japanese Patent Application Laid-Open Publication No. 2002-175081 (Patent Document 1) describes a technique for forming a TFR (thin-film resonator) on a cavity. This technique indicates that the cavity can be formed by using a selective etching. More specifically, it indicates that the cavity is formed by etching a high resistivity silicon layer coated on a layer for forming a bottom etching barrier.

PRIOR ART DOCUMENTS

Patent Documents

Patent Document 1: Japanese Patent Application Laid-Open Publication No. 2002-175081

SUMMARY

Problems to be Solved by the Invention

In recent years, mobile communication equipments (for example, mobile phones) typified by communication systems such as GSM (Global System for Mobile Communications) (registered trademark), PCS (Personal Communication Systems), PDC (Personal Digital Cellular) and CDMA (Code Division Multiple Access) have been widely spread all over the world.

In general, in the mobile phone, a baseband signal processed in a baseband unit is modulated into a transmission signal (radio frequency signal) in an RFIC unit, and the power of the modulated transmission signal is amplified by a power amplifier. Then, the transmission signal is radiated from an antenna as a radio wave through a transmitting filter with a transmission band as a passband. On the other hand, a reception signal received by the antenna is inputted to a low noise amplifier through a receiving filter with a reception band as a passband. Moreover, in the low noise amplifier, the reception signal is amplified, and the amplified reception signal is demodulated to a baseband signal in the RFIC unit. Thereafter, the demodulated baseband signal is processed in a baseband unit. In this manner, the transmitting/receiving process can be carried out in the mobile phone.

As described above, in the mobile phone, the transmitting filter and the receiving filter are provided, and the transmitting filter and the receiving filter are formed by, for example, SAW (Surface Acoustic Wave) filters. The SAW filter is a filter utilizing the principle of surface elastic waves, and the filter allows only a signal having a specific wavelength to pass therethrough by using a structural cycle of comb-shaped electrodes formed on a piezoelectric substrate made of lithium tantalate (LiTaO_3), quartz, or the like.

In recent years, in order to achieve further multifunctionality and reduction in size and weight of a mobile phone, the integration of parts constituting the mobile phone has been further promoted. For example, a structure in which a transmitting filter, a receiving filter and a power amplifier are formed on the same semiconductor substrate (semiconductor chip) has been studied. However, while an amplifying transistor constituting a power amplifier is formed on a semiconductor substrate, SAW filters constituting a transmitting filter and a receiving filter are formed on a piezoelectric substrate. Consequently, as long as the SAW filters are used for the transmitting filter and the receiving filter, it is not possible to form the power amplifier and the transmitting and receiving filters on the same semiconductor substrate.

For this reason, a BAW (Bulk Acoustic Wave) filter has been gaining attention as a filter that can replace the SAW filter. This BAW filter is a filter constituted by a thin-film piezoelectric bulk wave resonator in which a piezoelectric film made of, for example, aluminum nitride (AlN), zinc oxide (ZnO), or the like is sandwiched by an upper electrode and a lower electrode made of, for example, molybdenum (Mo). The SAW filter and the BAW filter are different from each other in that the above-mentioned SAW filter utilizes surface elastic waves, while the BAW filter utilizes resonance oscillations of the piezoelectric film itself referred to as bulk elastic waves. Since the BAW filter utilizes resonance oscillations of the piezoelectric film itself, the substrate itself for use in forming a piezoelectric film is not required to be a piezoelectric substrate, and the filter can be formed on various substrates. For this reason, the BAW filter can be formed on, for example, a semiconductor substrate made of silicon. Therefore, it is considered that the possibility of forming the power amplifier and the transmitting and receiving filters on the same semiconductor substrate becomes higher by using the BAW filter as the transmitting filter and the receiving filter. In other words, the possibility of forming the amplifying transistor constituting a power amplifier and the BAW filters constituting a transmitting filter and a receiving filter on the same semiconductor substrate becomes higher.

However, in the case where the power amplifier and the transmitting and receiving filters are formed on the same semiconductor substrate, there is fear that heat generated from the power amplifier might cause adverse effects on the transmitting filter and the receiving filter. More specifically, since the resonance frequency of the thin-film piezoelectric bulk wave resonator constituting the transmitting filter and the receiving filter has temperature dependence, the resonance frequency of the thin-film piezoelectric bulk wave resonator deviates from the designed value when the heat from the power amplifier is transmitted to the thin-film piezoelectric bulk wave resonator. As a result, the filter characteristics (electrical characteristics) of the transmitting filter and the receiving filter are deteriorated. In particular, in conjunction with the increase in transmission capacity and transmission rate in the mobile communication system, the power to be dealt in a mobile phone becomes larger, and the amount of heat generated from the power amplifier tends to increase. For this reason, it found that, in the case where the transmitting filter, the receiving filter and the power amplifier are mounted on the same semiconductor substrate, it is necessary to suppress the heat generated from the power amplifier from being transmitted to the transmitting filter and the receiving filter as small as possible so as to suppress the influences thereof to be given to the filter characteristics (electrical characteristics) of the transmitting filter and the receiving filter.

For example, an object of the present invention is to provide a technique capable of maintaining the filter characteristics (electrical characteristics) of a transmitting filter and a receiving filter by reducing the influences of heat from the power amplifier given to the transmitting filter and the receiving filter as small as possible in the case where the transmitting filter and the receiving filter are formed on the same semiconductor substrate together with the power amplifier in a mobile communication equipment typified by a mobile phone.

The above and other objects and novel characteristics of the present invention will be apparent from the descriptions of the present specification and the accompanying drawings.

Means for Solving the Problems

The following is a brief description of an outline of the typical invention disclosed in the present application.

A semiconductor device in a typical embodiment includes: (a) a semiconductor substrate; (b) a semiconductor element formed on a first area of the semiconductor substrate; and (c) an insulating film formed on the semiconductor substrate so as to cover the semiconductor element. Also, it includes: (d) a high heat conductivity film which is formed on the insulating film and has a heat conductivity higher than that of the insulating film; and (e) a thin-film piezoelectric bulk wave resonator which is formed on the insulating film formed on a second area of the semiconductor substrate, with the high heat conductivity film interposed therebetween.

Moreover, a mobile phone in a typical embodiment includes: (a) a baseband unit for processing a baseband signal; (b) an RFIC unit for modulating the baseband signal processed in the baseband unit into a transmission signal; and (c) a power amplifier for amplifying a power of the transmission signal modulated in the RFIC unit. Also, it includes: (d) a transmitting filter having a frequency band of the transmission signal amplified in the power amplifier as a passband thereof; (e) an antenna for transmitting the transmission signal which has passed through the transmitting filter, and (f) a receiving filter having a frequency band of a reception signal received by the antenna as a passband thereof. Further, it includes (g) a low noise amplifier for amplifying the reception signal which has passed through the receiving filter, and the RFIC unit has a function of demodulating the reception signal amplified by the low noise amplifier. Here, the power amplifier includes an amplifying transistor for amplifying the transmission signal, the transmitting filter and the receiving filter are constituted by a plurality of thin-film piezoelectric bulk wave resonators, and the power amplifier, the transmitting filter and the receiving filter are formed in the same semiconductor chip. At this time, the semiconductor chip includes: (f1) a semiconductor substrate; (f2) the amplifying transistor formed on a first area of the semiconductor substrate; and (f3) an insulating film formed on the semiconductor substrate so as to cover the amplifying transistor. Moreover, the semiconductor chip includes: (f4) a high heat conductivity film which is formed on the insulating film and has a heat conductivity higher than that of the insulating film; and (f5) the thin-film piezoelectric bulk wave resonator formed on the insulating film formed on the second area of the semiconductor substrate, with the high heat conductivity film being interposed therebetween.

Furthermore, a manufacturing method of a semiconductor device in a typical embodiment relates to a manufacturing method of a semiconductor device which includes a thin-film piezoelectric bulk wave resonator and a semiconductor element formed on the same semiconductor substrate, the thin-film piezoelectric bulk wave resonator including: an acoustic insulating portion; a lower electrode formed on the acoustic insulating portion; a piezoelectric layer formed on the lower electrode; and an upper electrode formed on the piezoelectric layer. The manufacturing method of a semiconductor device includes the steps of: (a) forming the semiconductor element on a first area of the semiconductor substrate; (b) after the step (a), forming an insulating film on the semiconductor substrate so as to cover the semiconductor element; and (c) after the step (b), forming a concave portion on a surface of the insulating film formed on a second area of the semiconductor substrate. Also, it includes the steps of: (d) after the step (c), forming a protective film on the insulating film; (e) after the step (d), forming a sacrificial layer to be buried in the concave portion; and (f) after the step (e), forming a first conductor film on the protective film including an upper portion of the sacrificial layer. Next, it includes the steps of: (g) after the step (f), patterning the first conductor film, thereby forming the lower electrode on the sacrificial layer and the protective film formed on the second area of the semiconductor substrate; and (h) after the step (g), forming a piezoelectric film on the protective film including an upper portion of the lower electrode. Subsequently, it includes the steps of: (i) after the step (h), forming a second conductor film on the piezoelectric film; and (j) after the step (i), patterning the second conductor film and the piezoelectric film, thereby forming the piezoelectric layer and the upper electrode. Moreover, it includes the step of: (k) after the step (j), etching the sacrificial layer buried in the concave portion to remove the sacrificial layer, thereby forming a cavity portion to be the acoustic insulating portion. Here, the protective film functions as an etching stopper when etching the sacrificial layer buried in the concave portion.

Effects of the Invention

The effects obtained by typical embodiments of the invention disclosed in the present application will be briefly described below.

For example, in the case where transmitting and receiving filters and a power amplifier are formed on the same semiconductor substrate in a mobile communication equipment typified by a mobile phone, the filter characteristics (electrical characteristics) of the transmitting filter and the receiving filter can be maintained by suppressing the heat from the power amplifier from being transmitted to the transmitting filter and the receiving filter.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted. Note that hatching is used even in a plan view so as to make the drawings easy to see.

First Embodiment

<Configuration and Operation of Mobile Phone>

Figure 1:
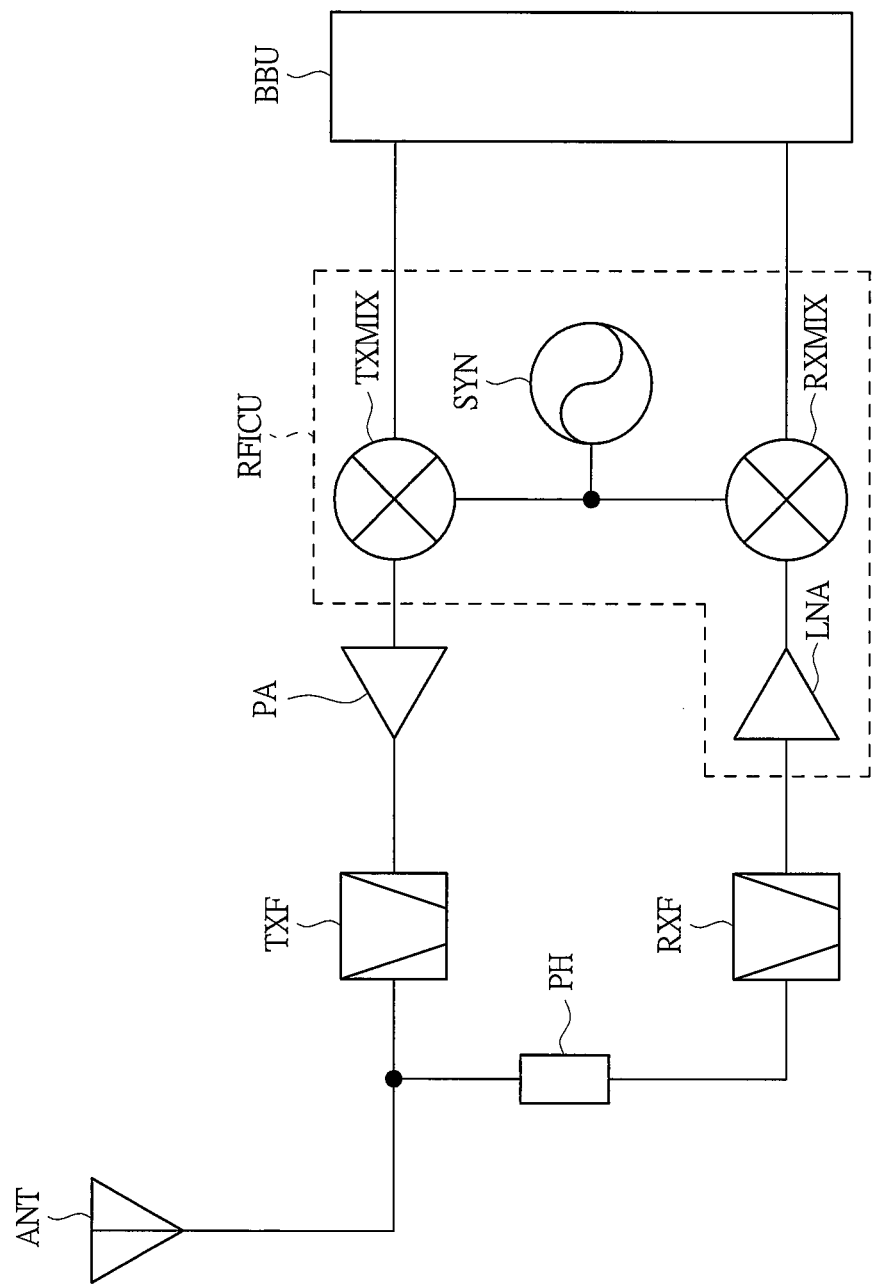
FIG. 1 is a block diagram showing a configuration of a transmitting/receiving unit of a mobile phone.

FIG. 1 is a block diagram showing a configuration of a transmitting/receiving unit of a mobile phone. As shown in FIG. 1, the mobile phone is provided with a baseband unit BBU, a radio frequency integrated circuit unit RFICU, a power amplifier PA, a transmitting filter TXF, a receiving filter RXF, a phase shifter PH and an antenna ANT.

The baseband unit BBU is configured so as to digitally process a voice signal (analog signal) from a user (caller) through an operation unit and generate a baseband signal at the time of transmission. Meanwhile, it is configured so as to generate a voice signal from the baseband signal which is a digital signal at the time of reception.

The radio frequency integrated circuit unit RFICU is configured so that it modulates a baseband signal to generate a radio frequency signal at the time of transmission and it demodulates a reception signal to generate a baseband signal at the time of reception. More specifically, the radio frequency integrated circuit unit RFICU is provided with a transmitting mixer TXMIX, a synthesizer (modulating signal source) SYN, a receiving mixer RXMIX and a low noise amplifier LNA. In this case, the synthesizer SYN is a circuit in which a reference oscillator such as a quartz oscillator whose frequency is stable is used to obtain a modulating signal, and the transmitting mixer TXMIX and the receiving mixer RXMIX are frequency converters for converting frequencies. Moreover, the low noise amplifier LNA amplifies a weak reception signal while suppressing an increase of noises.

The power amplifier PA is a circuit which newly generates a signal having a large power that is similar to a weak input signal by using a power supplied from a power supply, and outputs the generated signal. The antenna ANT is used to transmit and receive a radio wave and compatibly serves as a transmitting antenna and a receiving antenna. Moreover, the transmitting filter TXF is a band-pass filter which has a transmitting frequency band as a passband and a receiving frequency band as a stopband, and the receiving filter RXF is a band-pass filter which has a receiving frequency band as a passband and a transmitting frequency band as a stopband. Furthermore, the phase shifter PH is provided so as to control impedance.

For example, in the case where a single antenna is compatibly used as a transmitting antenna and a receiving antenna in a radio device which simultaneously carries out transmission and reception such as a mobile phone, there is a possibility that a transmission signal with a large power flows into a receiving unit to interfere the reception of a reception signal in the mobile phone. Therefore, in the mobile phone, in order to electrically separate the transmitting path and the receiving path, the transmitting filter TXF and the receiving filter RXF are provided in the mobile phone. More specifically, by providing the transmitting filter TXF in a transmitting path, only the transmission signal having a transmitting frequency band is transmitted through the transmitting path. On the other hand, by providing the receiving filter RXF in a receiving path, only the reception signal having a receiving frequency band is transmitted through the receiving path. As a result, a transmission signal to flow into the receiving path is blocked by the receiving filter RXF, and it becomes possible to suppress a transmission signal from flowing into the receiving path.

Moreover, the phase shifter PH is provided between the transmitting filter TXF and the receiving filter RXF. The phase shifter PH is provided to change the impedance of the stopband to a high impedance, and by making the impedance of the stopband sufficiently high impedance relative to the impedance of the passband, it becomes possible to reduce the influences at the time when the transmitting filter TXF and the receiving filter RXF are connected with each other.

The mobile phone in configured as described above, and the operations thereof will be briefly described below. First, the case of transmitting a transmission signal will be described. A baseband signal which is generated by digitally processing an analog signal such as a voice signal by the baseband unit BBU is inputted to the radio frequency integrated circuit unit RFICU. In the radio frequency integrated circuit unit RFICU, the inputted baseband signal is converted to a transmission signal with a radio frequency (RF) by the synthesizer (modulating signal source) SYN and the transmitting mixer TXMIX. The transmission signal converted to have the radio frequency is outputted to the power amplifier (PA module) PA from the radio frequency integrated circuit unit RFICU. The transmission signal with the radio frequency inputted to the power amplifier PA is amplified by the power amplifier PA, and then transmitted from the antenna ANT through the transmitting filter TXF.

Next, the case of receiving a reception signal will be described. The reception signal having the radio frequency received by the antenna ANT passes through the receiving filter RXF, and then is inputted to the radio frequency integrated circuit unit RFICU. In the radio frequency integrated circuit unit RFICU, after amplifying the inputted reception signal by the low noise amplifier LNA, frequency conversion of the signal is carried out by the synthesizer (modulating signal source) SYN and the receiving mixer RXMIX. Moreover, the reception signal which has been subjected to the frequency conversion is detected to extract a baseband signal. Thereafter, this baseband signal is outputted from the radio frequency integrated circuit unit RFICU to the baseband unit BBU. The baseband signal is processed in the baseband unit BBU and a voice signal is outputted.

<Configuration of Power Amplifier (PA Module)>

As described above, at the time of transmitting a signal from a mobile phone, the transmission signal is amplified by the power amplifier PA. The configuration of this power amplifier PA will be described below.

Figure 2:
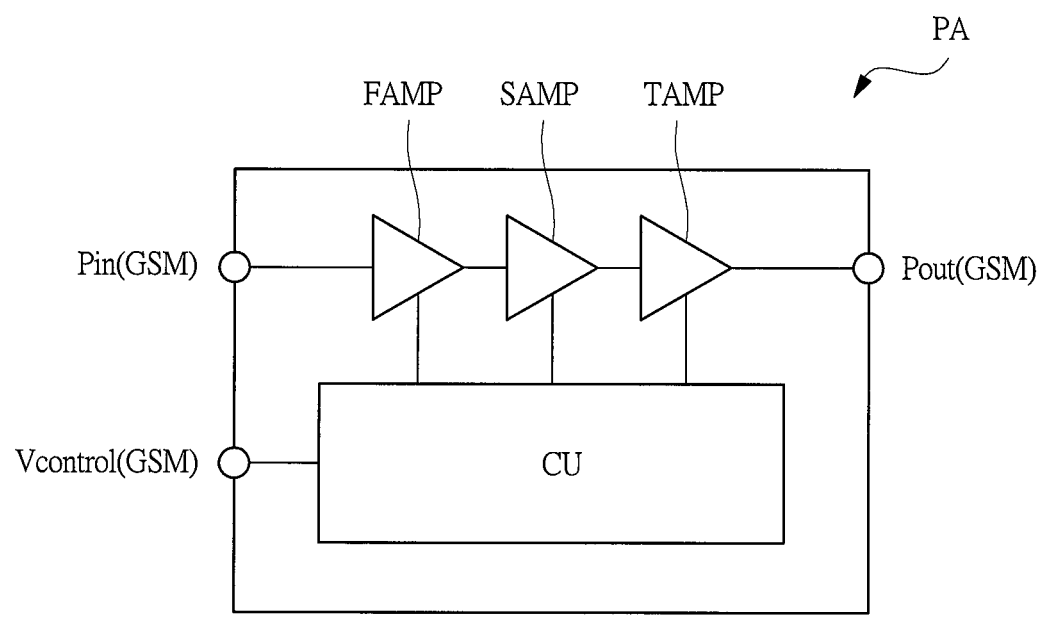
FIG. 2 is a view showing a circuit block of a power amplifier in the first embodiment.

FIG. 2 shows a circuit block of the power amplifier PA in the first embodiment. The circuit block of the power amplifier PA will be described with reference to FIG. 2. In FIG. 2, the power amplifier PA is provided with a control circuit CU, an amplifying unit FAMP, an amplifying unit SAMP and an amplifying unit TAMP. This power amplifier PA is used for, for example, GSM (Global System for Mobile Communication) utilizing the first frequency, and is adapted to amplify a signal using 880 MHz to 915 MHz as a frequency band.

The control circuit CU disposed in the power amplifier PA is configured so as to input a control signal thereto and control the respective amplifying units of the amplifying unit FAMP, the amplifying unit SAMP and the amplifying unit TAMP based on the inputted control signal. The control circuit CU is configured so as to input a control signal Vcontrol (GSM) for controlling the amplifying unit FAMP, the amplifying unit SAMP and the amplifying unit TAMP thereto, and the amplifying unit FAMP, the amplifying unit SAMP and the amplifying unit TAMP are controlled based on the control signal Vcontrol (GSM). In this manner, the power amplifier PA of the first embodiment controls the amplification of a transmission signal in the GSM system. The control circuit CU is constituted by, for example, a MOSFET (Metal Oxide Semiconductor Field Effect Transistor) and the like.

Next, the amplifying unit FAMP, the amplifying unit SAMP and the amplifying unit TAMP are configured so as to input an input power (input signal) Pin (GSM) of the GSM system thereto, and amplify the input power Pin (GSM) over three stages. More specifically, after the input power Pin (GSM) is first amplified by the amplifying unit FAMP, the power amplified by the amplifying unit FAMP is amplified by the amplifying unit SAMP. Moreover, the power amplified by the amplifying unit SAMP is amplified in the amplifying unit TAMP on the last stage, and is then outputted as an output signal Pout (GSM) from the power amplifier PA. In this manner, the amplifying unit FAMP, the amplifying unit SAMP and the amplifying unit TAMP are adapted to amplify the power in the GSM system. These amplifying unit FAMP, amplifying unit SAMP and amplifying unit TAMP are constituted by, for example, LDMOSFETs (Laterally Diffused Metal Oxide Semiconductor Field Effect Transistors).

<Device Structure of LDMOSFET>

Next, the device structure of the LDMOSFET constituting each of the amplifying unit FAMP, the amplifying unit SAMP and the amplifying unit TAMP of the power amplifier PA will be described with reference to drawings.

Figure 3:
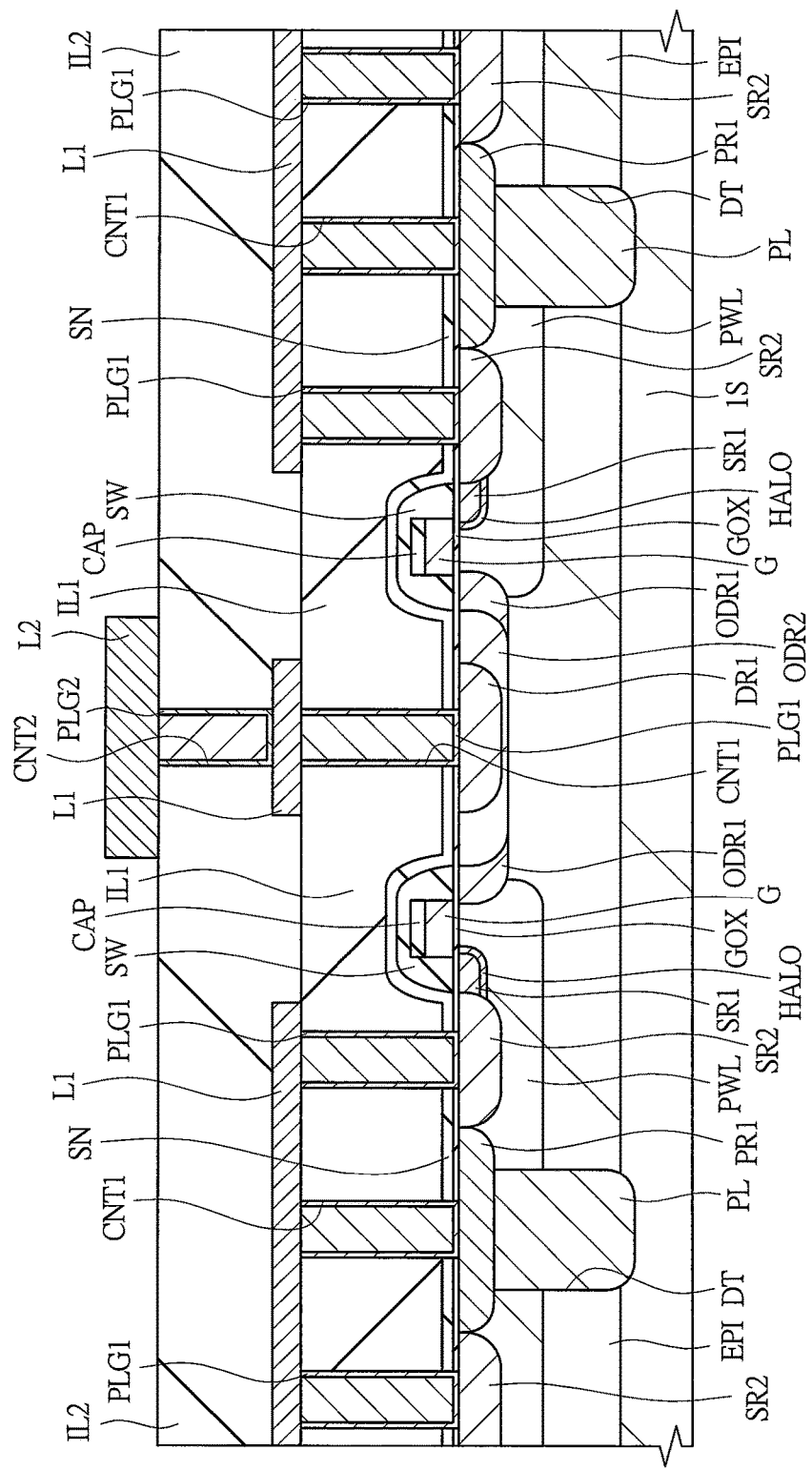
FIG. 3 is a cross-sectional view showing a cross-sectional structure of an LDMOSFET.

FIG. 3 is a cross-sectional view showing a cross-sectional structure of the LDMOSFET. In FIG. 3, an epitaxial layer EPI made of a p⁻-type semiconductor layer is formed on a semiconductor substrate 1S made of a p⁺-type single crystal silicon. Moreover, a groove DT is formed in the semiconductor substrate 1S, and in this groove DT, for example, a p-type polysilicon film is buried to form a p-type punching layer PL. Moreover, a p-type well PWL is formed on the surface of the semiconductor substrate 1S.

Next, a gate insulating film GOX is formed on the surface of the semiconductor substrate 1S, and a gate electrode G and a cap insulating film CAP are formed on this gate insulating film GOX. The gate insulating film GOX is made of, for example, a thin silicon oxide film or the like, and the gate electrode G is made of a polysilicon film. Moreover, an n⁻-type offset drain region ODR1 and an n⁻-type source region SR1 are formed so as to be aligned with the gate electrode G. A p-type halo region HALO is formed so as to be adjacent to the n⁻-type source region SR1.

On each of side walls of the two sides of the gate electrode G, a sidewall SW is formed, and an n-type offset drain region ODR2 and an n⁺-type drain region DR are formed so as to be aligned with the sidewalls SW. In the same manner, on the outside of the n⁻-type source region SR1, an n⁺-type source region SR2 is formed so as to be aligned with the sidewall SW. Moreover, on the outside of the n⁺-type source region SR2, a p⁺-type semiconductor region PR1 is formed.

On the LDMOSFET constituted in this manner, an interlayer insulating film IL1 made of laminated films of a silicon nitride film SN and a silicon oxide film is formed, and a contact hole CNT1 that penetrates the interlayer insulating film IL1 is formed. A plug PLG1 made of, for example, a barrier film and a tungsten film is buried in the contact hole CNT1.

On the interlayer insulating film IL1 in which the plug PLG1 is formed, a first layer wiring L1 made of, for example, an aluminum film is formed, and an interlayer insulating film IL2 made of a silicon oxide film is formed so as to cover this first layer wiring L1. In the interlayer insulating film IL2, a connection hole CNT2 that penetrates to the first layer wiring L1 is formed, and a plug PLG2 is buried in the connection hole CNT2. Moreover, on the interlayer insulating film IL2 in which the plug PLG2 is formed, a second layer wiring L2 is formed. In the layers upper than this second layer wiring L2, other wiring layer and interlayer insulating film are formed if necessary, but these are omitted in FIG. 3. Note that the amplifying unit FAMP, the amplifying unit SAMP and the amplifying unit TAMP shown in FIG. 2 are formed by connecting a plurality of the LDMOSFETs shown in FIG. 3 in parallel with one another.

<Configuration of Transmitting Filter and Receiving Filter>

Subsequently, configurations of the transmitting filter and the receiving filter will be described. In the first embodiment, each of the transmitting filter TXF and receiving filter RXF shown in FIG. 1 is constituted by a thin-film piezoelectric bulk wave resonator. This thin-film piezoelectric bulk wave resonator will be described below.

Figure 4:
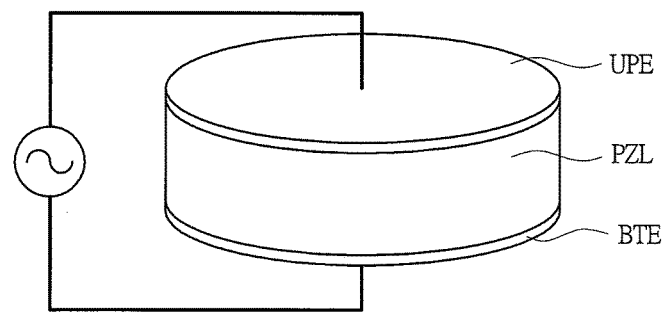
FIG. 4 is a view showing a schematic configuration of a thin-film piezoelectric bulk wave resonator.

FIG. 4 is a view showing a schematic configuration of the thin-film piezoelectric bulk wave resonator. In FIG. 4, the thin-film piezoelectric bulk wave resonator is provided with, for example, a piezoelectric layer PZL formed by a thin-film forming device, and an upper electrode UPE and a lower electrode BTE that are located so as to sandwich the piezoelectric layer PZL. In this case, for example, the piezoelectric layer PZL is made of an aluminum nitride (AlN) film, and the upper electrode UPE and the lower electrode BTE are made of molybdenum (Mo) films.

Figure 5:
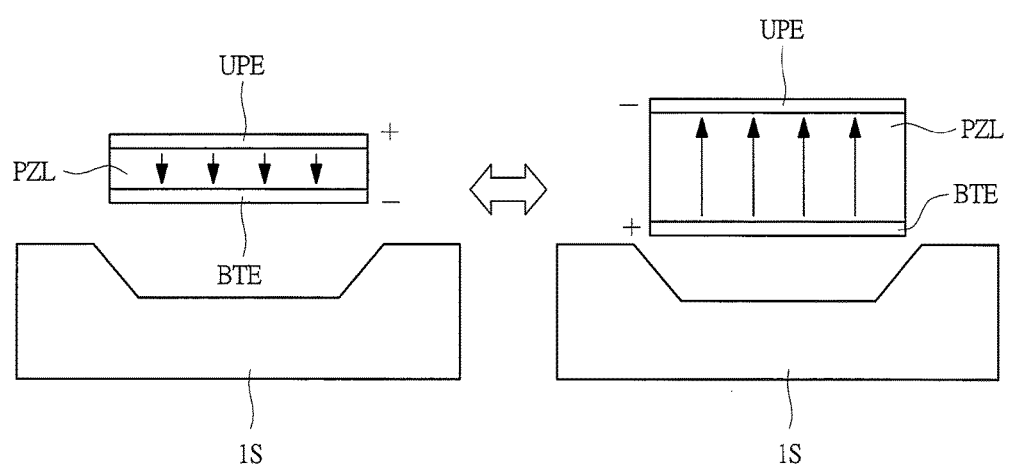
FIG. 5 is a view for describing a mechanism of the thin-film piezoelectric bulk wave resonator.

In this case, the piezoelectric layer PZL is polarized in its thickness direction, and the polarizing direction of the piezoelectric layer PZL is changed by an alternating voltage applied between the upper electrode UPE and the lower electrode BTE. For example, as shown in FIG. 5, in the thin-film piezoelectric bulk wave resonator formed above the semiconductor substrate 1S, when a positive potential is applied to the upper electrode UPE and a negative potential is applied to the lower electrode BTE, the polarizing direction of the piezoelectric layer PZL becomes downward. Meanwhile, when a negative potential is applied to the upper electrode UPE and a positive potential is applied to the lower electrode BET, the polarizing direction of the piezoelectric layer PZL becomes upward. In this manner, the polarizing direction of the piezoelectric layer PZL is changed depending on the polarity of the voltages applied to the upper electrode UPE and the lower electrode BTE. Therefore, in the case where an alternating voltage is applied between the upper electrode UPE and the lower electrode BET, the polarizing direction of the piezoelectric layer PZL is changed between upward and downward directions.

In this case, the piezoelectric layer PZL has a characteristic that the thickness of the piezoelectric layer PZL is changed depending on the polarizing directions. More specifically, when an alternating voltage is applied between the upper electrode UPE and the lower electrode BTE, the polarizing direction of the piezoelectric layer PZL is changed, with the result that the film thickness in the thickness direction of the piezoelectric layer PZL is changed. This means that when an alternating voltage is applied between the upper electrode UPE and the lower electrode BTE, the polarizing directions of the piezoelectric layer PZL are inverted between upward and downward, with the result that the piezoelectric layer PZL is expanded and contracted in the thickness direction and elastic waves are generated by the expansion and contraction in the thickness direction of the piezoelectric layer PZL. In the thin-film piezoelectric bulk wave resonator, the resonance oscillations caused by the elastic waves are utilized.

Figure 6:
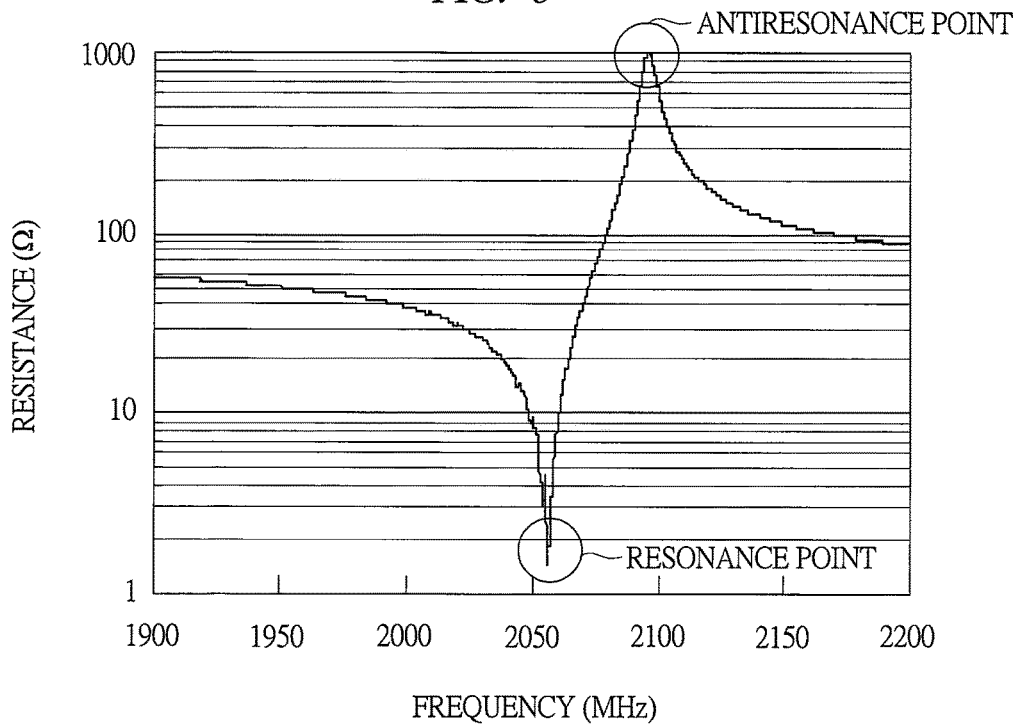
FIG. 6 is a graph showing a frequency characteristic of the thin-film piezoelectric bulk wave resonator.

More specifically, one example of a frequency characteristic of the thin-film piezoelectric bulk wave resonator will be described. FIG. 6 is a graph showing the frequency characteristic of the thin-film piezoelectric bulk wave resonator. In FIG. 6, the axis of abscissas represents a frequency (MHz) and the axis of ordinate represents a resistance (ω) (impedance). As shown in FIG. 6, it is found that, in the case of the thin-film piezoelectric bulk wave resonator, for example, the resonance point is located in the vicinity of 2060 MHz and the antiresonance point is located in the vicinity of 2090 MHz. FIG. 6 shows that, in the thin-film piezoelectric bulk wave resonator, the resistance is drastically lowered in the vicinity of the resonance point and the resistance is extremely increased in the vicinity of the antiresonance point. This further means that, in the thin-film piezoelectric bulk wave resonator, since the resistance becomes low in the vicinity of the resonance point, frequency oscillations in the vicinity of the resonance point are easy to pass through the thin-film piezoelectric bulk wave resonator, while since the resistance becomes high in the vicinity of the antiresonance point, frequency oscillations in the vicinity of the antiresonance point attenuate in the thin-film piezoelectric bulk wave resonator and are hard to pass therethrough. In other words, it is understood that the thin-film piezoelectric bulk wave resonator has a filter characteristic that frequency oscillations in the vicinity of the resonance point are allowed to pass and frequency oscillations in the vicinity of the antiresonance point are blocked. Therefore, it is found that the thin-film piezoelectric bulk wave resonator can be used as the transmitting filter TXF or the receiving filter RXF, each serving as a bandpass filter.

The configuration of the transmitting filter TXF or the receiving filter RXF utilizing the above-mentioned thin-film piezoelectric bulk wave resonator will be described below. Note that, since the transmitting filter TXF and the receiving filter RXF have almost the same structures, the description will be made with taking the transmitting filter TXF as an example.

Figure 7:
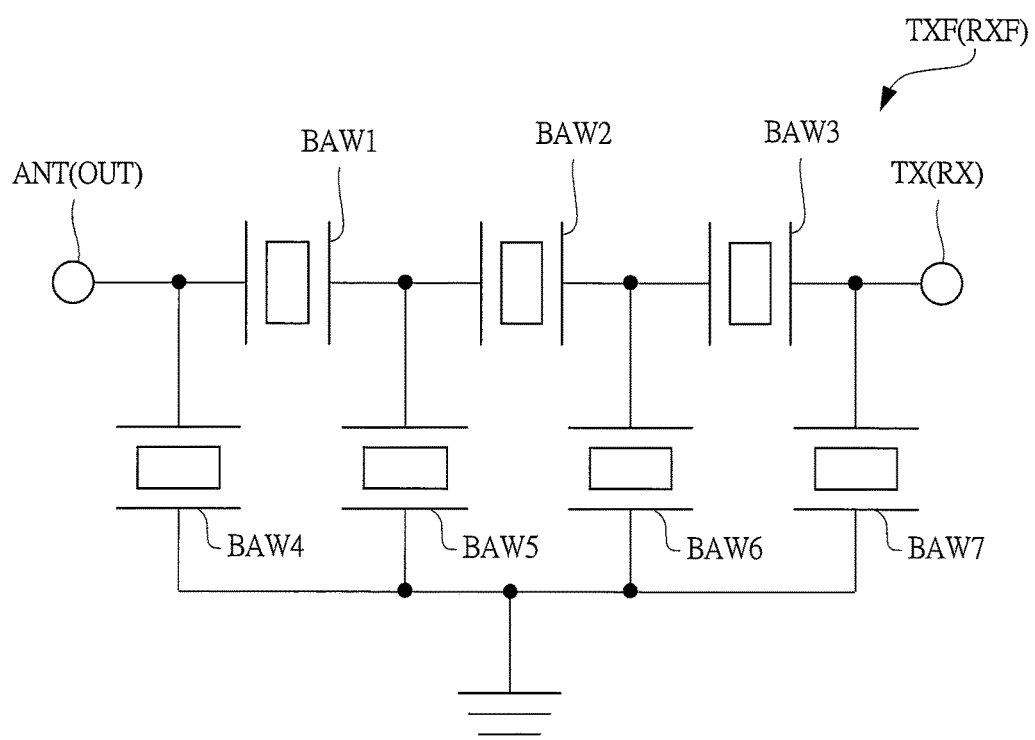
FIG. 7 is a view showing a configuration of a transmitting filter.

FIG. 7 is a view showing a configuration of the transmitting filter TXF. As shown in FIG. 7, the transmitting filter TXF is provided between an antenna terminal ANT (OUT) and a transmitting terminal TX. More specifically, the transmitting filter TXF is constituted by three thin-film piezoelectric bulk wave resonators BAW1 to BAW3 that are series-connected between the antenna terminal ANT (OUT) and the transmitting terminal TX and four thin-film piezoelectric bulk wave resonators BAW4 to BAW7 each of which is connected between the node and ground (GND) of each of the three thin-film piezoelectric bulk wave resonators BAW1 to BAW3. The reason why the three thin-film piezoelectric bulk wave resonators BAW1 to BAW3 that are series-connected between the antenna terminal ANT (OUT) and the transmitting terminal TX and the thin-film piezoelectric bulk wave resonators BAW4 to BAW7 each of which is connected between the node and ground (GND) of each of the thin-film piezoelectric bulk wave resonators BAW1 to BAW3 are provided in the transmitting filter TXF will be described below.

Figure 8:
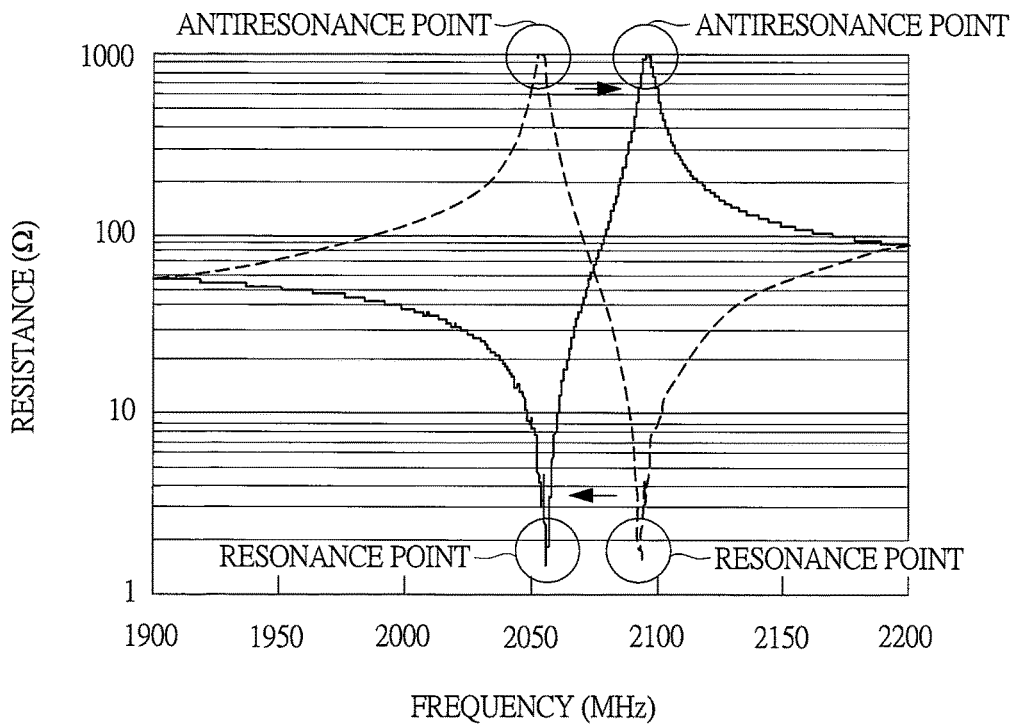
FIG. 8 is a graph showing a frequency characteristic of thin-film piezoelectric bulk wave resonators that are series-connected between an antenna terminal and a transmitting terminal and a frequency characteristic of thin-film piezoelectric bulk wave resonators each of which is connected between the node and ground of each of the series-connected thin-film piezoelectric bulk wave resonators.

FIG. 8 is a graph showing a frequency characteristic of the thin-film piezoelectric bulk wave resonators BAW1 to BAW3 that are series-connected between the antenna terminal ANT (OUT) and the transmitting terminal TX and a frequency characteristic of the thin-film piezoelectric bulk wave resonators BAW4 to BAW7 each of which is connected between the node and ground (GND) of each of the thin-film piezoelectric bulk wave resonators BAW1 to BAW3. In FIG. 8, the axis of abscissas represents the frequency (MHz) and the axis of ordinate represents the resistance (Ω) (impedance).

First, in FIG. 8, for example, a curve indicated by a solid line shows the frequency characteristic of the thin-film piezoelectric bulk wave resonators BAW1 to BAW3 that are series-connected between the antenna terminal ANT (OUT) and the transmitting terminal TX, and a curve indicated by a broken line shows the frequency characteristic of the thin-film piezoelectric bulk wave resonators BAW4 to BAW7 each of which is connected between the node and ground (GND) of each of the thin-film piezoelectric bulk wave resonators BAW1 to BAW3. In this case, as shown in FIG. 8, it is found that an antiresonance point of the curve indicated by a broken line is present at the frequency corresponding to the resonance point of the curve indicated by a solid line and a resonance point of the curve indicated by the broken line is present at the frequency corresponding to the antiresonance point of the curve indicated by the solid line. More specifically, it is found that the frequency characteristic (solid line) of the thin-film piezoelectric bulk wave resonators BAW1 to BAW3 that are series-connected between the antenna terminal ANT (OUT) and the transmitting terminal TX is reverse to the frequency characteristic (broken line) of the thin-film piezoelectric bulk wave resonators BAW4 to BAW7 each of which is connected between the node and ground (GND) of each of the thin-film piezoelectric bulk wave resonators BAW1 to BAW3. This is caused by the fact that the thin-film piezoelectric bulk wave resonators BAW1 to BAW3 are series-connected between the antenna terminal ANT (OUT) and the transmitting terminal TX, while each of the thin-film piezoelectric bulk wave resonators BAW4 to BAW7 is connected between the node and ground (GND) of each of the thin-film piezoelectric bulk wave resonators BAW1 to BAW3. In other words, as shown in FIG. 8, it is possible to change the frequency characteristics of the thin-film piezoelectric bulk wave resonators by changing the connection positions of the thin-film piezoelectric bulk wave resonators.

Moreover, by changing the total film thickness of the piezoelectric layer PZL, the upper electrode UPE and the lower electrode BTE constituting the thin-film piezoelectric bulk wave resonator (actually, the film thickness of a shunt electrode formed on one portion of the upper electrode UPE is changed in most cases), the resonance point can be changed. Therefore, for example, by changing the total film thickness of the piezoelectric layer PZL, the upper electrode UPE and the lower electrode BTE constituting the thin-film piezoelectric bulk wave resonators BAW1 to BAW3 and the total film thickness of the piezoelectric layer PZL, the upper electrode UPE and the lower electrode BTE constituting the thin-film piezoelectric bulk wave resonators BAW4 to BAW7, the interval between the resonance point of the curve indicated by the solid line and the resonance point of the curve indicated by the broken line in FIG. 8 can be desirably changed. As a result, since the frequency characteristic of the transmitting filter TXF shown in FIG. 7 corresponds to a sum total of the curve indicated by the solid line and the curve indicated by the broken line in FIG. 8, for example, the transmitting filter TXF has the frequency characteristic as shown in FIG. 9.

Figure 9:
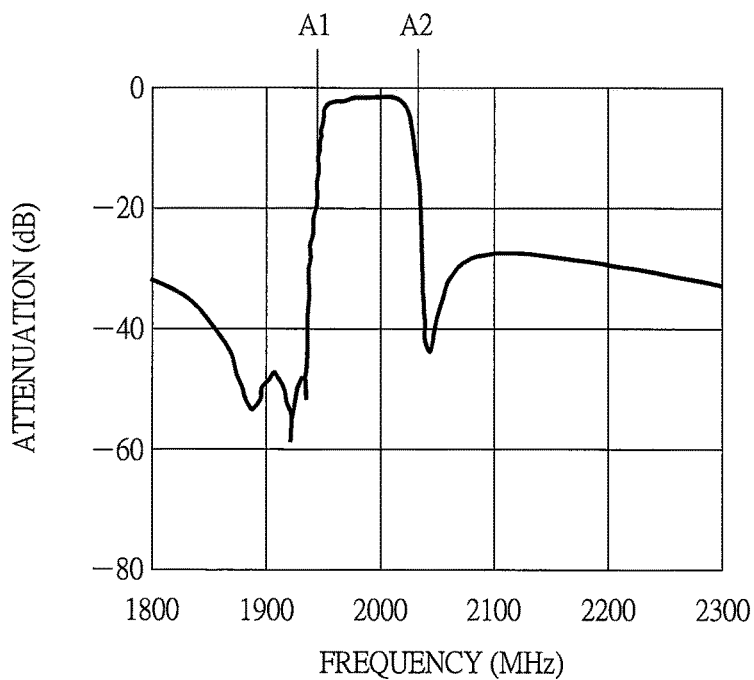
FIG. 9 is a graph showing one example of a frequency characteristic of the transmitting filter shown in FIG. 7.

FIG. 9 is a graph showing one example of a frequency characteristic of the transmitting filter TXF shown in FIG. 7. In FIG. 9, the axis of abscissas represents the frequency (MHz) and the axis of ordinate represents the attenuation (dB) of a signal that passes through the transmitting filter TXF. As shown in FIG. 9, for example, it is possible to obtain a transmitting filter TXF having a frequency characteristic that allows signals with frequencies between frequency A1 and frequency A2 to pass therethrough and attenuates signals of the other frequency band. In other words, by designing the transmitting filter TXF to have the configuration shown in FIG. 7, a bandpass filter having a frequency characteristic shown in FIG. 9 can be configured. More specifically, by providing the thin-film piezoelectric bulk wave resonators BAW1 to BAW3 that are series-connected between the antenna terminal ANT (OUT) and the transmitting terminal TX and the thin-film piezoelectric bulk wave resonators BAW4 to BAW7 each of which is connected between the node and ground (GND) of each of the thin-film piezoelectric bulk wave resonators BAW1 to BAW3 as shown in FIG. 7, the frequency characteristic of the transmitting filter TXF shown in FIG. 7 becomes the sum total of the curves respectively indicated by the solid line and the broken line in FIG. 8. By this means, it is possible to form a bandpass filter having a passband and a stopband. Moreover, for example, by changing the total film thickness of the piezoelectric layer PZL, the upper electrode UPE and the lower electrode BTE constituting the thin-film piezoelectric bulk wave resonators BAW1 to BAW3 and the total film thickness of the piezoelectric layer PZL, the upper electrode UPE and the lower electrode BTE constituting the thin-film piezoelectric bulk wave resonators BAW4 to BAW7, the interval between the resonance point of the curve indicated by the solid line and the resonance point of the curve indicated by the broken line in FIG. 8 can be desirably adjusted, with the result that it becomes possible to obtain a bandpass filter with the transmitting frequency band as a passband. As described above, it is found that the transmitting filter TXF can be formed from a plurality of thin-film piezoelectric bulk wave resonators.

Note that the receiving filter RXF also has the same configuration as that of the above-mentioned transmitting filter TXF. More specifically, the receiving filter RXF is also constituted by the thin-film piezoelectric bulk wave resonators BAW1 to BAW3 that are series-connected between the antenna terminal ANT (OUT) and the receiving terminal RX and the thin-film piezoelectric bulk wave resonators BAW4 to BAW7 each of which is connected between the node and ground (GND) of each of the thin-film piezoelectric bulk wave resonators BAW1 to BAW3. However, the receiving filter RXF is configured so that the resonance points of the thin-film piezoelectric bulk wave resonators BAW1 to BAW3 and the thin-film piezoelectric bulk wave resonators BAW4 to BAW7 are different from those of the transmitting filter TXF. In this manner, it becomes possible to obtain a bandpass filter with the receiving frequency band as a passband.

<Device Structure of Thin-Film Piezoelectric Bulk Wave Resonator>

Next, the device structure of the above-mentioned thin-film piezoelectric bulk wave resonator constituting the transmitting filter TXF and the receiving filter RXF will be described. Various kinds of device structures have been proposed for the thin-film piezoelectric bulk wave resonator, and they are classified by, for example, the method of confining an elastic wave into the piezoelectric layer PZL. More specifically, the thin-film piezoelectric bulk wave resonator includes an FBAR (Film Bulk Acoustic wave Resonator)-type resonator and an SMR (Solidly Mounted Resonator)-type resonator.

Figure 10:
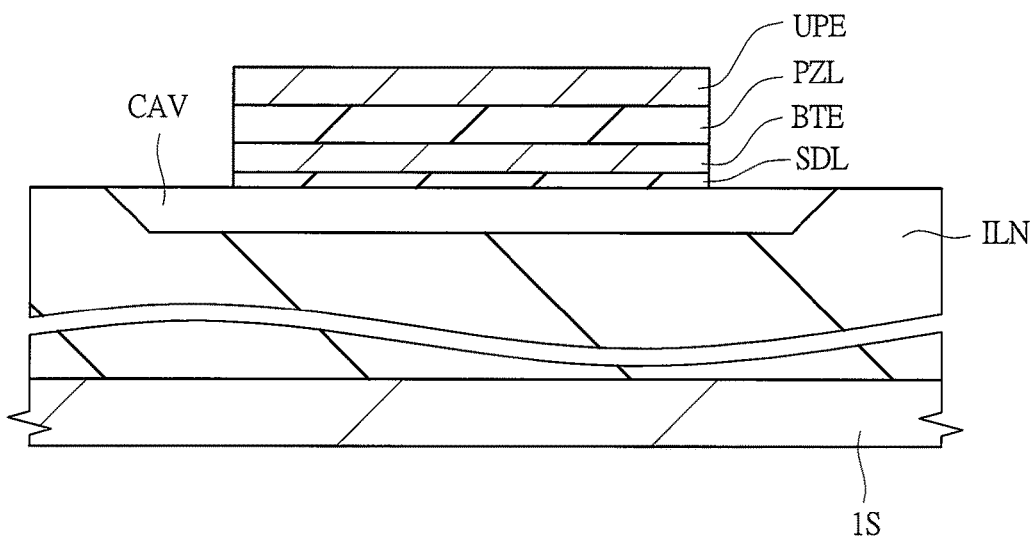
FIG. 10 is a cross-sectional view showing a device structure of an FBAR-type resonator.

First, the device structure of the FBAR-type resonator will be described. FIG. 10 is a cross-sectional view showing the device structure of the FBAR-type resonator. In FIG. 10, an interlayer insulating film ILN made of, for example, a silicon oxide film is formed on a semiconductor substrate 1S, and an FBAR-type resonator is formed on this interlayer insulating film ILN. In this FBAR-type resonator, a cavity portion CAV is formed in the interlayer insulating film ILN. Moreover, on this cavity portion CAV, a seed layer SDL made of, for example, an aluminum nitride film is formed, and a lower electrode BTE made of, for example, a molybdenum film is formed on this seed layer SDL. Also, on this lower electrode BTE, a piezoelectric layer PZL made of, for example, an aluminum nitride film is formed, and an upper electrode UPE made of, for example, a molybdenum film is formed on this piezoelectric layer PZL.

In the FBAR-type resonator configured as described above, an acoustic insulating portion is provided so as to confine an elastic wave inside the piezoelectric layer PZL. More specifically, since an interface between a solid material and a gas functions as an efficient acoustic insulating portion, a space is provided above the upper electrode UPE and the cavity portion CAV is provided below the lower electrode BTE (more specifically, the seed layer SDL) in the FBAR-type resonator as shown in FIG. 10. In other words, in the FBAR-type resonator, the cavity portion CAV is used as the acoustic insulating portion for confining an elastic wave inside the piezoelectric layer PZL. Since this cavity portion CAV has an excellent characteristic as the acoustic insulating portion, the FBAR-type resonator has an advantage that a frequency characteristic with a sharp Q value indicating good resonance can be obtained.

Moreover, the seed layer SDL provided in the FBAR-type resonator has a function of improving the crystalline orientation of the piezoelectric layer PZL. More specifically, the seed layer SDL has a function of C-axis orienting the crystal of the piezoelectric layer PZL, and the Q value can be sharpened by the C-axis orientation of the crystal of the piezoelectric layer PZL.

Figure 11:
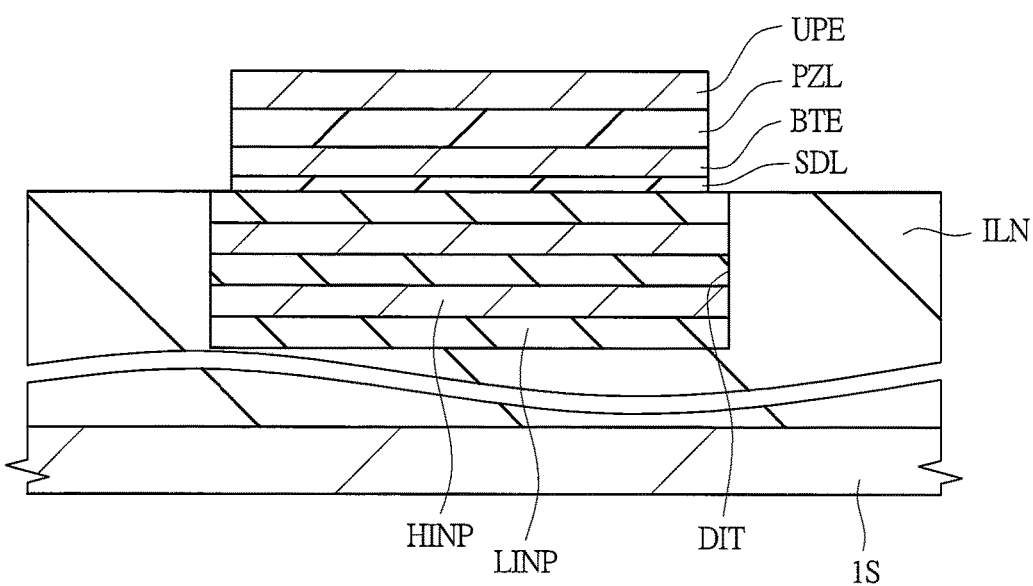
FIG. 11 is a cross-sectional view showing a device structure of an SMR-type resonator.

Subsequently, a device structure of the SMR-type resonator will be described. FIG. 11 is a cross-sectional view showing a device structure of the SMR-type resonator. In FIG. 11, an interlayer insulating film ILN made of, for example, a silicon oxide film is formed on a semiconductor substrate 1S, and an SMR-type resonator is formed on this interlayer insulating film ILN. In this SMR-type resonator, an acoustic mirror layer is formed in a groove DIT formed in the interlayer insulating film ILN. Moreover, on this acoustic mirror layer, a seed layer SDL made of, for example, an aluminum nitride film is formed, and a lower electrode BTE made of, for example, a molybdenum film is formed on this seed layer SDL. Also, on this lower electrode BTE, a piezoelectric layer PZL made of, for example, an aluminum nitride film is formed, and an upper electrode UPE made of, for example, a molybdenum film is formed on this piezoelectric layer PZL.

In the SMR-type resonator configured as described above, an acoustic mirror layer serving as an acoustic insulating portion is provided so as to confine an elastic wave inside the piezoelectric layer PZL. The acoustic mirror layer has a function of reflecting an elastic wave generated in the piezoelectric layer PZL, and by reflecting the elastic wave by this acoustic mirror layer, the elastic wave can be confined inside the piezoelectric layer PZL. For example, as shown in FIG. 11, the acoustic mirror layer is formed by alternately stacking a silicon oxide film serving as a low acoustic impedance film LINP and a tungsten film serving as a high acoustic impedance film HINP inside a groove DIT formed in the interlayer insulating film ILN. The elastic wave can be reflected by the acoustic mirror layer obtained by alternately forming the low acoustic impedance film LINP and the high acoustic impedance film HINP. As described above, the acoustic mirror layer is used as the acoustic insulating portion in the SMR-type resonator. However, the acoustic insulating portion made of this acoustic mirror layer is inferior in its characteristic to the acoustic insulating portion made of the cavity portion CAV used in the aforementioned FBAR-type resonator. In other words, since some losses occur at the time of reflection of an elastic wave in the case of the acoustic insulating portion made of the acoustic mirror layer, characteristics such as the sharpness of the Q value, the insertion loss and the like are degraded. Therefore, the SMR-type resonator is inferior to the FBAR-type resonator in the sharpness of the Q value. Meanwhile, since the SMR-type resonator does not use the cavity portion CAV as the acoustic insulating portion, it has an advantage of higher mechanical strength in comparison with the FBAR-type resonator.

As described above, the thin-film piezoelectric bulk wave resonator is mainly classified into the FBAR-type resonator and the SMR-type resonator. Although the thin-film piezoelectric bulk wave resonator of the present embodiment can be applied to both of the FBAR-type resonator and the SMR-type resonator, the FBAR-type resonator is taken as an example in the following descriptions.

<Advantages of Thin-Film Piezoelectric Bulk Wave Resonator>

Since the above-mentioned thin-film piezoelectric bulk wave resonator utilizes resonance oscillations of the piezoelectric layer PZL itself, the substrate itself for use in forming the piezoelectric layer PZL is not required to be a piezoelectric substrate, and thin-film piezoelectric bulk wave resonator can be formed on various substrates. For this reason, the thin-film piezoelectric bulk wave resonator can be formed on, for example, a semiconductor substrate 1S made of silicon. Therefore, by using the thin-film piezoelectric bulk wave resonator as the transmitting filter TXF and the receiving filter RXF, the advantage that the power amplifier PA, the transmitting filter TXF and the receiving filter RXF can be formed on the same semiconductor substrate 1S can be achieved. In other words, since an amplifying transistor constituting the power amplifier PA and the thin-film piezoelectric bulk wave resonator constituting the transmitting filter TXF and the receiving filter RXF can be formed on the same semiconductor substrate 1S, the integration of parts constituting a mobile phone can be further promoted in order to achieve the further multifunctionality and reduction in size and weight of a mobile phone.

<Examination of Problems in Integration>

In the case where the power amplifier PA, the transmitting filter TXF and the receiving filter RXF are formed on the same semiconductor substrate 1S, there is fear that heat generated from the power amplifier PA might cause adverse effects on the transmitting filter TXF and the receiving filter RXF. More specifically, since the resonance frequency of the thin-film piezoelectric bulk wave resonator constituting each of the transmitting filter TXF and the receiving filter RXF has temperature dependence, the resonance frequency of the thin-film piezoelectric bulk wave resonator deviates from the designed value when the heat from the power amplifier PA is transmitted to the thin-film piezoelectric bulk wave resonator.

Figure 12:
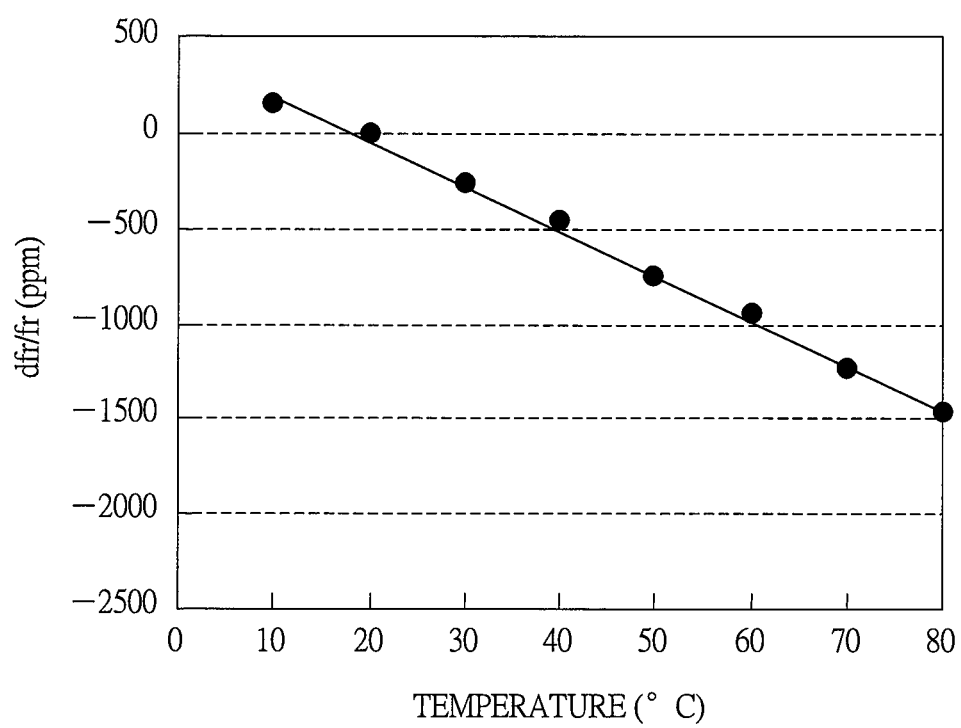
FIG. 12 is a graph showing a temperature characteristic of a resonance frequency of the thin-film piezoelectric bulk wave resonator.

Specifically, the temperature characteristic of the resonance frequency of the thin-film piezoelectric bulk wave resonator will be described. FIG. 12 is a graph showing the temperature characteristic of the resonance frequency of the thin-film piezoelectric bulk wave resonator. In FIG. 12, the axis of abscissas represents the temperature (° C.), and the axis of ordinate represents the deviation amount (ppm) of the resonance frequency. First, as shown in FIG. 12, when the temperature is 20° C. (normal temperature), the deviation amount of the resonance frequency is 0, which indicates that the resonance frequency of the thin-film piezoelectric bulk wave resonator matches the designed value. Also, it is found that the deviation amount of the resonance frequency becomes larger as the temperature rises from 20° C. This means that, when the temperature of the thin-film piezoelectric bulk wave resonator increases, the resonance frequency deviates from the designed value, with the result that the filter characteristics of the transmitting filter TXF and the receiving filter RXF constituted by the thin-film piezoelectric bulk wave resonators deteriorate. Therefore, in order to maintain the filter characteristics of the transmitting filter TXF and the receiving filter RXF, the temperature rise of the thin-film piezoelectric bulk wave resonator needs to be suppressed.

In particular, in conjunction with the increase in transmission capacity and transmission rate in the mobile communication system, the power to be dealt in a mobile phone has become larger, and the amount of heat generated from the power amplifier PA tends to increase. For this reason, it can be understood that, in the case where the transmitting filter TXF, the receiving filter RXF and the power amplifier PA are mounted on the same semiconductor substrate 1S, it is necessary to suppress the heat generated from the power amplifier PA from being transmitted to the transmitting filter TXF and the receiving filter RXF as small as possible so as to suppress the influences thereof to be given to the filter characteristics (electrical characteristics) of the transmitting filter TXF and the receiving filter RXF.

Therefore, in the first embodiment, for example, in a mobile communication equipment typified by the mobile phone, in the case where the transmitting filter, the receiving filter and the power amplifier are formed on the same semiconductor substrate, ingenuities are exercised so that the influences of heat from the power amplifier given to the transmitting filter and the receiving filter can be reduced as small as possible to maintain the filter characteristics (electrical characteristics) of the transmitting filter and the receiving filter. The technical ideas in the first embodiment on which these ingenuities have been exercised will be described below.

<Device Structure of Semiconductor Device in First Embodiment>

Figure 13:
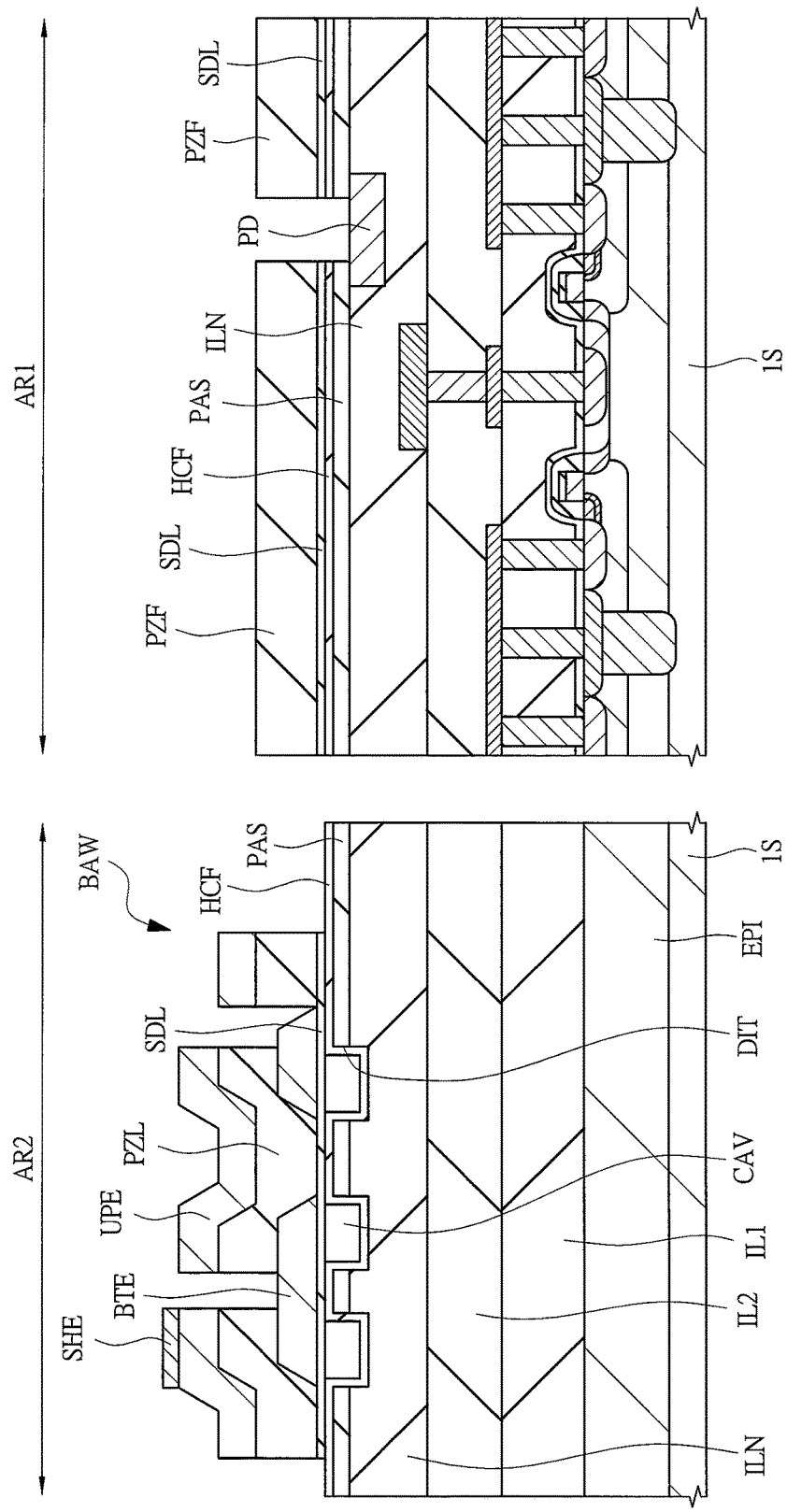
FIG. 13 is a cross-sectional view showing a configuration of a semiconductor device in the first embodiment.

FIG. 13 is a cross-sectional view showing a configuration of a semiconductor device in the first embodiment. FIG. 13 shows the structures formed on an area AR1 and an area AR2 of the semiconductor substrate 1S. The area AR1 is an area on which an LDMOSFET constituting the power amplifier PA is formed and the area AR2 is an area on which the thin-film piezoelectric bulk wave resonator BAW constituting each of the transmitting filter TXF and the receiving filter RXF is formed. In other words, in the first embodiment, the LDMOSFET and the thin-film piezoelectric bulk wave resonator BAW are formed on the same semiconductor substrate 1S.

First, the structure formed on the area AR1 of the semiconductor substrate 1S will be described with reference to FIG. 13. In FIG. 13, on the area AR1 of the semiconductor substrate 1S, for example, an LDMOSFET having the structure shown in FIG. 3 is formed, and an interlayer insulating film made of, for example, a silicon oxide film is formed on this LDMOSFET. Moreover, on the interlayer insulating film, a plurality of wiring layers made of, for example, aluminum films are formed, and an interlayer insulating film ILN made of, for example, a silicon oxide film is formed on these wiring layers. On the surface of the interlayer insulating film ILN, a pad PD is formed. The pad PD functions as an external connection terminal, and a bonding wire or the like is connected thereto.

On the interlayer insulating film ILN on which the pad PD is formed, a passivation film (surface protective film) PAS made of, for example, a silicon nitride film is formed. An opening is formed in the passivation film PAS formed on the pad PD and the pad PD is exposed through the opening. Moreover, on the passivation film PAS, a high heat conductivity film HCF having a heat conductivity higher than that of the interlayer insulating film ILN is formed. This high heat conductivity film HCF is composed of, for example, an aluminum nitride film (heat conductivity: 150 W/m·K) or a magnesium oxide film (heat conductivity: 59 W/m·K). An opening is formed also in this high heat conductivity film HCF, and the pad PD is exposed through this opening. Moreover, on the high heat conductivity film HCF, the seed layer SDL and the piezoelectric film PZF made of, for example, aluminum nitride films are formed. An opening is formed also in these seed layer SDL and piezoelectric film PZF, and the pad PD is exposed through the opening.

Subsequently, a structure formed on the area AR2 of the semiconductor substrate 1S will be described with reference to FIG. 13. In FIG. 13, an epitaxial layer EPI is formed on the semiconductor substrate 1S, and on this epitaxial layer EPI, an interlayer insulating film IL1 made of, for example, a silicon oxide film is formed. On this interlayer insulating film IL1, an interlayer insulating film IL2 made of, for example, a silicon oxide film is formed, and an interlayer insulating film ILN made of, for example, a silicon oxide film is formed on the interlayer insulating film IL2. Moreover, on the interlayer insulating film ILN, for example, a thin-film piezoelectric bulk wave resonator BAW constituting the transmitting filter TXF or the receiving filter RXF is formed.

The structure of the thin-film piezoelectric bulk wave resonator BAW will be described below. As shown in FIG. 13, on the area AR2, the passivation film PAS is formed on the interlayer insulating film ILN, and a groove DIT which extends from the surface of the passivation film PAS to reach the interlayer insulating film ILN formed as the lower layer is formed. Moreover, a high heat conductivity film HCF having a heat conductivity higher than that of the interlayer insulating film ILN is formed on the passivation film PAS including the inner wall of the groove DIT. This high heat conductivity film HCF is formed along the inner wall of the groove DIT, and the inside of the groove DIT is not buried with the high heat conductivity film HCF. More specifically, although the high heat conductivity film HCF is formed on the inner wall of the groove DIT, the inside of the groove DIT is not filled with the high heat conductivity film HCF, and a cavity portion CAV is formed inside the groove DIT. The cavity portion CAV formed inside the groove DIT constitutes an acoustic insulating portion of the thin-film piezoelectric bulk wave resonator.

Subsequently, a seed layer SDL made of, for example, an aluminum nitride film is formed so as to cover the cavity portion CAV formed in the groove DIT. This seed layer SDL has a function of improving the crystalline orientation of the piezoelectric layer PZL to be described later. More specifically, the seed layer SDL has a function of C-axis orienting the crystal of the piezoelectric layer PZL to be described later, and the Q value of the thin-film piezoelectric bulk wave resonator can be sharpened by the C-axis orientation of the crystal of the piezoelectric layer PZL.

On the above-mentioned seed layer SDL, a lower electrode BTE is formed. The lower electrode BTE is made of, for example, a molybdenum film (Mo), a ruthenium film (Ru), or a tungsten film (W). Moreover, on the lower electrode BET, the piezoelectric layer PZL is formed. This piezoelectric layer PZL is composed of a piezoelectric material whose thickness is changed depending on the polarizing direction, and is made of, for example, an aluminum nitride film (AlN).

On the piezoelectric layer PZL, an upper electrode UPE is formed, and a shunt electrode SHE is formed on one portion of the upper electrode UPE. The shunt electrode SHE is an electrode formed so as to adjust the resonance frequency of the thin-film piezoelectric bulk wave resonator BAW. More specifically, the resonance frequency of the thin-film piezoelectric bulk wave resonator BAW is determined by the total film thickness of the lower electrode BTE, the piezoelectric layer PZL and the upper electrode UPE, but by forming the shunt electrode SHE on one portion of the upper electrode UPE, the resonance frequency of the thin-film piezoelectric bulk wave resonator BAW becomes dependent also on the film thickness of the shunt electrode SHE. Therefore, by adjusting the film thickness of the shunt electrode SHE, the resonance frequency of the thin-film piezoelectric bulk wave resonator BAW can be made to deviate from the resonance frequency that is determined by the total film thickness of the lower electrode BTE, the piezoelectric layer PZL and the upper electrode UPE, and it is thus possible to adjust the resonance frequency of the thin-film piezoelectric bulk wave resonator BAW.

<Characteristics of First Embodiment>

The semiconductor device in the first embodiment is configured as described above, and the characteristics thereof will be described below. For example, the characteristic of the first embodiment lies in that the high heat conductivity film HCF having a heat conductivity higher than that of the interlayer insulating film ILN is provided on the passivation film PAS as shown in FIG. 13. In other words, the characteristic in the first embodiment lies in that the high heat conductivity film HCF is formed on the passivation film. PAS over the entire area of the semiconductor substrate 1S including the area AR1 on which the LDMOSFET is formed and the area AR2 on which the thin-film piezoelectric bulk wave resonator BAW is formed. Thus, heat mainly generated in the LDMOSFET is efficiently dissipated in all the directions by the high heat conductivity film HCF formed over the entire surface of the semiconductor substrate 1S. Consequently, since the temperature of the area AR1 on which the LDMOSFET is formed can be lowered, the temperature rise of the thin-film piezoelectric bulk wave resonator BAW caused by the heat generated from the LDMOSFET formed on the area AR1 can be suppressed. Therefore, according to the first embodiment, it is possible to sufficiently suppress the temperature rise of the thin-film piezoelectric bulk wave resonator BAW caused by the heat generated from the LDMOSFET even in the case where the thin-film piezoelectric bulk wave resonator BAW and the LDMOSFET are mounted on the same semiconductor substrate 1S, so that it becomes possible to suppress the degradation of filter characteristics (electrical characteristics) of the transmitting filter TXF and the receiving filter RXF constituted by the thin-film piezoelectric bulk wave resonator BAW.

For example, in recent years, the power to be dealt in a mobile phone has been increasing and the amount of heat generation from the power amplifier PA tends to increase. For this reason, for example, the temperature of the power amplifier PA is considered to become as high as 100° C. In this case, if the LDMOSFET constituting the power amplifier PA and the thin-film piezoelectric bulk wave resonators constituting the transmitting filter TXF and the receiving filter RXF are mounted on the same semiconductor substrate 1S without any countermeasures against heat, the heat generated from the LDMOSFET causes adverse effects on the thin-film piezoelectric bulk wave resonator BAW and a temperature of the thin-film piezoelectric bulk wave resonator BAW is increased. Since the resonance frequency is changed when the temperature of the thin-film piezoelectric bulk wave resonator BAW is increased, the filter characteristics of the transmitting filter TXF and the receiving filter RXF each of which is constituted by the thin-film piezoelectric bulk wave resonator BAW deteriorate. The deterioration of the filter characteristics means that, for example, due to the change in the resonance frequency, the frequency band of the passband and the frequency band of the stopband deviate from the designed values and it becomes impossible to sufficiently maintain the passband and the stopband in accordance with the designed values.

Therefore, in the technical idea of the first embodiment, for example, as shown in FIG. 13, over the entire area of the semiconductor substrate S1 including the area AR1 on which the LDMOSFET is formed and the area AR2 on which the thin-film piezoelectric bulk wave resonator BAW is formed, the high heat conductivity film HCF is formed on the passivation film PAS. By this means, the heat generated by the LDMOSFET is transmitted to the high heat conductivity film HCF formed on the area AR1, and is quickly dissipated over the entire area of the semiconductor substrate 1S by the high heat conductivity film HCF. Moreover, on the area AR1 on which the LDMOSFET is formed, since the seed layer SDL and the piezoelectric film PZF made of the same material (for example, aluminum nitride film) as that of the high heat conductivity film HCF are formed on the high heat conductivity film HCF, the heat generated by the LDMOSFET is efficiently dissipated also by these films. As a result, in the first embodiment, since the temperature of the area AR1 on which the LDMOSFET is formed can be lowered, it is possible to suppress the temperature rise of the thin-film piezoelectric bulk wave resonator BAW formed on the area AR2 caused by the heat generated from the LDMOSFET formed on the area AR1.

In the first embodiment, the FBAR-type resonator is adopted as the thin-film piezoelectric bulk wave resonator BAW, but also in the case where the SMR-type resonator is used as the thin-film piezoelectric bulk wave resonator BAW, the technical idea of the first embodiment can of course be applied. However, from the viewpoint of effectively suppressing the temperature rise of the thin-film piezoelectric bulk wave resonator BAW, as the thin-film piezoelectric bulk wave resonator BAW to be mounted on the same semiconductor substrate 1S together with the LDMOSFET, the FBAR-type resonator is more desirably used than the SMR-type resonator.

This is because, since the FBAR-type resonator uses the cavity portion CAV formed inside the groove DIT as an acoustic insulating portion as shown in FIG. 13, the heat conduction from the high heat conductivity film. HCF to the FBAR-type resonator is suppressed by the cavity portion CAV having a low heat conductivity. In other words, in the first embodiment, by providing the high heat conductivity film HCF and by using the FBAR-type resonator as the thin-film piezoelectric bulk wave resonator BAW mounted on the same semiconductor substrate together with the LDMOSFET, it becomes possible to effectively suppress the temperature rise of the thin-film piezoelectric bulk wave resonator BAW. More specifically, by forming the high heat conductivity film HCF on the passivation film PAS over the entire area of the semiconductor substrate 1S, heat generated in the LDMOSFET is transmitted in all the directions from the high heat conductivity film. HCF and effectively dissipated, so that it is possible to suppress the temperature rise of the area AR1 itself on which the LDMOSFET is formed. At this time, although a part of heat is transmitted also to the high heat conductivity film HCF formed as the lower layer of the thin-film piezoelectric bulk wave resonator BAW, since the FBAR-type resonator in which the acoustic insulating portion is formed by the cavity portion CAV having a low heat conductivity is used as the thin-film piezoelectric bulk wave resonator BAW, it is possible to effectively suppress the temperature rise of the thin-film piezoelectric bulk wave resonator BAW.

<Manufacturing Method of Semiconductor Device in First Embodiment>

Figure 14:
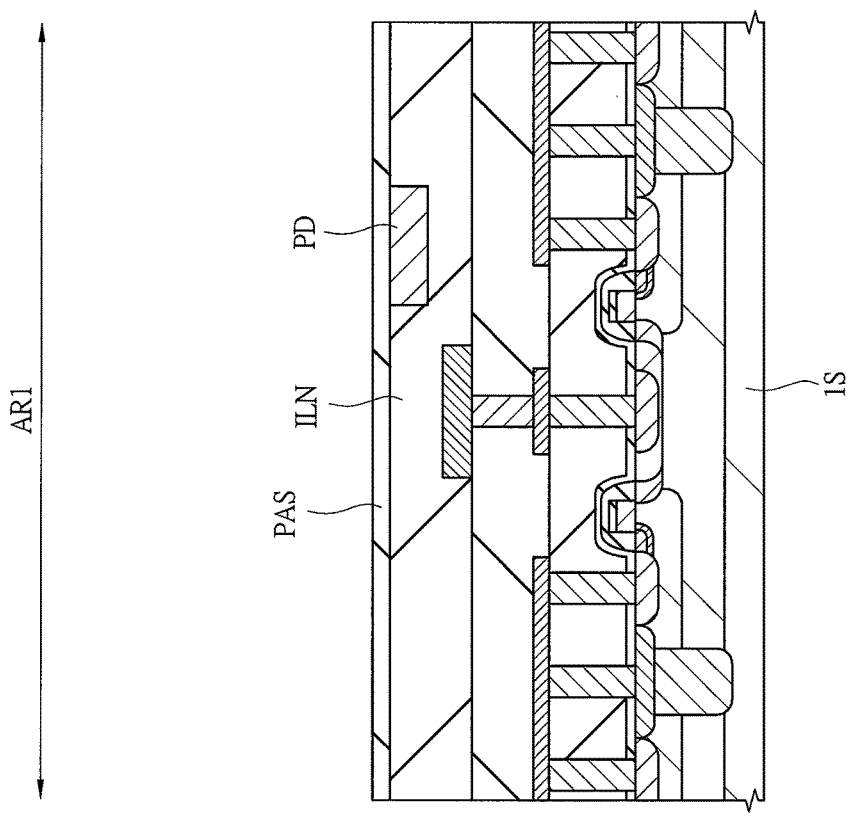
FIG. 14 is a cross-sectional view showing a manufacturing process of the semiconductor device in the first embodiment.
Figure 14:
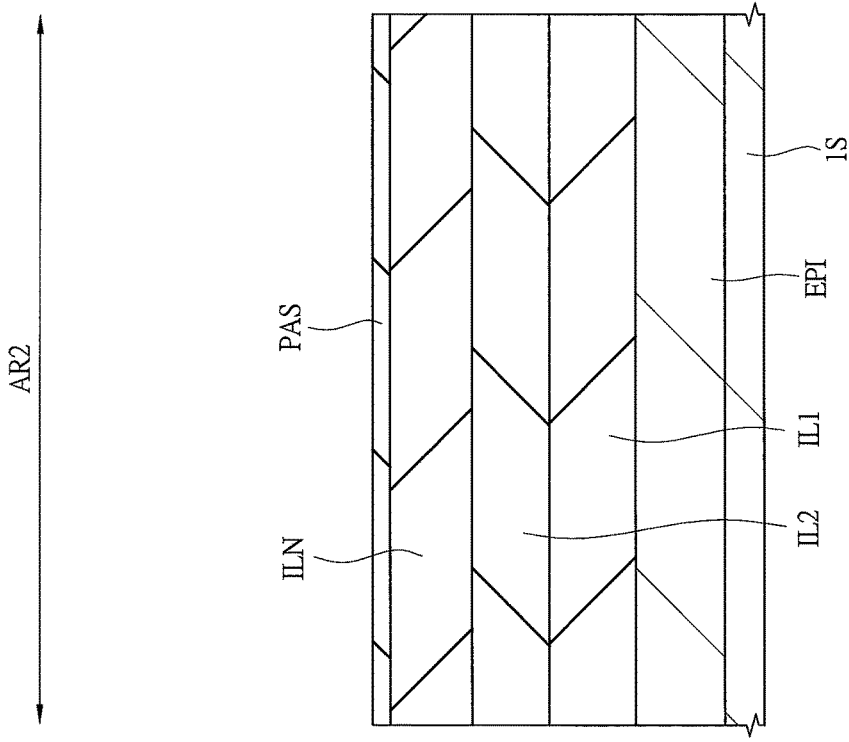

Next, a manufacturing method of a semiconductor device in the first embodiment will be described with reference to drawings. First, as shown in FIG. 14, after an epitaxial layer EPI is formed on a semiconductor substrate 1S by using a normal semiconductor manufacturing technique, an LDMOSFET is formed on an area AR1 of the semiconductor substrate 1S. Then, over the entire main surface of the semiconductor substrate 1S including the area AR1 on which the LDMOSFET is formed and the area AR2 on which the thin-film piezoelectric bulk wave resonator BAW is formed, an interlayer insulating film. IL1 made of, for example, a silicon oxide film is formed, and a plug that is electrically connected to the LDMOSFET is formed in the interlayer insulating film IL1 formed on the area AR1. Then, after a first layer wiring made of, for example, an aluminum film is formed on the interlayer insulating film IL1 formed on the area AR1, an interlayer insulating film IL2 made of, for example, a silicon oxide film is formed on the interlayer insulating film IL1 formed on the entire main surface of the semiconductor substrate 1S including the area AR1 and the area AR2. Next, after a plug is formed in the interlayer insulating film IL2 formed on the area AR1, a second layer wiring made of, for example, an aluminum film is formed on the interlayer insulating film IL2 formed on the area AR1. Moreover, on the interlayer insulating film IL2 formed on the entire main surface of the semiconductor substrate 1S including the area AR1 and the area AR2, an interlayer insulating film ILN made of, for example, a silicon oxide film is formed. Subsequently, after a pad PD is formed on the interlayer insulating film ILN formed on the area AR1, a passivation film PAS made of, for example, a silicon nitride film is formed on the entire main surface of the semiconductor substrate 1S including the area AR1 and the area AR2.

Figure 15:
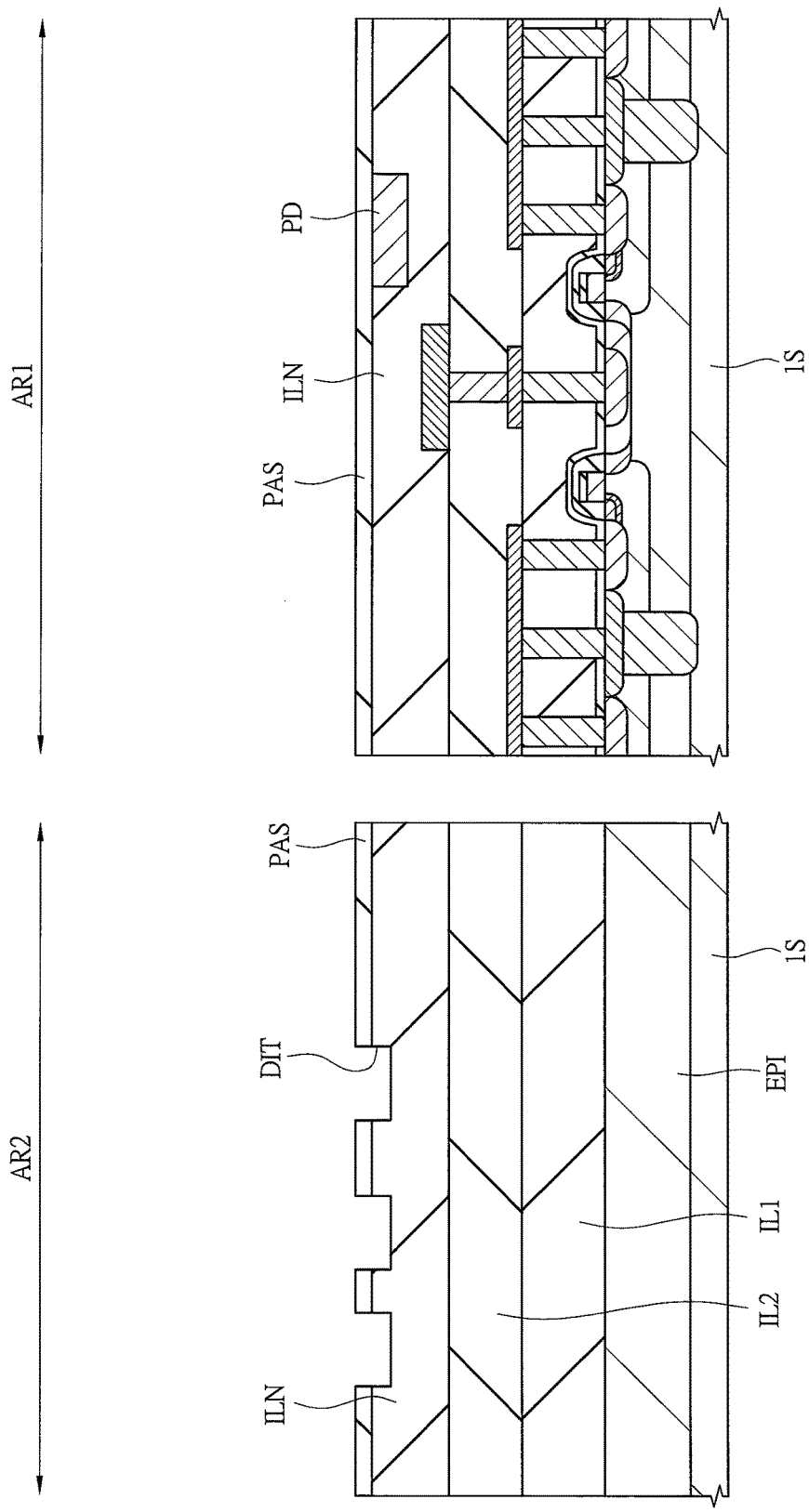
FIG. 15 is a cross-sectional view showing the manufacturing process of the semiconductor device continued from FIG. 14.

Thereafter, as shown in FIG. 15, a plurality of grooves DIT which extend from the passivation film PAS formed on the area AR2 to reach the interlayer insulating film ILN formed as the lower layer are formed by using a photolithography technique and an etching technique.

Figure 16:
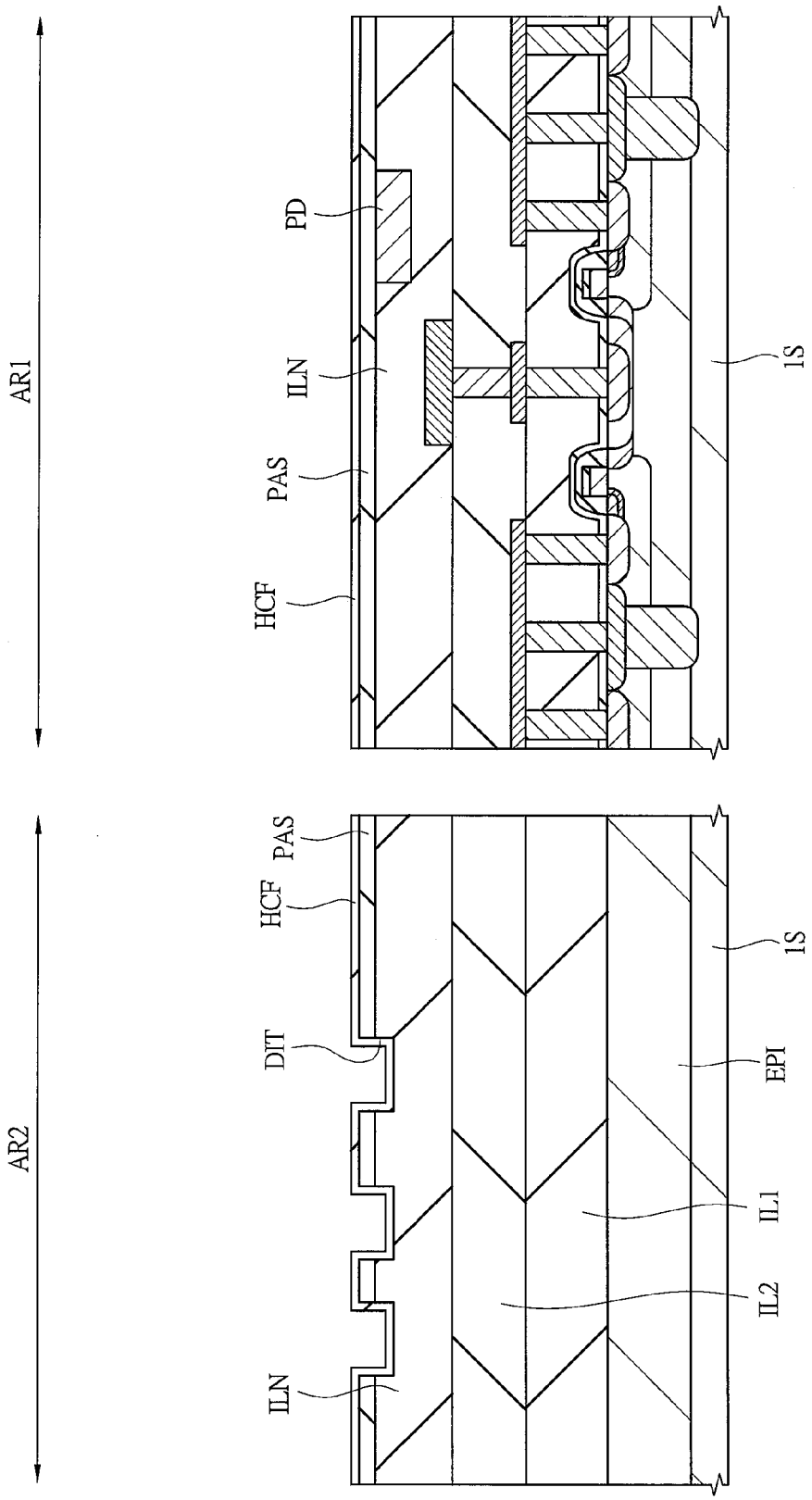
FIG. 16 is a cross-sectional view showing the manufacturing process of the semiconductor device continued from FIG. 15.

Next, as shown in FIG. 16, on the passivation film PAS in which the plurality of grooves DIT are formed, a high heat conductivity film HCF having a heat conductivity higher than that of the interlayer insulating film ILN is formed. More specifically, the high heat conductivity film. HCF is formed on the entire main surface of the semiconductor substrate 1S including the passivation film PAS on the area AR2 on which the plurality of grooves DIT are formed and the passivation film PAS formed on the area AR1. At this time, the high heat conductivity film HCF is formed along the inner wall of each of the grooves DIT. The high heat conductivity film HCF is made of, for example, a film such as an aluminum nitride film and a magnesium oxide film having a good heat conductivity, and can be formed by using, for example, a sputtering method. In particular, in the case where the high heat conductivity film HCF is made of an aluminum nitride film, the aluminum nitride film can be formed by a reactive sputtering method carried out in an atmosphere containing nitrogen with using aluminum as a target.

Figure 17:
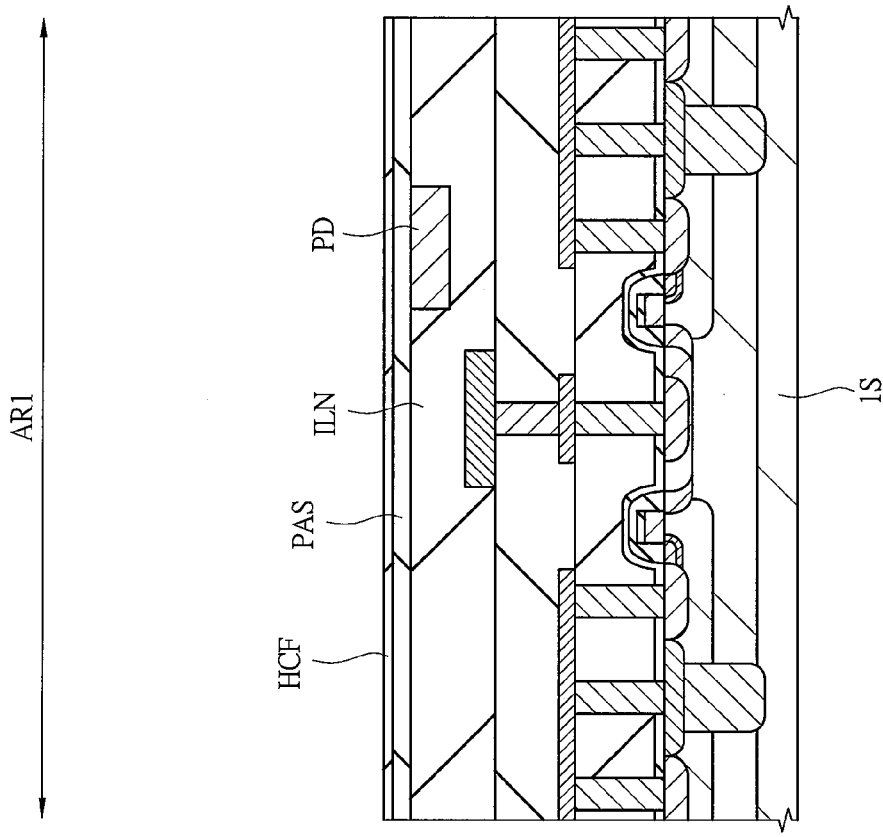
FIG. 17 is a cross-sectional view showing the manufacturing process of the semiconductor device continued from FIG. 16.
Figure 17:
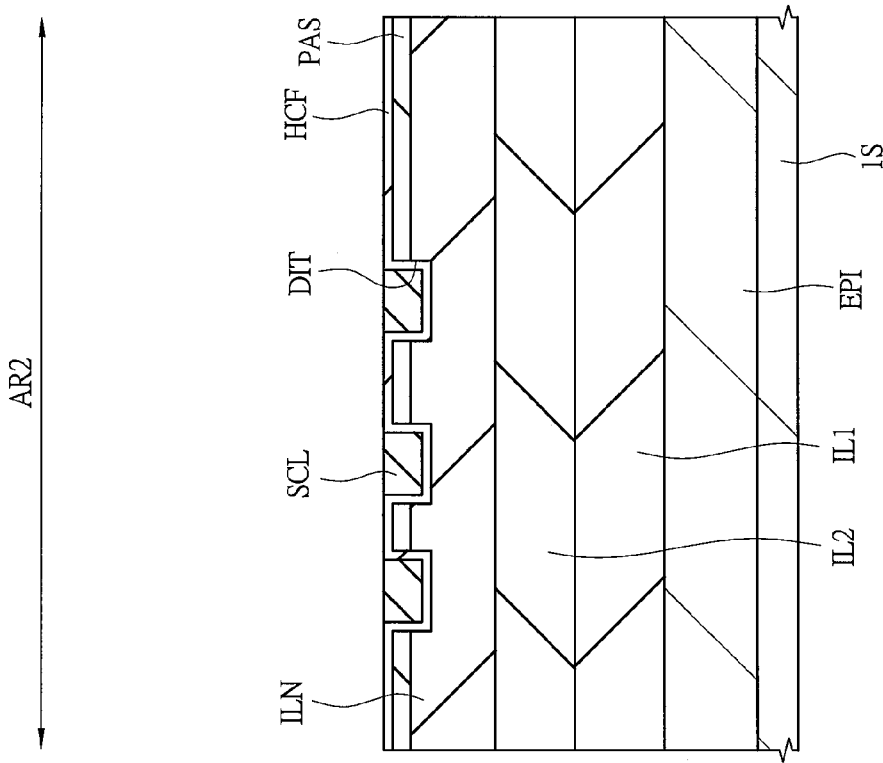

Subsequently, as shown in FIG. 17, after a sacrificial layer is formed on the high heat conductivity film HCF including the inside of each of the grooves DIT formed on the area AR2, the unnecessary sacrificial layer formed on the high heat conductivity film HCF is removed by using, for example, a chemical mechanical polishing method (CMP). In this manner, the sacrificial layer SCL can be buried only inside the grooves DIT. More specifically, the sacrificial layer SCL is made of, for example, a silicon oxide film.

Figure 18:
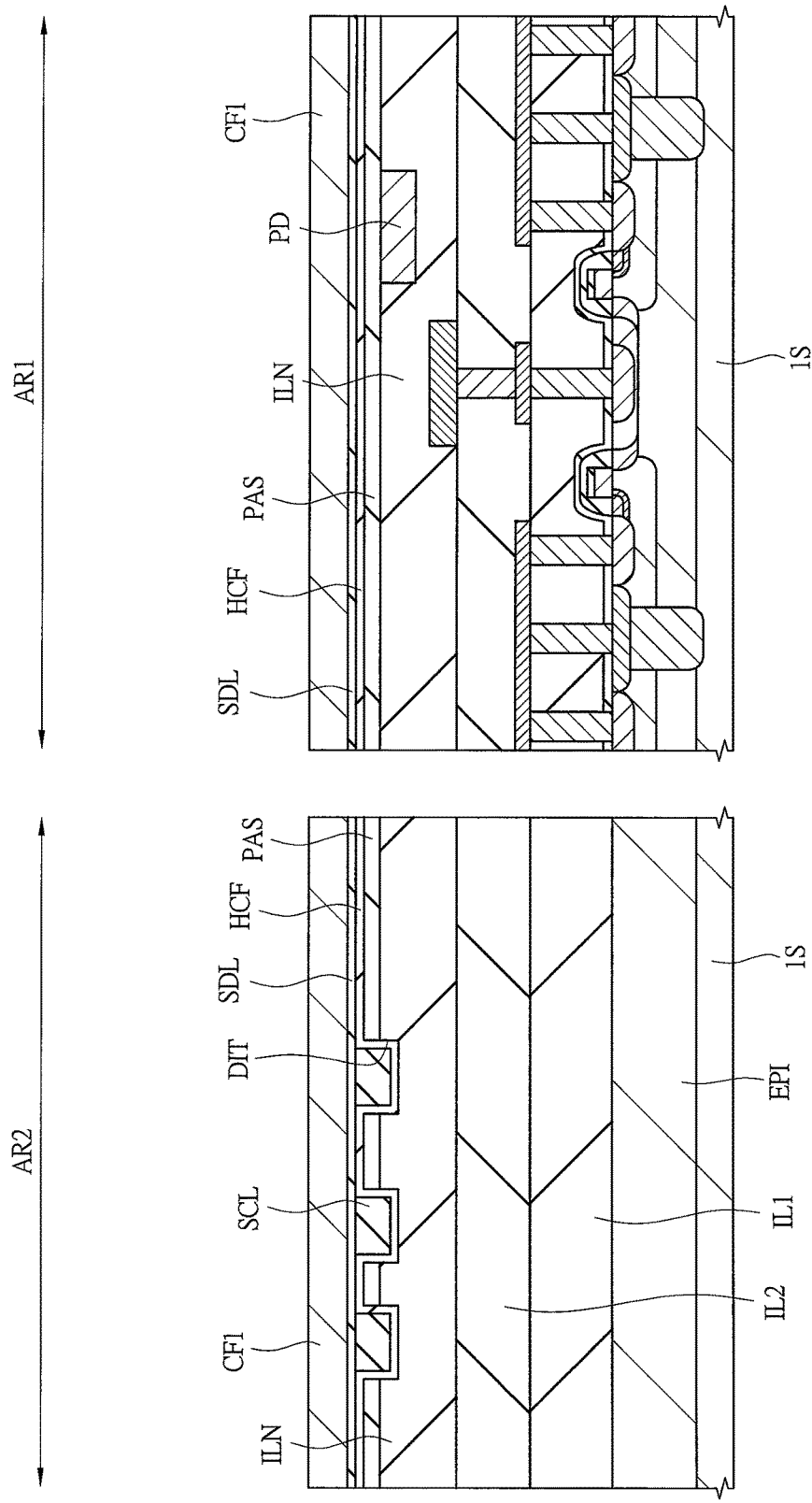
FIG. 18 is a cross-sectional view showing the manufacturing process of the semiconductor device continued from FIG. 17.

Thereafter, as shown in FIG. 18, a seed layer SDL is formed on the high heat conductivity film HCF including the upper portions of the grooves DIT buried with the sacrificial layer SCL, and a conductor film CF1 is formed on the seed layer SDL. The seed layer SDL is made of, for example, an aluminum nitride film, and can be formed by using, for example, a sputtering method. Moreover, the conductor film CF1 is made of, for example, a molybdenum (Mo) film, and can be formed by using, for example, a sputtering method.

Figure 19:
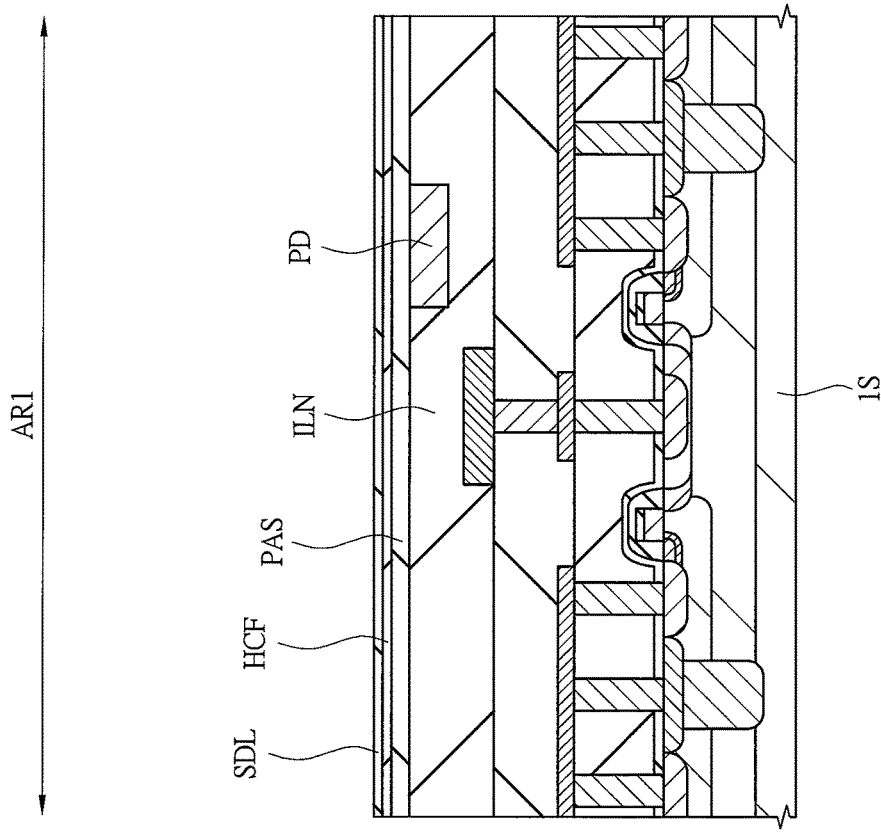
FIG. 19 is a cross-sectional view showing the manufacturing process of the semiconductor device continued from FIG. 18.
Figure 19:
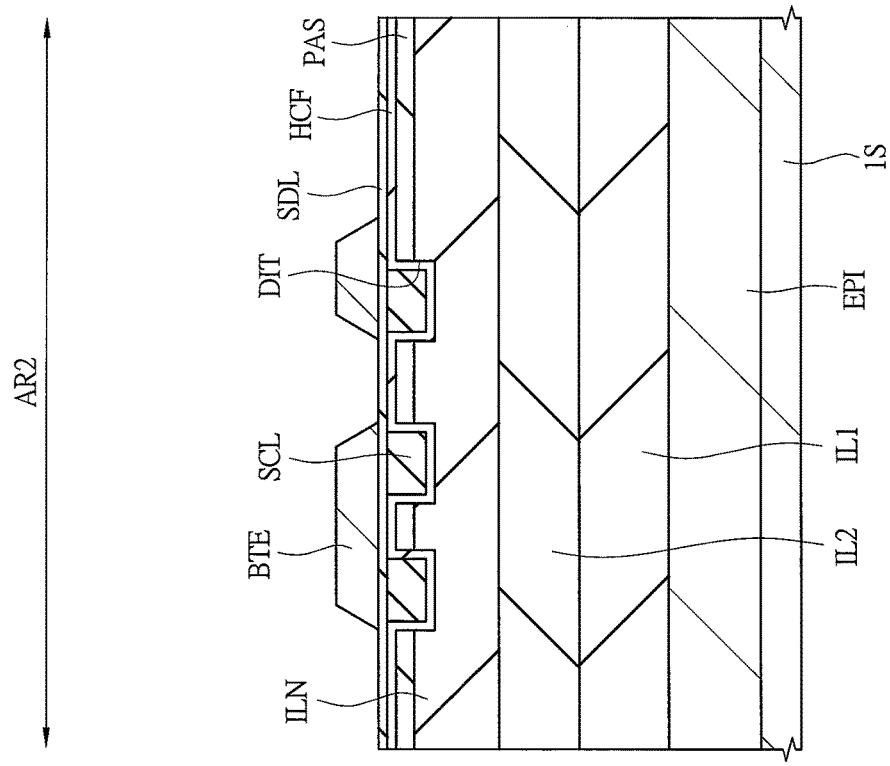
Figure 20:
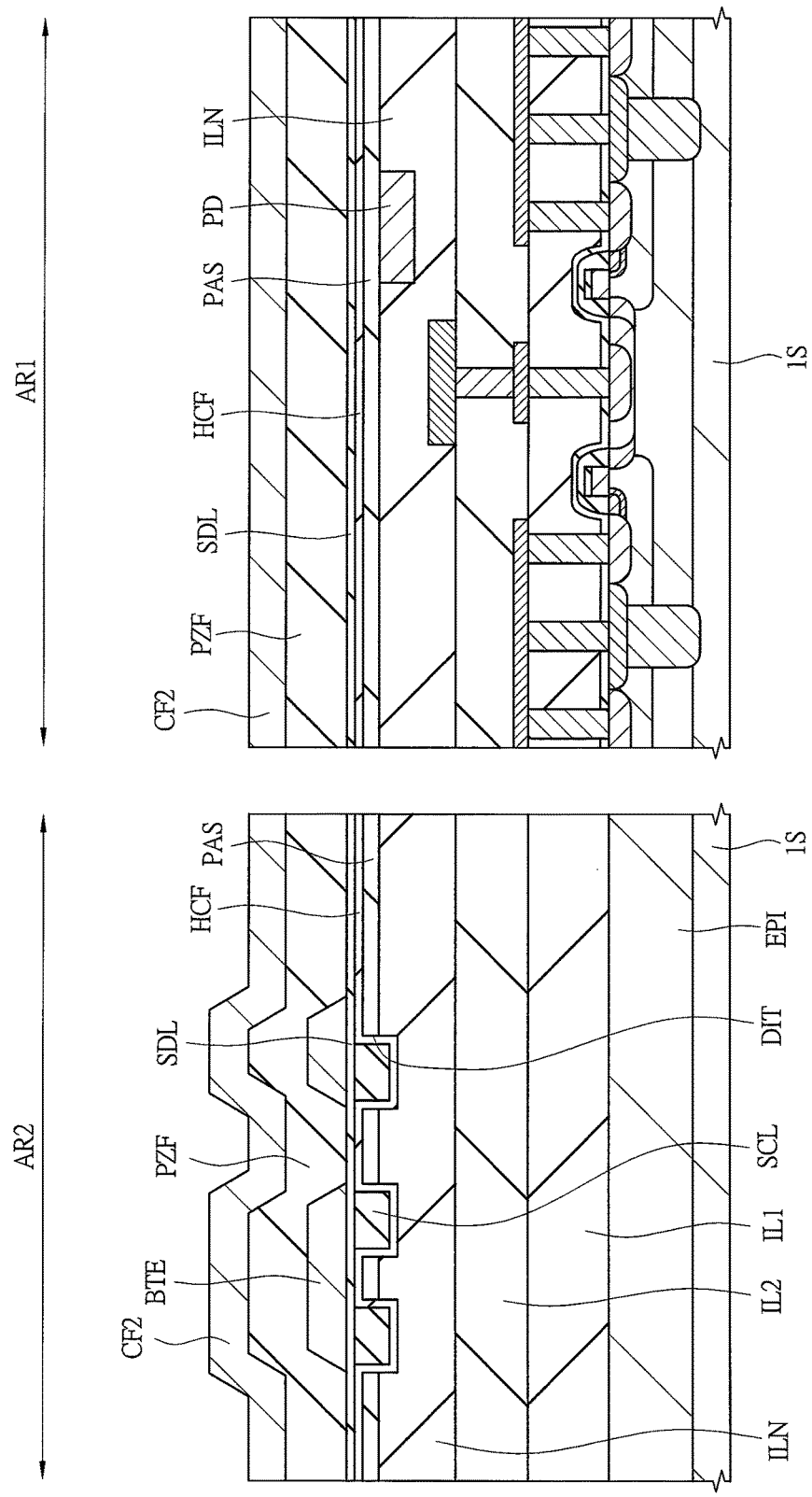
FIG. 20 is a cross-sectional view showing the manufacturing process of the semiconductor device continued from FIG. 19.

Next, as shown in FIG. 19, by processing the conductor film CF1 by using a photolithography technique and an etching technique, a lower electrode BTE is formed on the area AR2. Moreover, as shown in FIG. 20, a piezoelectric film PZF is formed on the entire main surface of the semiconductor substrate 1S over the area AR1 to the area AR2, and a conductor film CF2 is formed on this piezoelectric film PZF. More specifically, the piezoelectric film PZF is made of, for example, an aluminum nitride film, and can be formed by using, for example, a sputtering method. Moreover, the conductor film CF2 is made of, for example, a molybdenum (Mo) film, and can be formed by using, for example, a sputtering method.

Figure 21:
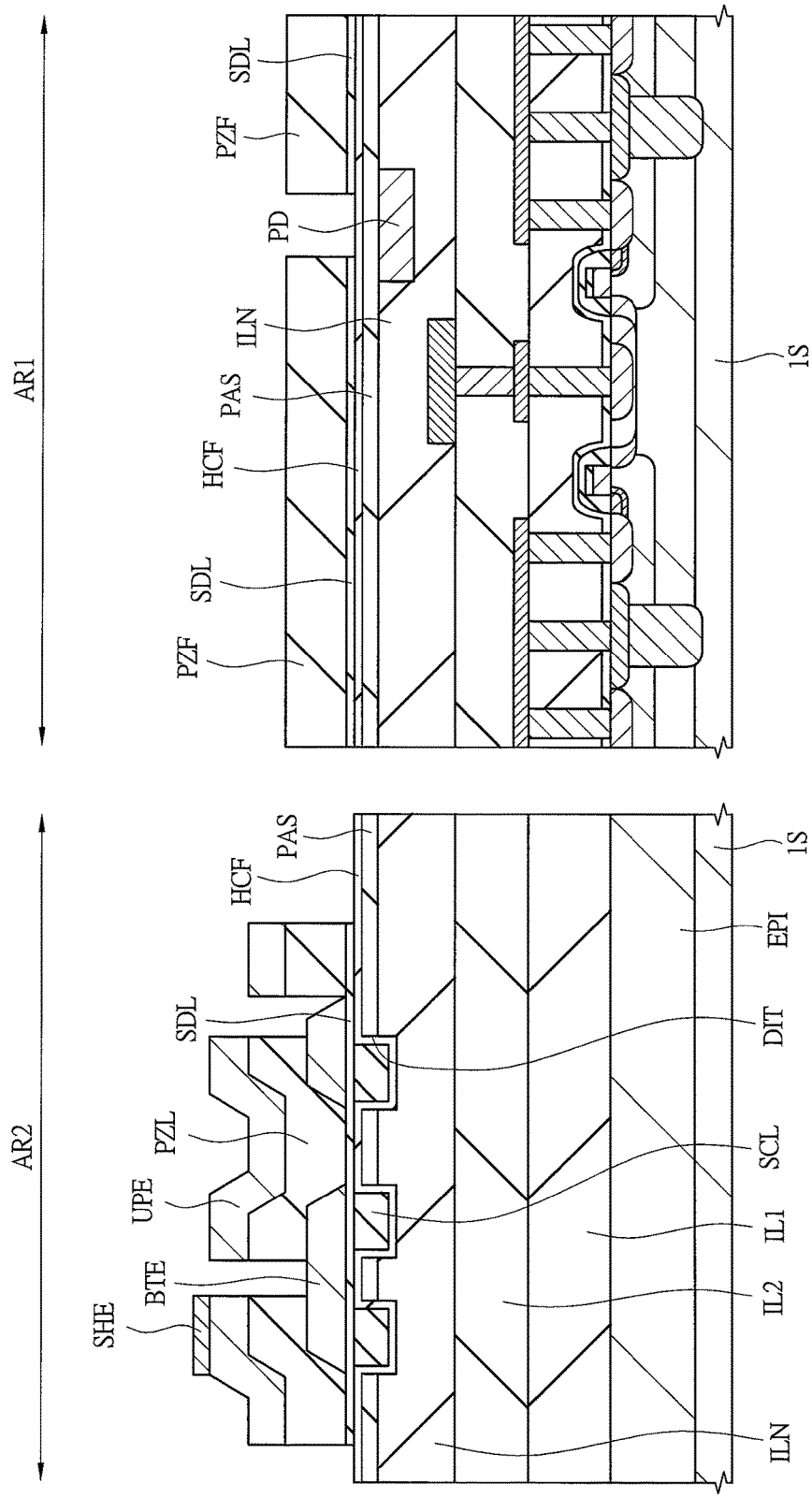
FIG. 21 is a cross-sectional view showing the manufacturing process of the semiconductor device continued from FIG. 20.

Subsequently, as shown in FIG. 21, by processing the conductor film CF2 and the piezoelectric film PZF by using a photolithography technique and an etching technique, an upper electrode UPE made of the conductor film CF2 is formed and the piezoelectric layer PZL made of the piezoelectric film PZF is formed on the area AR2. Moreover, a shunt electrode SHE made of a conductor film is formed. Furthermore, with respect to the area AR1, the piezoelectric film PZF is exposed to the surface by removing the conductor film CF2, and by the process of processing the piezoelectric film PZF on the area AR2, the piezoelectric film PZF is removed also on an area on which the pad PD of the area AR1 is opened. Note that the seed layer SDL and the piezoelectric film PZF of the area AR1 have the same function as that of the high heat conductivity film HCF.

Figure 22:
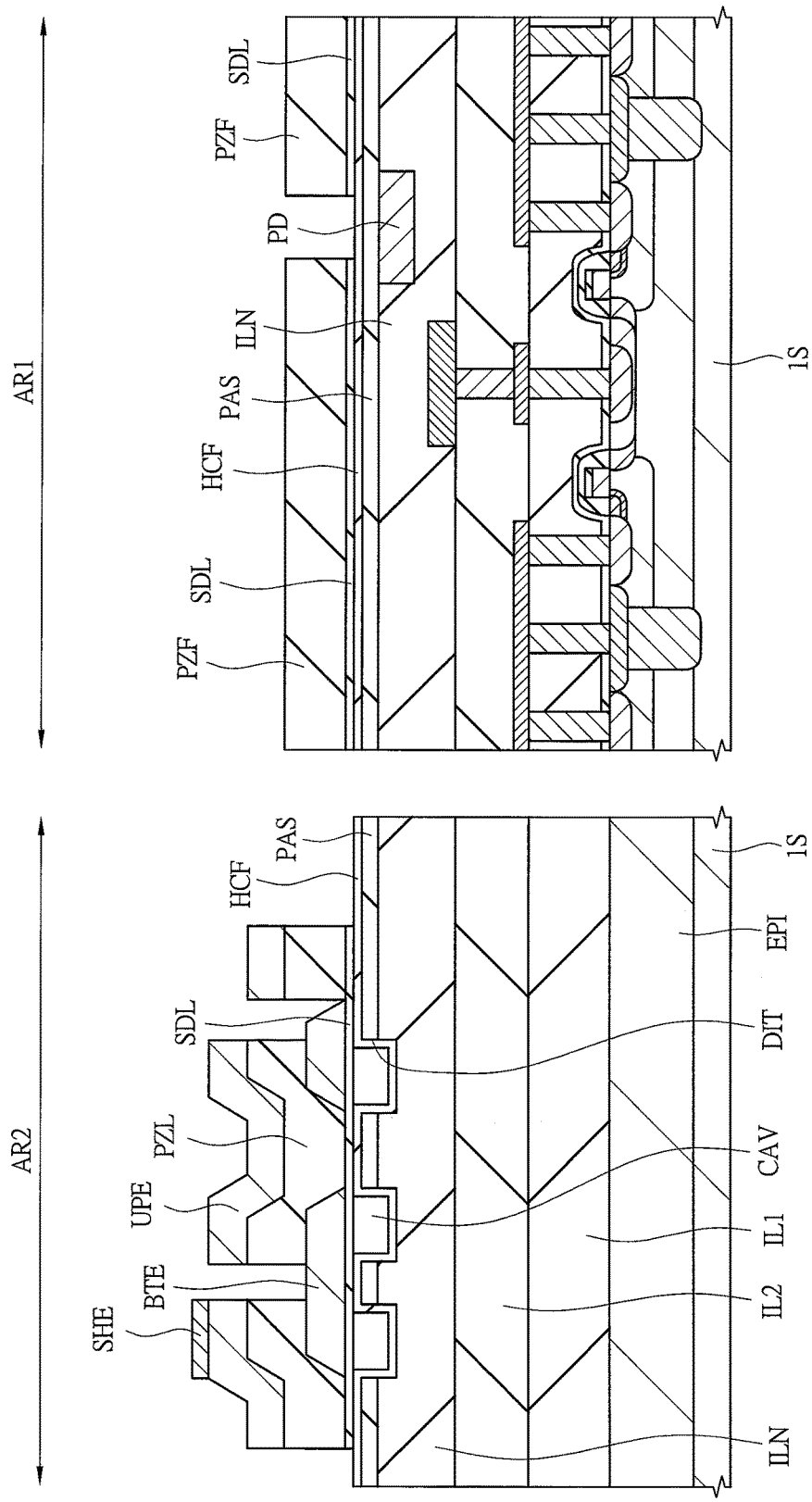
FIG. 22 is a cross-sectional view showing the manufacturing process of the semiconductor device continued from FIG. 21.

Thereafter, as shown in FIG. 22, by removing the sacrificial layer SCL buried in the grooves DIT formed on the area AR2, cavity portions CAV are formed. At this time, the sacrificial layer SCL is made of a silicon oxide film, and the interlayer insulating film ILN in which the grooves DIT are formed is also made of a silicon oxide film. Therefore, when simply trying to remove the sacrificial layer SCL by etching, the interlayer insulating film ILN is also etched undesirably.

However, in the first embodiment, the high heat conductivity film HCF made of, for example, an aluminum nitride film is formed on the inner wall of each of the grooves DIT. As described above, the high heat conductivity film HCF is provided so as to efficiently dissipate the heat generated in the LDMOSFET in all the directions, and this film further functions as an etching stopper for the etching of the sacrificial layer SCL. In other words, in the first embodiment, the high heat conductivity film. HCF is formed on the inner wall of each of the grooves DIT formed in the interlayer insulating film ILN, and the sacrificial layer SCL is formed so as to bury the grooves DIT, with the high heat conductivity film HCF interposed therebetween. Also, while the sacrificial layer SCL is made of a silicon oxide film, the high heat conductivity film HCF is made of an aluminum nitride film having a high etching selectivity relative to the silicon oxide film. For this reason, when etching the sacrificial layer SCL, the high heat conductivity film HCF formed on the inner wall of each of the grooves DIT serves as the etching stopper, so that it is possible to prevent the interlayer insulating film. ILN made of a silicon oxide film similar to that of the sacrificial layer SCL from being etched. In other words, in the first embodiment, the high heat conductivity film HCF functions as the etching stopper when removing the sacrificial layer SCL, and the interlayer insulating film ILN can be protected at the time when the sacrificial layer SCL is etched. More specifically, when the silicon oxide film constituting the sacrificial layer SCL is etched, for example, buffered hydrofluoric acid is used.

Here, although it is also thinkable to form the sacrificial layer SCL from a material different from the interlayer insulating film ILN, the sacrificial layer SCL is made of a silicon oxide film similar to that of the interlayer insulating film ILN because of the following reasons. That is, the size of the grooves DIT is a comparatively large area, and the thin-film piezoelectric bulk wave resonator is formed on the upper portion of the grooves DIT. Therefore, when removing the sacrificial layer SCL buried in the grooves DIT, the sacrificial layer SCL needs to be etched from the portion of each of the grooves DIT protruding to an area where no thin-film piezoelectric bulk wave resonator is formed. In this case, since the portion of each of the grooves DIT protruding to an area where no thin-film piezoelectric bulk wave resonator is formed is small, it takes much time to etch the entire inside portion of each of the grooves DIT from that small portion. Therefore, it is desirable to form the sacrificial layer SCL from a material having a high etching rate. From this point of view, the silicon oxide film whose etching rate by hydrofluoric acid is high is used as the sacrificial layer SCL. In other words, from the viewpoint of improving the throughput and the mass productivity in a manufacturing method of a semiconductor device by quickly carrying out the etching of the sacrificial layer SCL having a comparatively large area, the silicon oxide film which can be quickly removed by hydrofluoric acid is used for forming the sacrificial layer SCL.

In this case, both of the interlayer insulating film ILN and the sacrificial layer SCL are made of silicon oxide films, but in the first embodiment, the high heat conductivity film HCF made of, for example, an aluminum nitride film is formed on the inner wall of each of the grooves DIT. Therefore, in the first embodiment, when etching the sacrificial layer SCL, the high heat conductivity film HCF formed on the inner wall of each of the grooves DIT serves as an etching stopper, so that it becomes possible to prevent the interlayer insulating film ILN made of a silicon oxide film similar to that of the sacrificial layer SCL from being etched.

Figure 23:
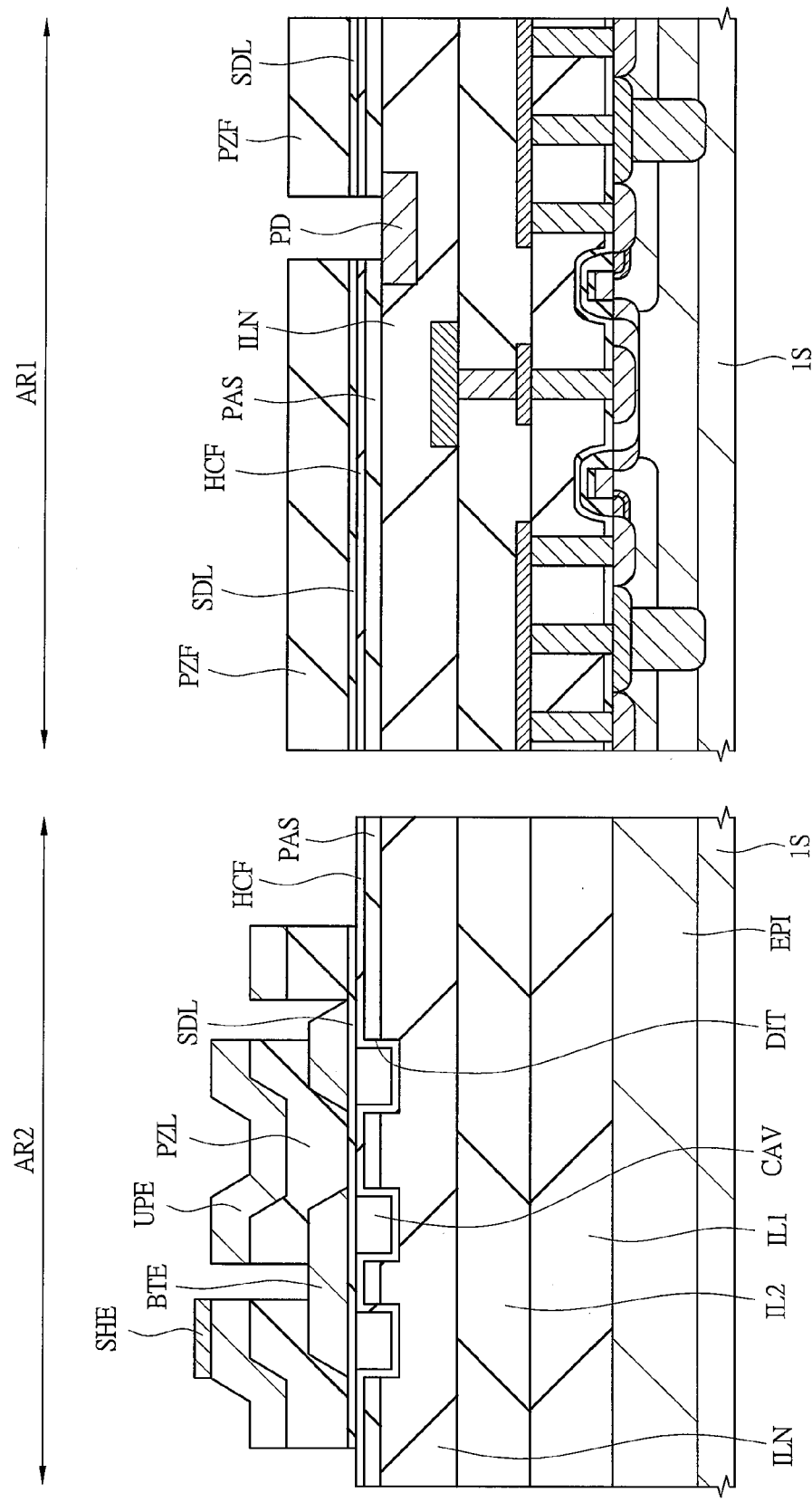
FIG. 23 is a cross-sectional view showing the manufacturing process of the semiconductor device continued from FIG. 22.

Thereafter, as shown in FIG. 23, an opening is formed in the high heat conductivity film HCF and the passivation film PAS formed on the area AR1 by using a photolithography technique and an etching technique. By this means, the surface of the pad PD formed on the area AR1 is exposed. In this manner, the semiconductor device of the first embodiment is manufactured.

<Effects of First Embodiment>

In the first embodiment, the high heat conductivity film HCF is provided on the passivation film PAS over the entire area of the semiconductor substrate 1S including the area AR1 on which the LDMOSFET is formed and the area AR2 on which the thin-film piezoelectric bulk wave resonator BAW is formed. Accordingly, heat generated in the LDMOSFET is transmitted to the high heat conductivity film. HCF formed on the area AR1, and is quickly dissipated by the high heat conductivity film HCF over the entire area of the semiconductor substrate 1S. Consequently, since the temperature of the area AR1 on which the LDMOSFET is formed can be lowered, the temperature rise of the thin-film piezoelectric bulk wave resonator BAW formed on the area AR2 caused by the heat generated from the LDMOSFET formed on the area AR1 can be suppressed. Therefore, in the first embodiment, it is possible to sufficiently suppress the temperature rise of the thin-film piezoelectric bulk wave resonator BAW caused by the heat generated from the LDMOSFET even in the case where the thin-film piezoelectric bulk wave resonator BAW and the LDMOSFET are mounted on the same semiconductor substrate 1S. As a result, it becomes possible to suppress degradation of filter characteristics (electrical characteristics) of the transmitting filter TXF and the receiving filter RXF each of which is constituted by the thin-film piezoelectric bulk wave resonator BAW.

Moreover, in the first embodiment, the high heat conductivity film HCF is formed on the inner wall of each of the grooves DIT formed in the interlayer insulating film ILN, and the sacrificial layer SCL is formed so as to bury the grooves DIT, with the high heat conductively film HCF interposed therebetween. For this reason, when etching the sacrificial layer SCL, the high heat conductivity film HCF formed on the inner wall of each of the grooves DIT functions as an etching stopper, so that it becomes possible to prevent the interlayer insulating film ILN made of a silicon oxide film similar to that of the sacrificial layer SCL from being etched.

Second Embodiment

In the second embodiment, an example in which a low heat conductivity film LCF having a heat conductivity lower than that of the high heat conductivity film HCF is formed between the high heat conductivity film HCF and the thin-film piezoelectric bulk wave resonator BAW will be described with reference to drawings.

<Device Structure of Semiconductor Device in Second Embodiment>

Figure 24:
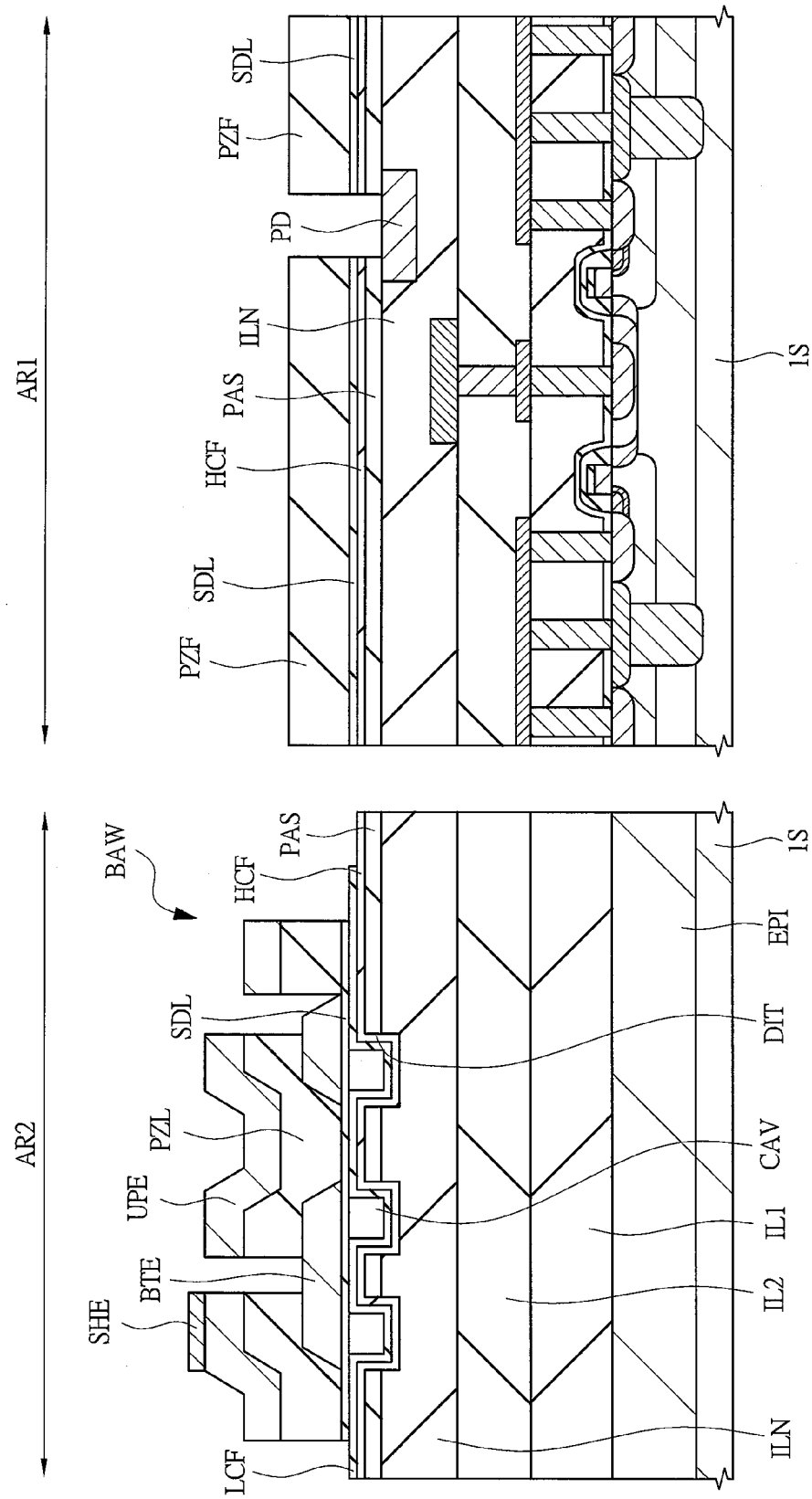
FIG. 24 is a cross-sectional view showing a configuration of a semiconductor device in the second embodiment.

FIG. 24 is a cross-sectional view showing a device structure of a semiconductor device in the second embodiment. FIG. 24 shows structures formed on the area AR1 and the area AR2 of the semiconductor substrate 1S. The area AR1 is an area on which an LDMOSFET constituting a power amplifier PA is formed and the area AR2 is an area on which a thin-film piezoelectric bulk wave resonator BAW constituting a transmitting filter TXF or a receiving filter RXF is formed. In other words, also in the second embodiment, the LDMOSFET and the thin-film piezoelectric bulk wave resonator BAW are formed on the same semiconductor substrate 1S. Since the device structure of the LDMOSFET formed on the area AR1 is the same as that of the aforementioned first embodiment, the description thereof will be omitted. Moreover, the device structure of the thin-film piezoelectric bulk wave resonator BAW formed on the area AR2 is basically the same as that of the aforementioned first embodiment, the difference from the aforementioned first embodiment will be mainly described.

In FIG. 24, the characteristic of the second embodiment lies in that the high heat conductivity film HCF is formed on the passivation film PAS formed on the area AR2 and the low heat conductivity film LCF having a heat conductivity lower than that of the high heat conductivity film HCF is formed on this high heat conductivity film HCF. In this manner, it becomes possible to suppress heat from being transmitted to the thin-film piezoelectric bulk wave resonator BAW formed on the low heat conductivity film LCF. Consequently, in the second embodiment, for example, the temperature rise of the thin-film piezoelectric bulk wave resonator BAW due to heat generated from the LDMOSFET can be sufficiently suppressed even in the case where the thin-film piezoelectric bulk wave resonator BAW and the LDMOSFET are mounted on the same semiconductor substrate 1S. As a result, it becomes possible to suppress degradation of filter characteristics (electrical characteristics) of the transmitting filter TXF and the receiving filter RXF each of which is constituted by the thin-film piezoelectric bulk wave resonator BAW.

For example, also in the second embodiment, the high heat conductivity film HCF is formed on the passivation film PAS over the entire area of the semiconductor substrate S1 including the area AR1 on which the LDMOSFET is formed and the area AR2 on which the thin-film piezoelectric bulk wave resonator BAW is formed. By this means, heat generated in the LDMOSFET is transmitted to the high heat conductivity film HCF formed on the area AR1, and is quickly dissipated over the entire area of the semiconductor substrate 1S by the high heat conductivity film HCF. As a result, since the temperature of the area AR1 on which the LDMOSFET is formed can be lowered, it is possible to suppress the temperature rise of the thin-film piezoelectric bulk wave resonator BAW formed on the area AR2 caused by the heat generated from the LDMOSFET formed on the area AR1. Here, since the high heat conductivity film HCF is formed also in the lower layer of the thin-film piezoelectric bulk wave resonator BAW formed on the area AR2, it is considered that a part of heat generated in the LDMOSFET might be transmitted to the thin-film piezoelectric bulk wave resonator BAW by the high heat conductivity film HCF formed over the area AR1 to the area AR2. However, also in the aforementioned first embodiment, since the cavity portions CAV are formed between the high heat conductivity film HCF and the thin-film piezoelectric bulk wave resonator BAW, it is possible to suppress the heat from being transmitted from the high heat conductivity film HCF to the thin-film piezoelectric bulk wave resonator BAW. In addition to this, in the second embodiment, the low heat conductivity film LCF is provided between the high heat conductivity film HCF and the thin-film piezoelectric bulk wave resonator BAW. For this reason, heat transmitted through the high heat conductivity film HCF is hard to be transmitted to the thin-film piezoelectric bulk wave resonator BAW formed on the low heat conductivity film LFC because of the presence of the low heat conductivity film LCF. Thus, in the second embodiment, it is possible to suppress the temperature rise of the thin-film piezoelectric bulk wave resonator BAW.

In other words, like the aforementioned first embodiment, since the high heat conductivity film HCF is formed on the entire main surface of the semiconductor substrate 1S including the area AR1 and the area AR2 in the second embodiment, heat generated in the LDMOSFET can be dissipated in all the directions, so that it is possible to suppress the temperature rise on the area AR1 on which the LDMOSFET is formed. Moreover, since the low heat conductivity film LCF is formed on the high heat conductivity film HCF on the area AR2 as a unique feature of the second embodiment, it is possible to suppress heat transmission from the high heat conductivity film HCF to the thin-film piezoelectric bulk wave resonator BAW. By the synergistic effect of these two mechanisms, in the second embodiment, it is possible to suppress the temperature rise of the thin-film piezoelectric bulk wave resonator BAW caused by the heat generation of the LDMOSFET formed on the same semiconductor substrate 1S.

As the low heat conductivity film LCF described above, for example, a silicon nitride film (heat conductivity: 20 W/m·K) or an aluminum oxide film (heat conductivity: 32 W/m·K) may be used. The advantage of using the silicon nitride film as the low heat conductivity film lies in that the film-forming temperature of the silicon nitride film is a comparatively low temperature and influences on other semiconductor elements due to high temperatures can be reduced when integrating semiconductor elements (semiconductor devices). Meanwhile, the advantage of using the aluminum oxide film as the low heat conductivity film lies in that it has a high etching selectivity relative to a silicon oxide film (TEOS film) to be used as the sacrificial layer SCL to be described later and it can sufficiently function as an etching stopper film when the sacrificial layer SCL is removed.

<Manufacturing Method of Semiconductor Device in Second Embodiment>

Figure 25:
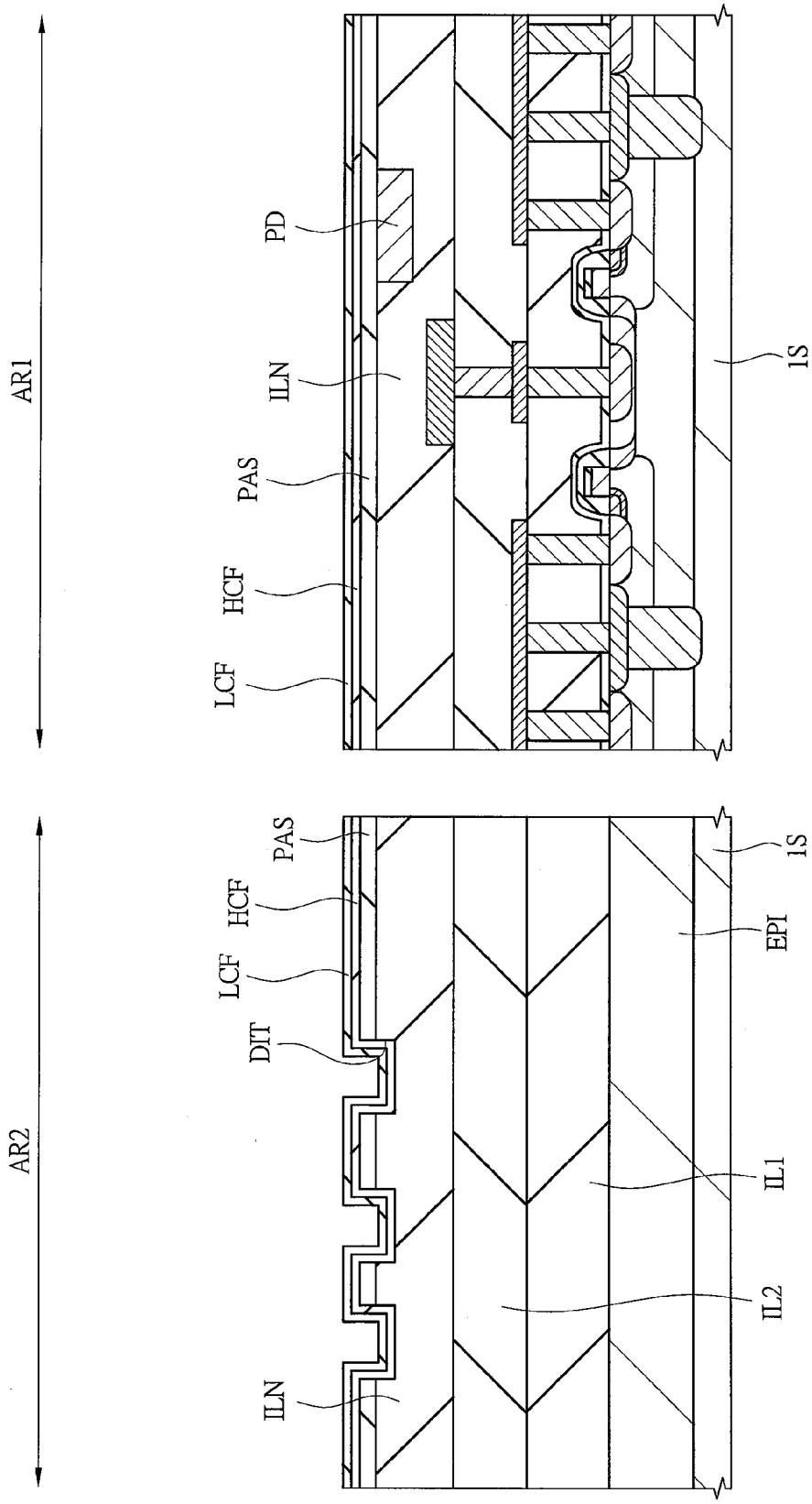
FIG. 25 is a cross-sectional view showing a manufacturing process of the semiconductor device in the second embodiment.

The semiconductor device in the second embodiment is configured as described above, and the manufacturing method thereof will be described below with reference to drawings. The process up to the steps shown in FIG. 14 to FIG. 16 is the same as that in the above-mentioned first embodiment. Subsequently, as shown in FIG. 25, on the high heat conductivity film HCF formed on the entire main surface of the semiconductor substrate 1S including the area AR1 and the area AR2 on which the grooves DIT are formed, the low heat conductivity film LCF having a heat conductivity lower than that of the high heat conductivity film HCF is formed. This low heat conductivity film LCF is made of, for example, a silicon nitride film or an aluminum oxide film, and can be formed by using, for example, a CVD method and a sputtering method.

Figure 26:
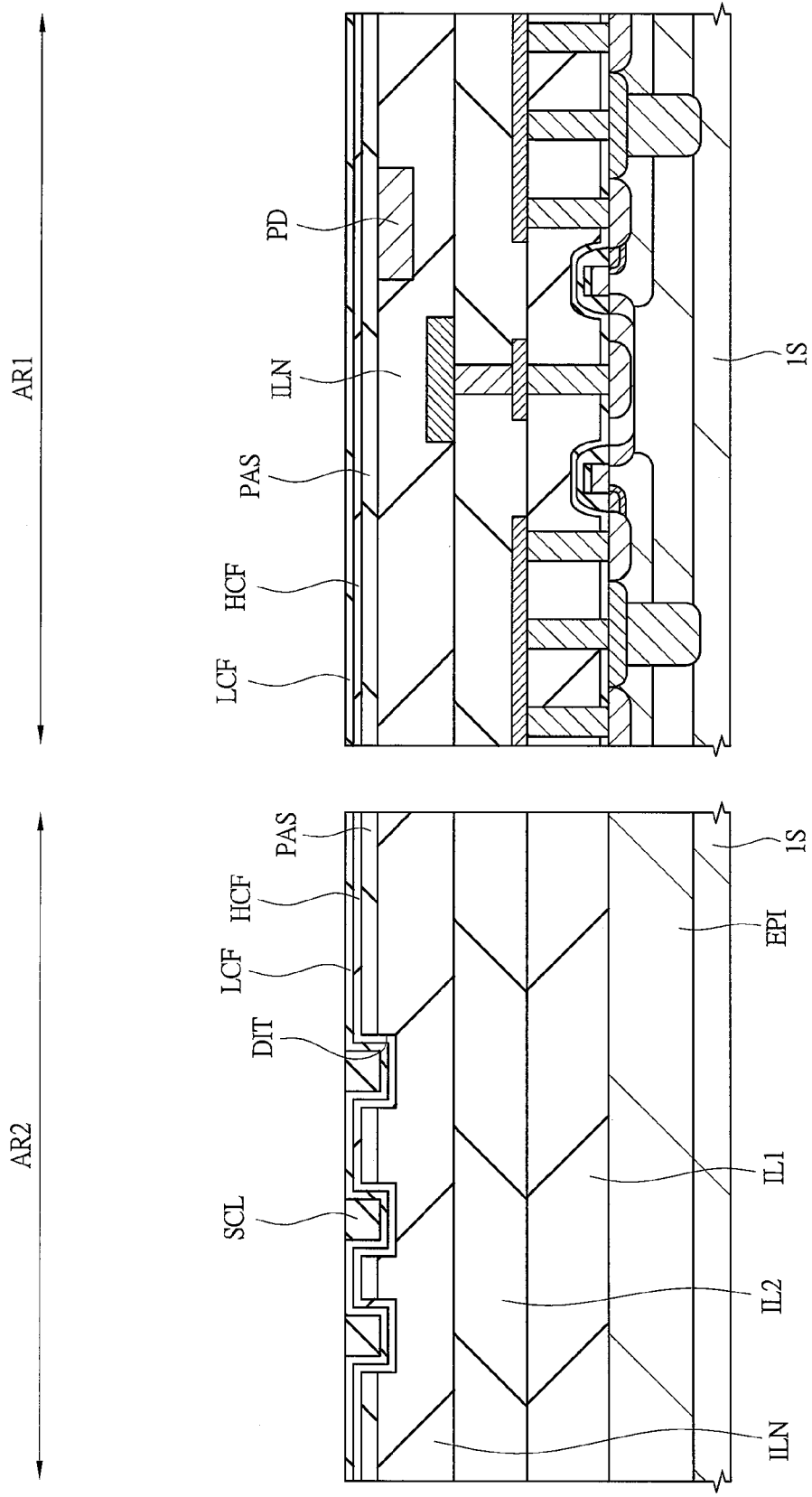
FIG. 26 is a cross-sectional view showing the manufacturing process of the semiconductor device continued from FIG. 25.

Subsequently, as shown in FIG. 26, after a sacrificial layer is formed on the low heat conductivity film LCF including the inside of each of the grooves DIT formed on the area AR2, the unnecessary sacrificial layer formed on the low heat conductivity film LCF is removed by using, for example, a chemical mechanical polishing method (CMP). In this manner, the sacrificial layer SCL can be buried only inside each of the grooves DIT. More specifically, the sacrificial layer SCL is made of, for example, a silicon oxide film.

Figure 27:
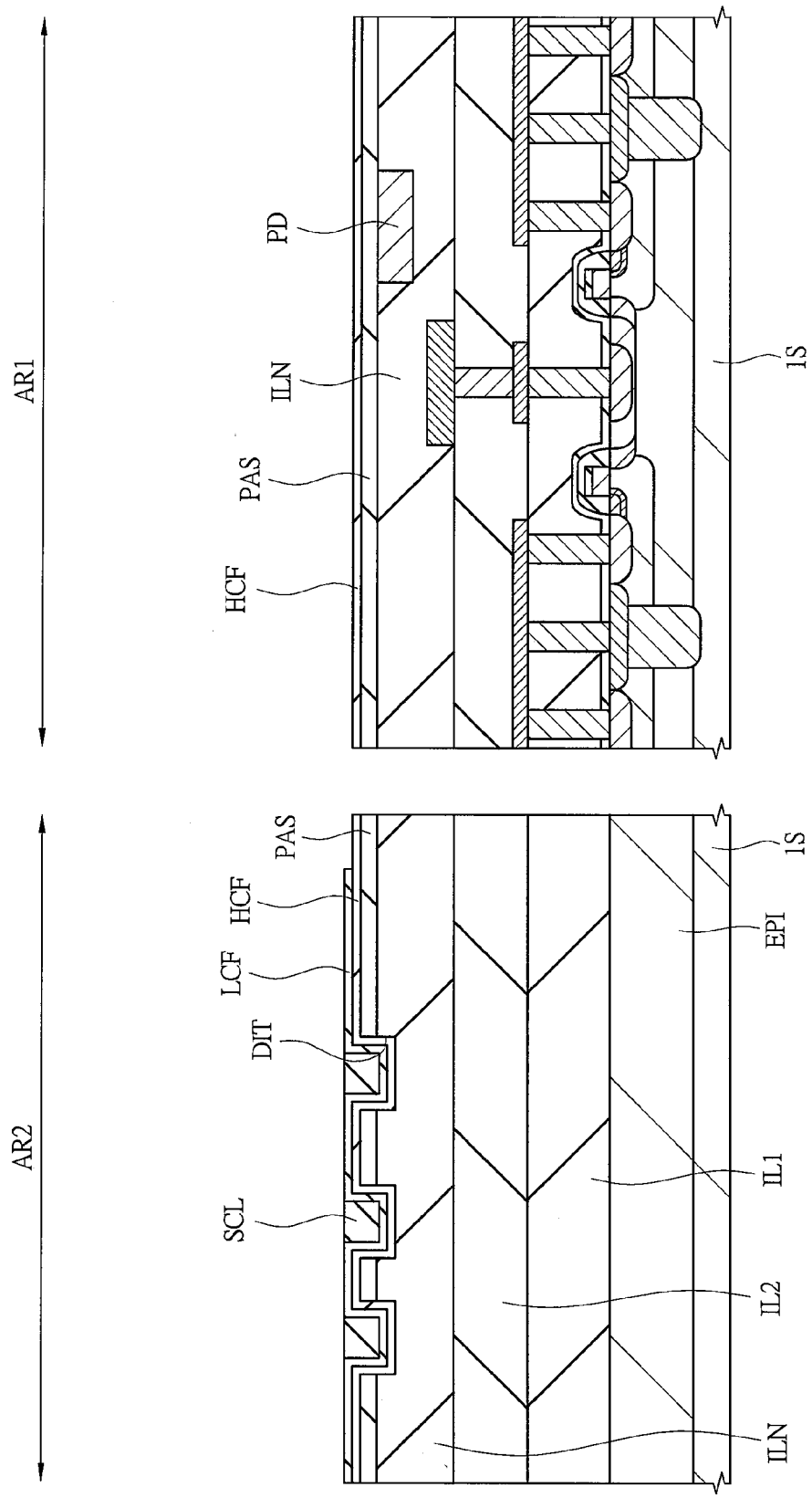
FIG. 27 is a cross-sectional view showing the manufacturing process of the semiconductor device continued from FIG. 26.

Thereafter, as shown in FIG. 27, by using a photolithography technique and an etching technique, while the low heat conductivity film LCF formed on the area AR2 is left, the low heat conductivity film LCF formed on the area AR1 is removed.

Figure 28:
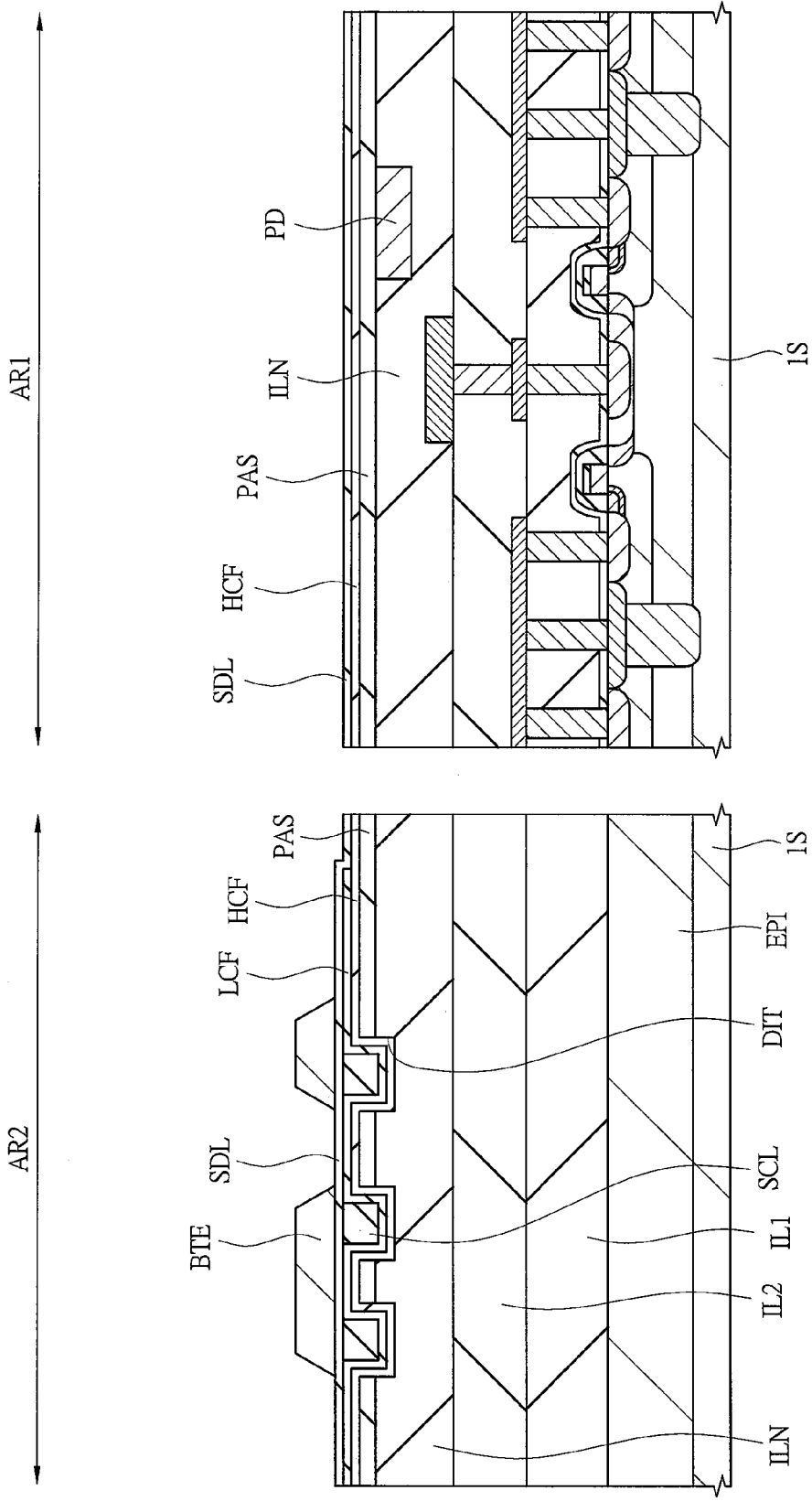
FIG. 28 is a cross-sectional view showing the manufacturing process of the semiconductor device continued from FIG. 27.

Moreover, as shown in FIG. 28, a seed layer SDL is formed on the low heat conductivity film LCF formed on the area AR2 and on the high heat conductivity film HCF formed on the area AR1, and a first conductor film is formed on this seed layer SDL. The seed layer SDL is made of, for example, an aluminum nitride film, and can be formed by using, for example, a sputtering method. Moreover, the first conductor film is made of, for example, a molybdenum (Mo) film, and can be formed by using, for example, a sputtering method. Next, by processing the first conductor film by using a photolithography technique and an etching technique, a lower electrode BTE is formed on the area AR2.

Figure 29:
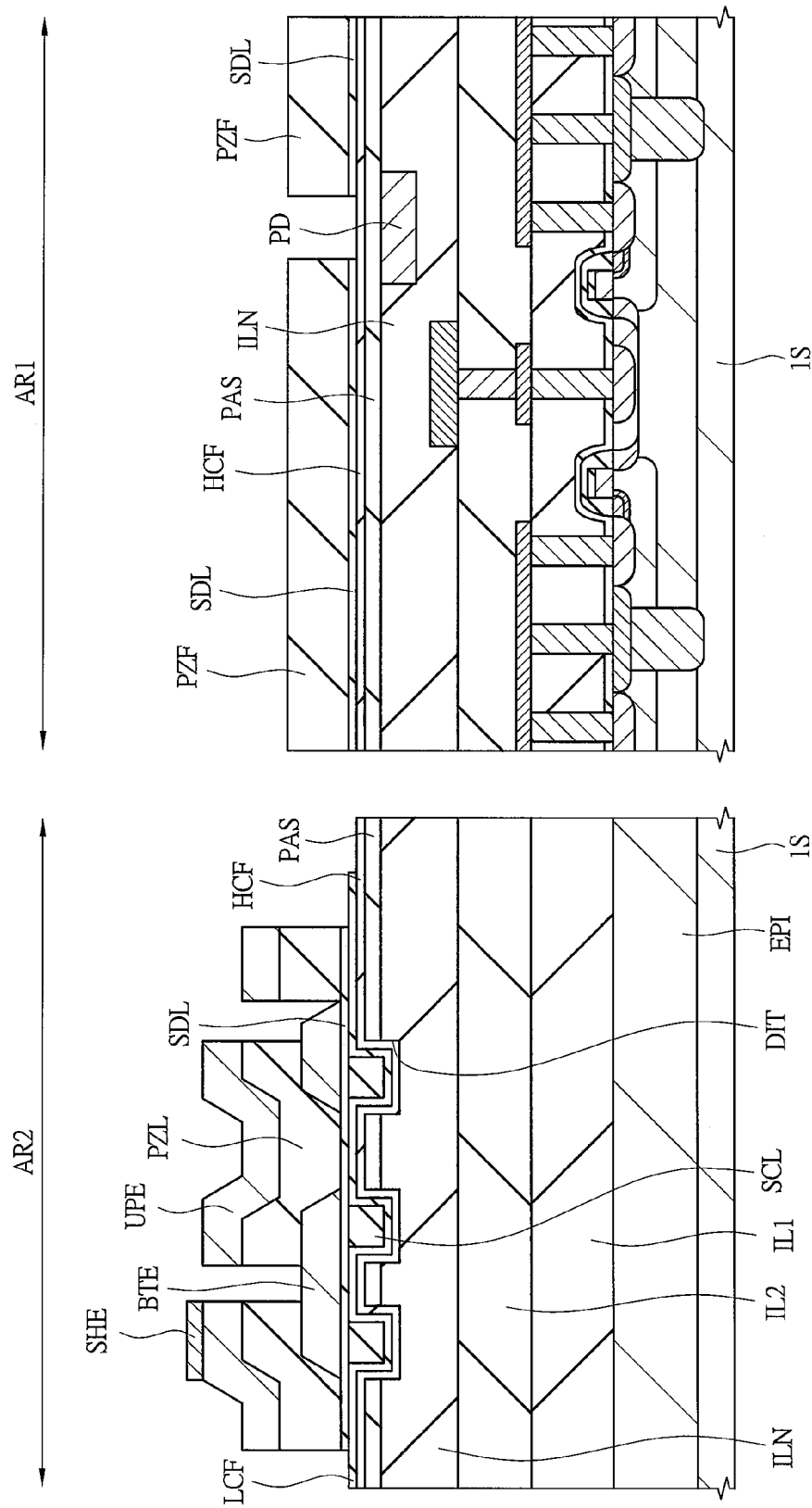
FIG. 29 is a cross-sectional view showing the manufacturing process of the semiconductor device continued from FIG. 28.

Then, as shown in FIG. 29, a piezoelectric film is formed on the entire main surface of the semiconductor substrate 1S over the area AR1 to the area AR2, and a second conductor film is formed on this piezoelectric film. More specifically, the piezoelectric film is made of, for example, an aluminum nitride film, and can be formed by using, for example, a sputtering method. Moreover, the second conductor film is made of, for example, a molybdenum (Mo) film, and can be formed by using, for example, a sputtering method. Subsequently, by processing the second conductor film and the piezoelectric film by using a photolithography technique and an etching technique, an upper electrode UPE made of the second conductor film is formed and a piezoelectric layer PZL made of the piezoelectric film is formed on the area AR2. Moreover, a shunt electrode SHE made of a conductor film is formed. Furthermore, with respect to the area AR1, the piezoelectric film PZF is exposed to the surface by removing the second conductor film, and by the process of processing the piezoelectric film PZF on the area AR2, the piezoelectric film PZF is removed also on an area on which the pad PD of the area AR1 is opened. Note that the seed layer SDL and the piezoelectric film PZF of the area AR1 have the same function as that of the high heat conductivity film HCF.

Figure 30:
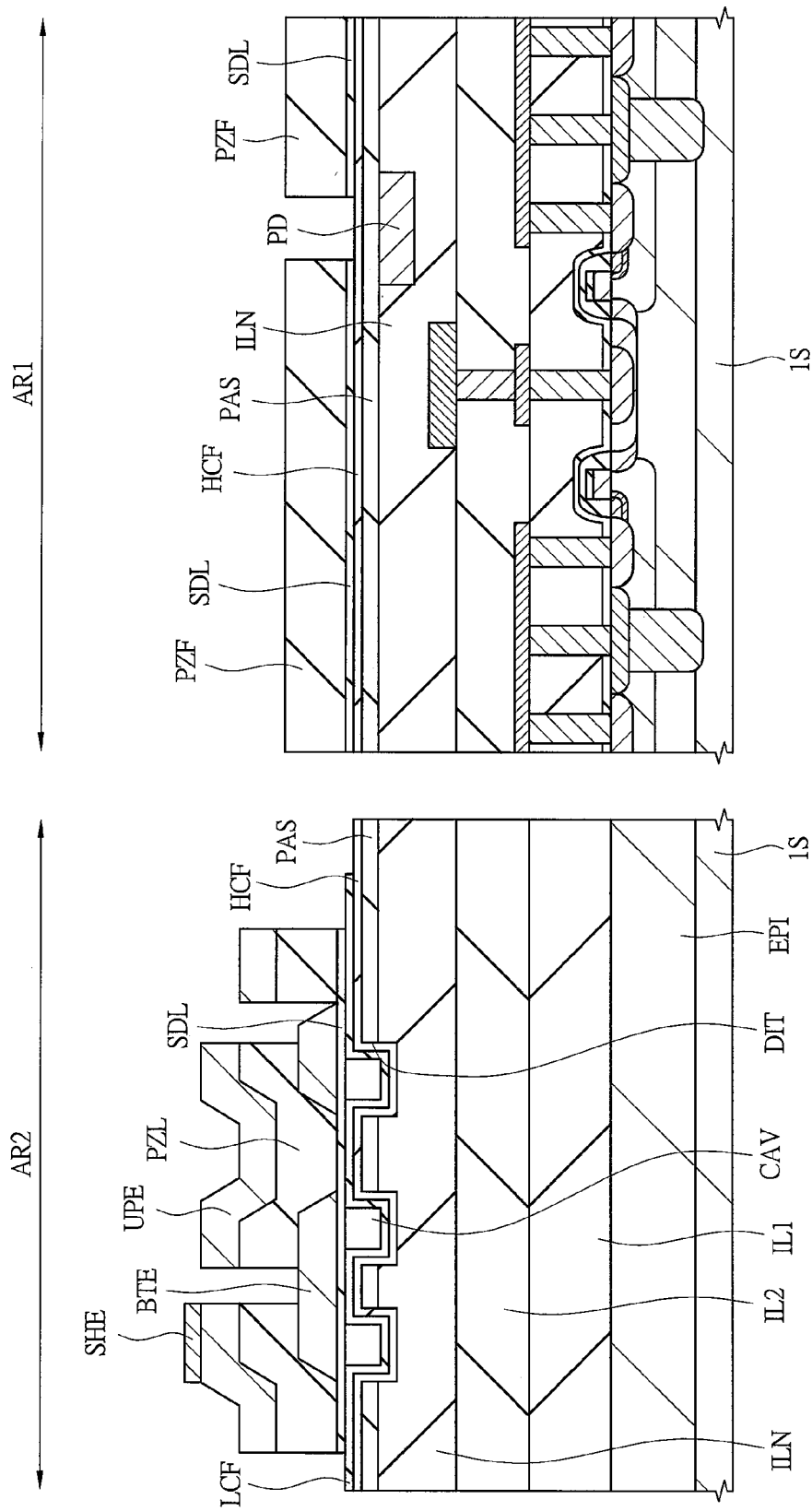
FIG. 30 is a cross-sectional view showing the manufacturing process of the semiconductor device continued from FIG. 29.

Thereafter, as shown in FIG. 30, by removing the sacrificial layer SCL buried in the grooves DIT formed on the area AR2, cavity portions CAV are formed. At this time, the sacrificial layer SCL is made of a silicon oxide film, and the low heat conductivity film LCF is made of, for example, a silicon nitride film or an aluminum oxide film. Therefore, the low heat conductivity film LCF can function as an etching stopper at the time when the sacrificial layer SCL is etched. Moreover, in the second embodiment, the high heat conductivity film HCF made of, for example, an aluminum nitride film is formed as the lower layer of the low heat conductivity film LCF. For this reason, although the interlayer insulating film ILN made of a silicon oxide film similar to that of the sacrificial layer SCL is formed as the lower layer of the high heat conductivity film HCF, since the low heat conductivity film LCF and the high heat conductivity film HCF function as etching stopper layers when etching the sacrificial layer SCL, it is possible to protect the interlayer insulating film ILN.

In particular, in the case where the low heat conductivity film LCF is made of an aluminum oxide film, since the aluminum oxide film has a high etching selectivity relative to the silicon oxide film, the low heat conductivity film LCF can function as a sufficient etching stopper film.

Figure 31:
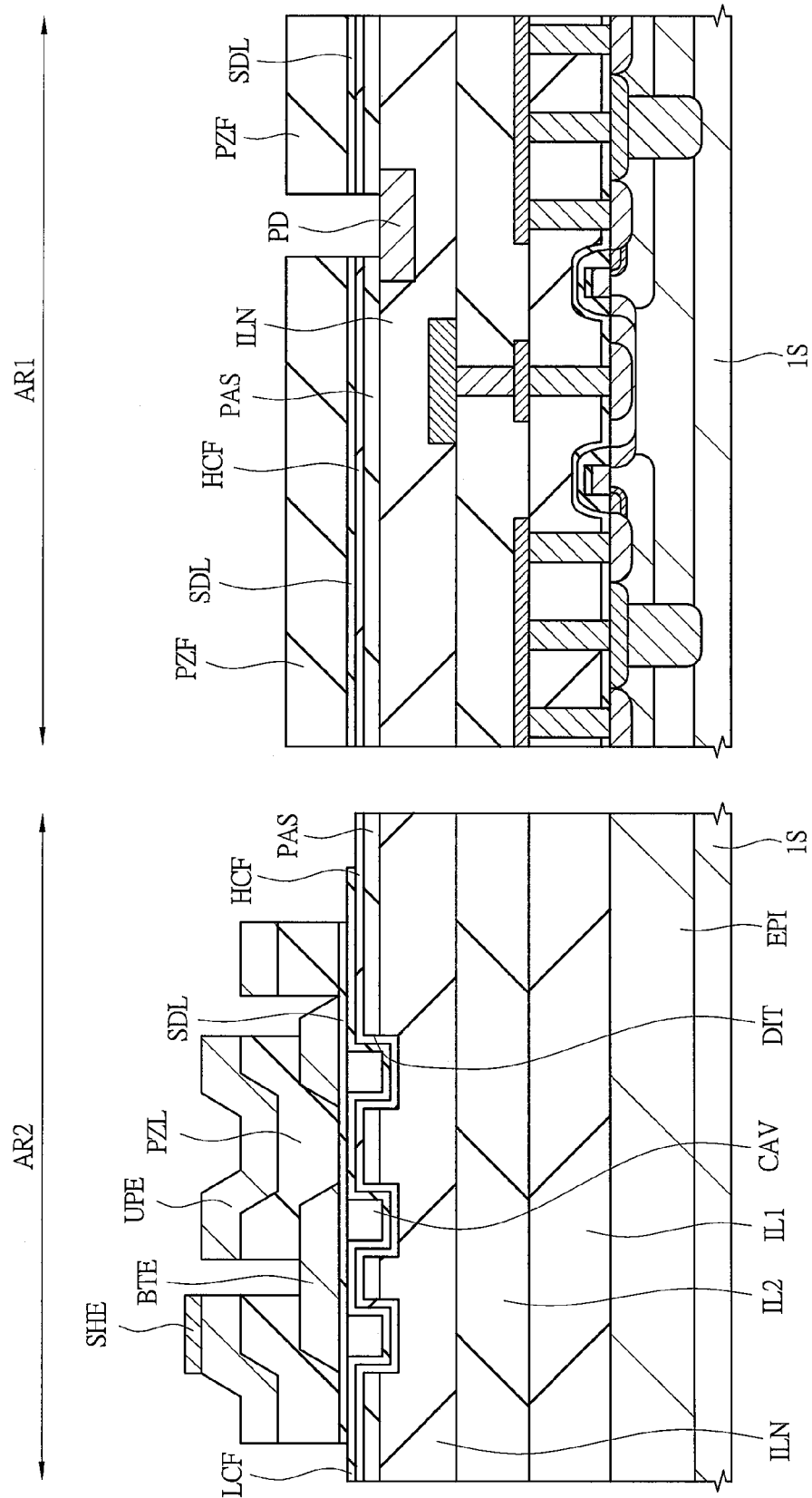
FIG. 31 is a cross-sectional view showing the manufacturing process of the semiconductor device continued from FIG. 30.

Thereafter, as shown in FIG. 31, an opening is formed in the high heat conductivity film HCF and the passivation film PAS formed on the area AR1 by using a photolithography technique and an etching technique. By this means, the surface of the pad PD formed on the area AR1 can be exposed. In this manner, the semiconductor device of the second embodiment is manufactured.

Third Embodiment

In the third embodiment, an example in which an area AR3 is provided between the area AR1 on which the LDMOSFET is formed and the area AR2 on which the thin-film piezoelectric bulk wave resonator BAW is formed and concave and convex shapes are formed on the surface of this area AR3 will be described.

<Device Structure of Semiconductor Device in Third Embodiment>

Figure 32:
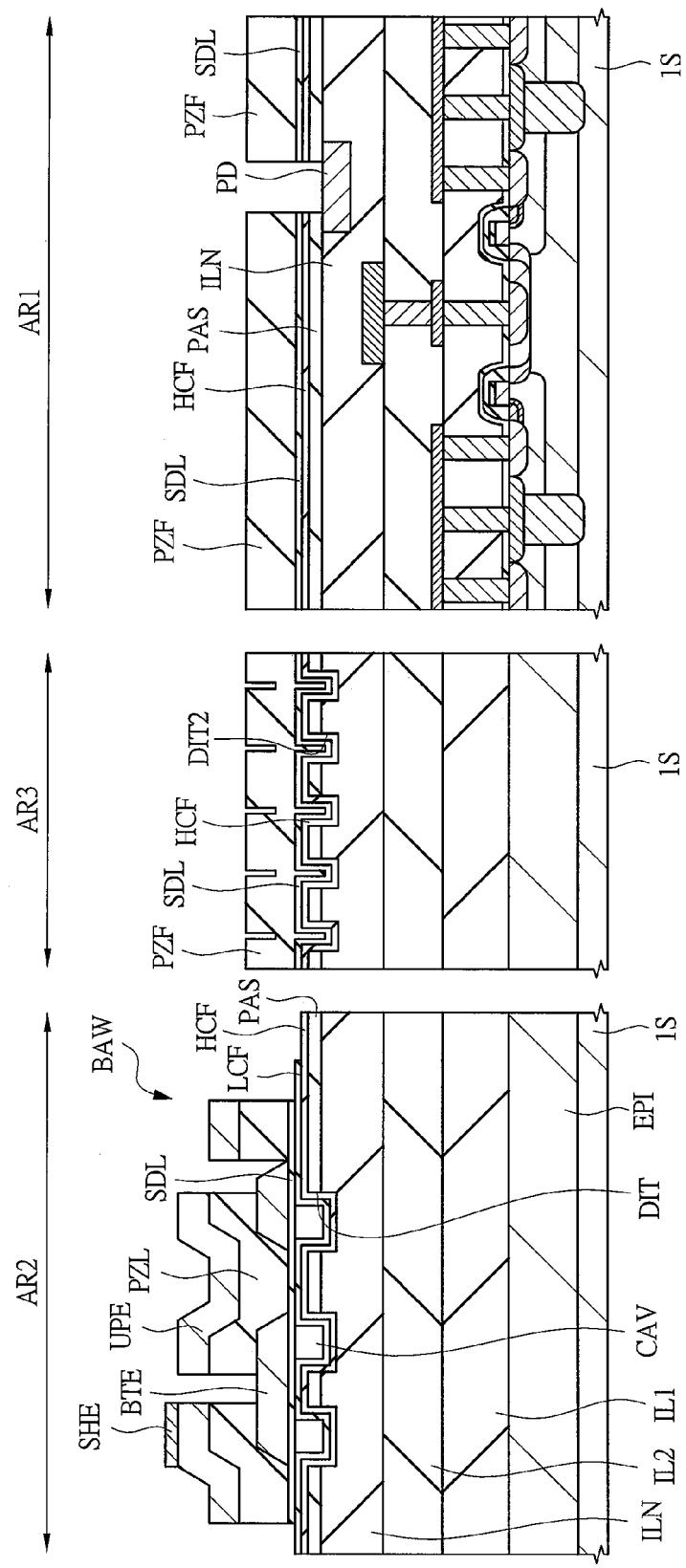
FIG. 32 is a cross-sectional view showing a configuration of a semiconductor device in the third embodiment.

FIG. 32 is a cross-sectional view showing a device structure of a semiconductor device in the third embodiment. FIG. 32 shows structures formed on the area AR1, the area AR2 and the area AR3 of the semiconductor substrate 1S. The area AR1 is an area on which an LDMOSFET constituting a power amplifier PA is formed, and the area AR2 is an area on which a thin-film piezoelectric bulk wave resonator BAW constituting a transmitting filter TXF or a receiving filter RXF is formed. In other words, also in the second embodiment, the LDMOSFET and the thin-film piezoelectric bulk wave resonator BAW are formed on the same semiconductor substrate 1S. Moreover, the area AR3 is formed between the area AR1 and the area AR2. In this case, since the device structure of the LDMOSFET formed on the area AR1 is the same as those of the aforementioned first embodiment and second embodiment, the description thereof will be omitted. Moreover, since the device structure of the thin-film piezoelectric bulk wave resonator BAW formed on the area AR2 is also the same as that of the aforementioned second embodiment, the structure of the area AR3 will be mainly described.

In FIG. 32, on the area AR3 of the semiconductor substrate S1, an epitaxial layer EPI is formed, and an interlayer insulating film IL1 made of, for example, a silicon oxide film is formed on this epitaxial layer EPI. Moreover, on the interlayer insulating film IL1, an interlayer insulating film IL2 made of, for example, a silicon oxide film is formed, and an interlayer insulating film ILN made of, for example, silicon oxide film is formed on this interlayer insulating film IL2. On this interlayer insulating film ILN, a passivation film. PAS made of, for example, silicon nitride film is formed, and grooves DIT2 which extend from the surface of the passivation film PAS to reach the interlayer insulating film ILN are formed. A high heat conductivity film HCF is formed on the surface of the passivation film PAS including the inner walls of the grooves DIT2. More specifically, in the third embodiment, the high heat conductivity film HCF is formed on the entire main surface of the semiconductor substrate 1S including the area AR1, the area R2 and the area AR3. Moreover, on the high heat conductivity film HCF, a seed layer SDL and a piezoelectric film PZF made of, for example, aluminum nitride films are formed.

Here, the characteristic of the third embodiment lies in that a plurality of grooves DIT2 for forming concave and convex shapes on the surface of the passivation film PAS formed on the area AR3 are formed and the high heat conductivity film HCF is formed on the passivation film PAS including the inner walls of the grooves DIT2. The high heat conductivity film HCF extends to the area AR1 on which the LDMOSFET is formed, and the heat generated in the LDMOSFET is transmitted through the high heat conductivity film. HCF to the area AR3. At this time, in the third embodiment, since the surface of the area AR3 has the concave and convex shapes formed by the plurality of grooves DIT2, a surface area of the high heat conductivity film HCF is increased on the area AR3. As a result, the heat dissipation efficiency from the high heat conductivity film HCF formed on the area AR3 is improved (fin effect). In other words, the heat generated in the LDMOSFET is transmitted from the high heat conductivity film HCF formed on the area AR1 to the high heat conductivity film HCF formed on the area AR3, and can be efficiently dissipated by the fin effect on the area AR3. For this reason, in the third embodiment, since it is possible to suppress heat from being transmitted to the thin film piezoelectric bulk wave resonator BAW formed on the area AR2, a temperature rise in the thin-film piezoelectric bulk wave resonator BAW caused by the heat generated in the LDMOSFET formed on the same semiconductor substrate 1S can be suppressed.

Modified Example of Third Embodiment

Figure 33:
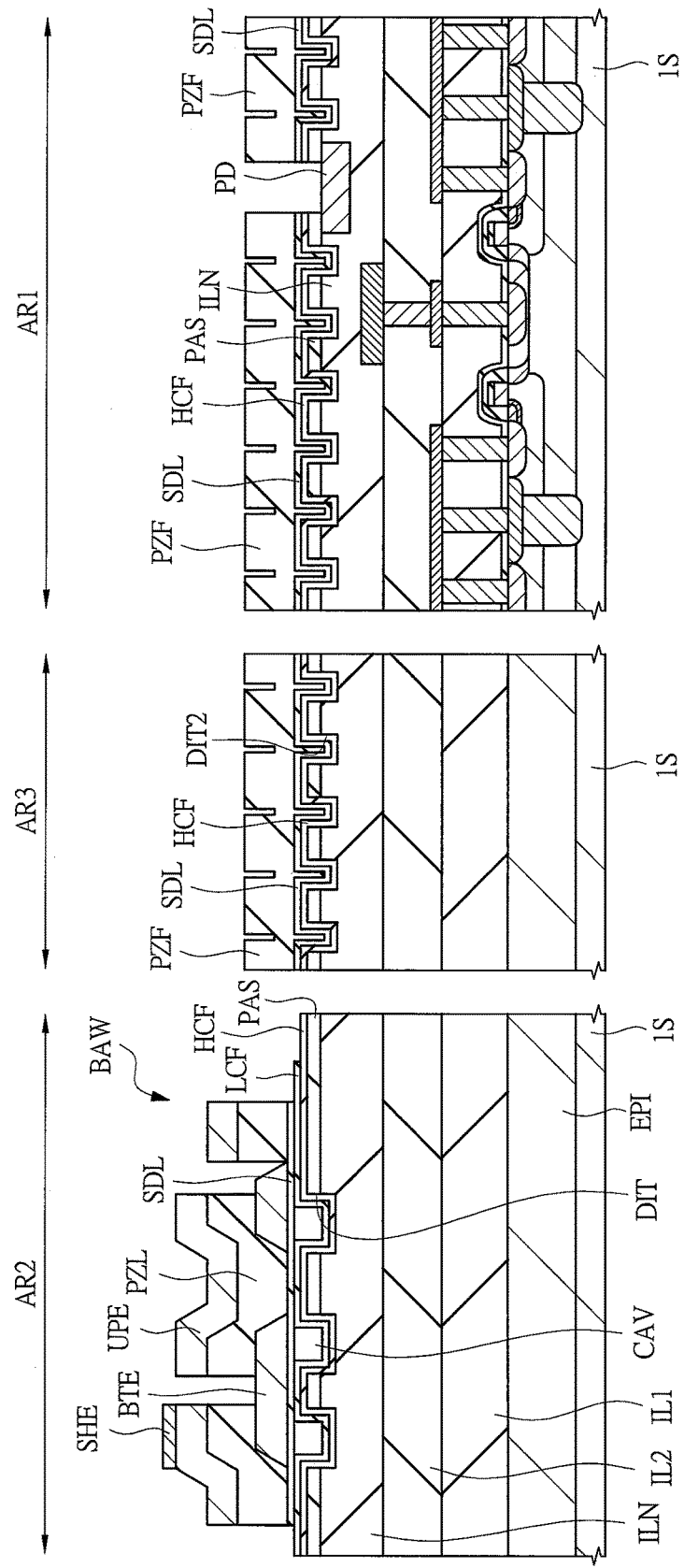
FIG. 33 is a cross-sectional view showing a modified example of a semiconductor device in the third embodiment.

Next, a modified example of the third embodiment will be described. In this modified example, as shown in FIG. 33, a plurality of grooves DIT3 are formed not only on the area AR3, but also on the surface of the area AR1, and concave and convex shapes are formed on the surface of the passivation film PAS formed on the area AR1 by the plurality of grooves DIT3. Moreover, on the area AR1, the high heat conductivity film HCF is formed on the inner wall of each of the plurality of grooves DIT3 formed in the passivation film PAS. In this manner, in this modified example, since it is possible to obtain the fin effect also on the area AR1 in addition to the fin effect on the area AR3, heat generated from the LDMOSFET formed on the area AR1 can be efficiently dissipated from the high heat conductivity film HCF formed on the area AR1 and the area AR3. In particular, in this modified example, since the concave and convex shapes are formed on the surface of the area AR1 on which the LDMOSFET is formed, the heat generated from the LDMOSFET can be sufficiently dissipated.

<Manufacturing Method of Semiconductor Device in Third Embodiment>

Figure 34:
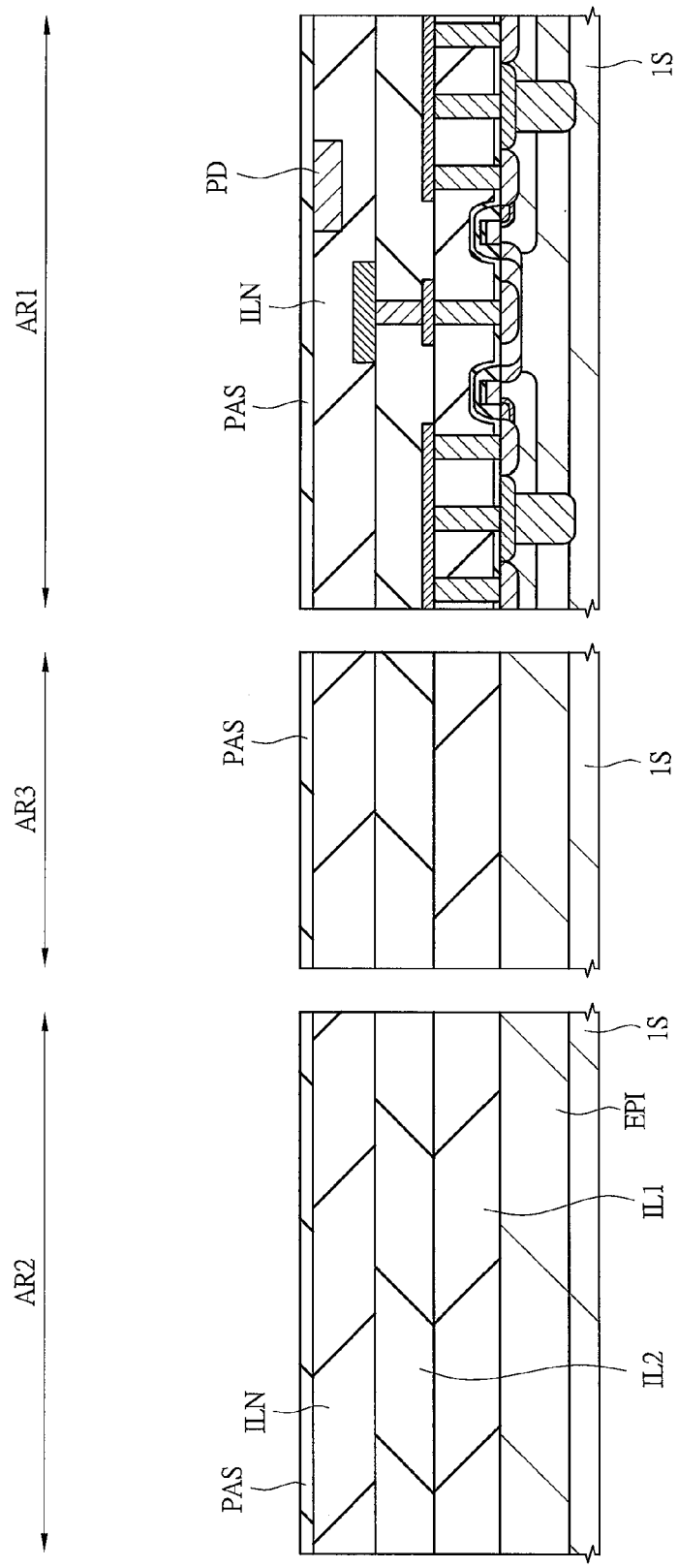
FIG. 34 is a cross-sectional view showing a manufacturing process of the semiconductor device in the third embodiment.

The semiconductor device in the third embodiment is configured as described above, and the manufacturing method thereof will be described below with reference to drawings. First, as shown in FIG. 34, after an epitaxial layer EPI is formed on a semiconductor substrate 1S by using a normal semiconductor manufacturing technique, an LDMOSFET is formed on the area AR1 of the semiconductor substrate 1S. Then, on the entire main surface of the semiconductor substrate 1S including the area AR1 on which the LDMOSFET is formed and the area AR2 on which the thin-film piezoelectric bulk wave resonator BAW is formed, an interlayer insulating film IL1 made of, for example, a silicon oxide film is formed, and a plug electrically connected to the LDMOSFET is formed in the interlayer insulating film IL1 formed on the area AR1. Then, after a first layer wiring made of, for example, an aluminum film is formed on the interlayer insulating film IL1 formed on the area AR1, an interlayer insulating film IL2 made of, for example, a silicon oxide film is formed on the interlayer insulating film IL1 formed on the entire main surface of the semiconductor substrate 1S including the area AR1 and the area AR2. Next, after a plug is formed in the interlayer insulating film IL2 formed on the area AR1, a second layer wiring made of, for example, an aluminum film is formed on the interlayer insulating film IL2 formed on the area AR1. Then, on the interlayer insulating film IL2 formed on the entire main surface of the semiconductor substrate 1S including the area AR1 and the area AR2, an interlayer insulating film ILN made of, for example, a silicon oxide film is formed. Subsequently, after a pad PD is formed on the interlayer insulating film ILN formed on the area AR1, a passivation film PAS made of, for example, a silicon nitride film is formed on the entire main surface of the semiconductor substrate 1S including the area AR1 and the area AR2.

Figure 35:
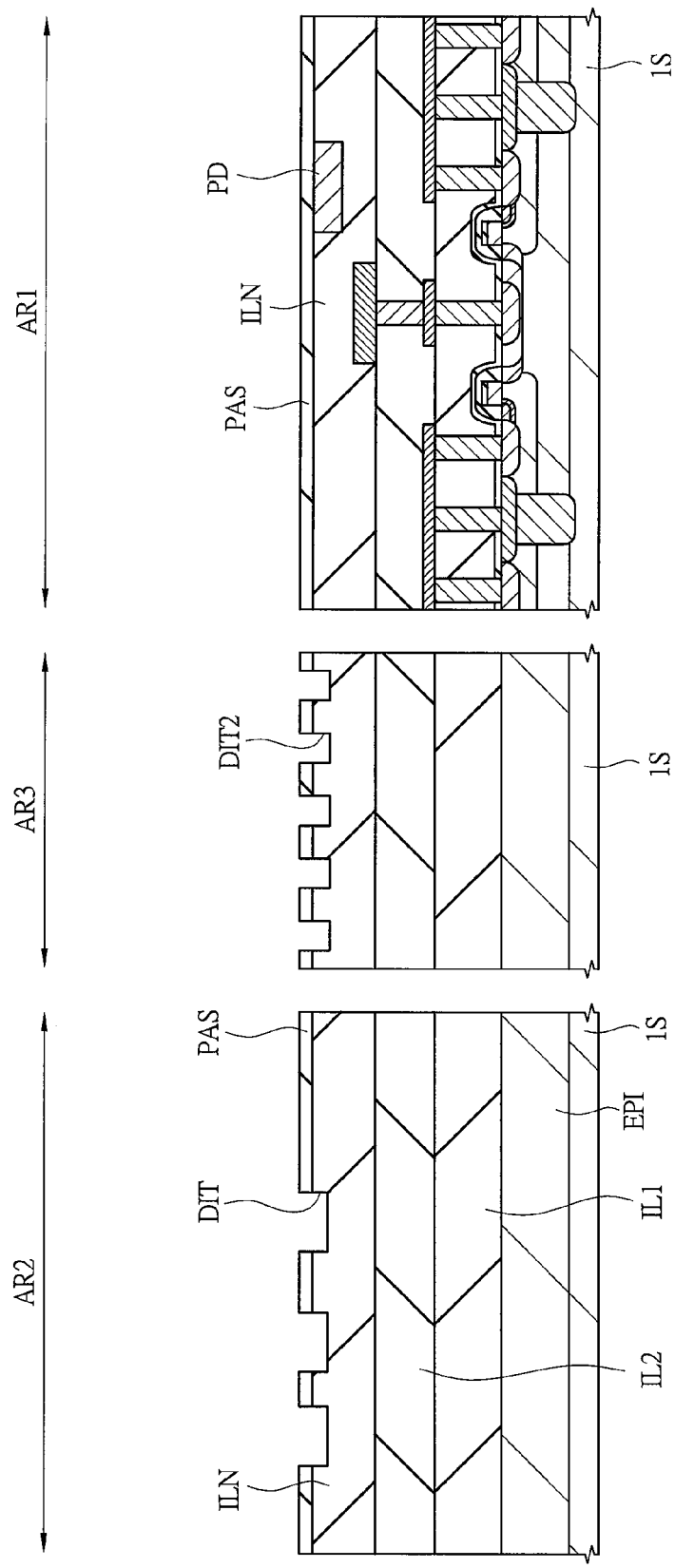
FIG. 35 is a cross-sectional view showing the manufacturing process of the semiconductor device continued from FIG. 34.

Thereafter, as shown in FIG. 35, a plurality of grooves DIT which extend from the passivation film PAS formed on the area AR2 to reach the interlayer insulating film ILN formed as the lower layer are formed by using a photolithography technique and an etching technique. Moreover, in the third embodiment, in this process, a plurality of grooves DIT2 which extend from the surface of the passivation film PAS to reach the interlayer insulating film ILN formed as the lower layer are formed also on the area AR3. At this time, for example, the density of the grooves DIT2 formed in the region AR3 is higher than the density of the grooves DIT formed on the area AR2. In this manner, concave and convex shapes can be formed on the surface of the passivation film PAS formed on the area AR3.

Figure 36:
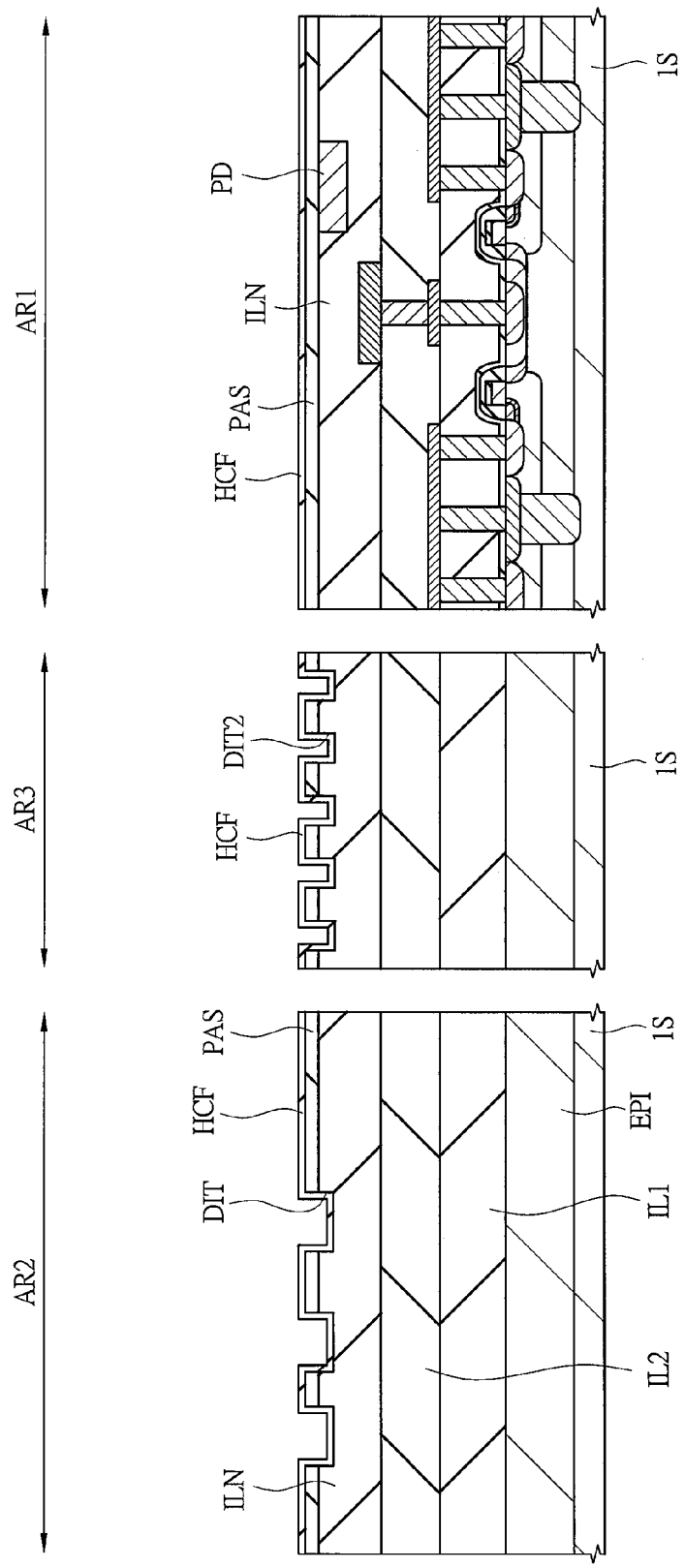
FIG. 36 is a cross-sectional view showing the manufacturing process of the semiconductor device continued from FIG. 35.

Next, as shown in FIG. 36, on the passivation film PAS on which the plurality of grooves DIT and DIT2 are formed, a high heat conductivity film HCF having a heat conductivity higher than that of the interlayer insulating film ILN is formed. More specifically, the high heat conductivity film HCF is formed on the entire main surface of the semiconductor substrate 1S including the passivation film PAS on the area AR2 on which the plurality of grooves DIT are formed and the passivation film PAS formed on the area AR1 over the passivation film. PAS on the area AR3 on which the plurality of grooves DIT2 are formed. At this time, the high heat conductivity film HCF is formed along the inner wall of each of the grooves DIT and the inner wall of each of the grooves DIT2. The high heat conductivity film HCF is made of, for example, a film such as an aluminum nitride film and a magnesium oxide film having a good heat conductivity, and can be formed by using, for example, a sputtering method. In particular, in the case where the high heat conductivity film HCF is made of an aluminum nitride film, the aluminum nitride film can be formed by a reactive sputtering method carried out in an atmosphere containing nitrogen with using aluminum as a target.

Figure 37:
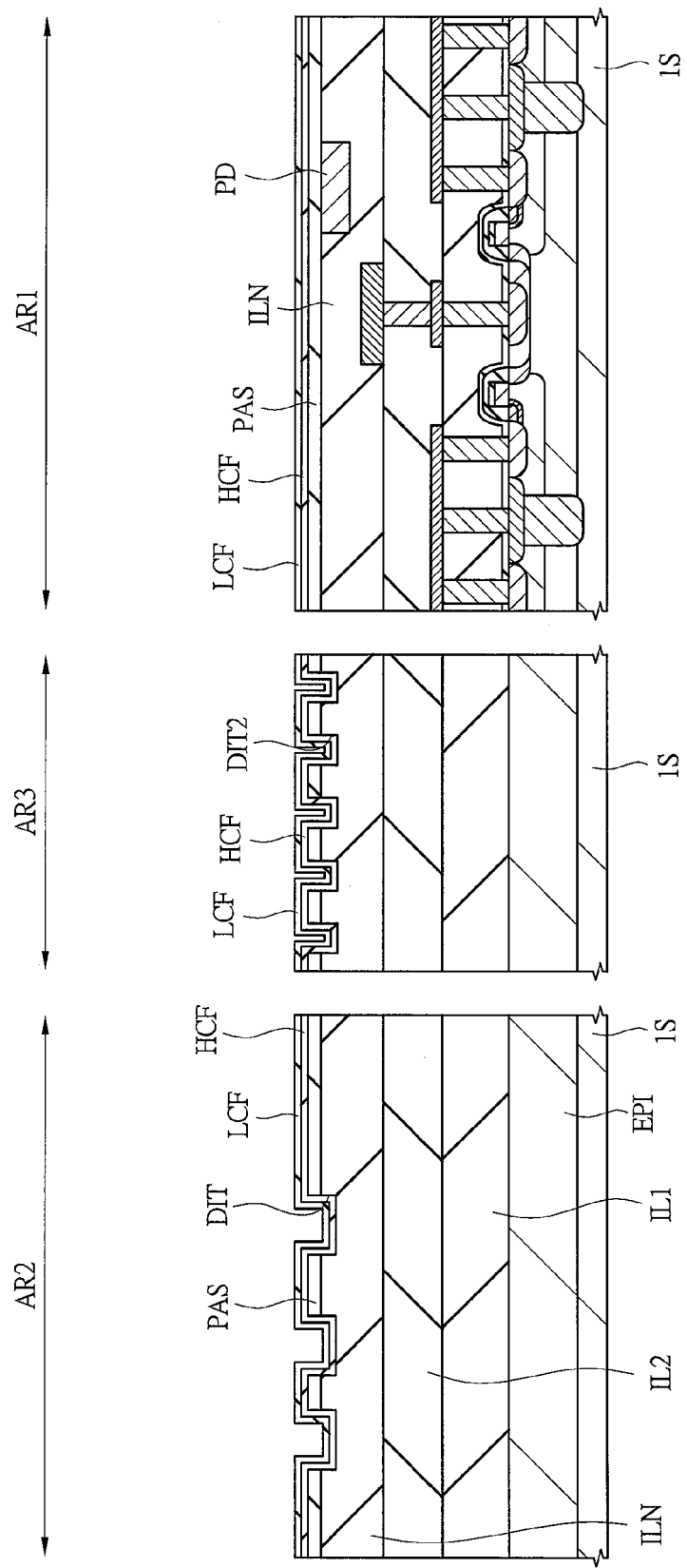
FIG. 37 is a cross-sectional view showing the manufacturing process of the semiconductor device continued from FIG. 36.

Subsequently, as shown in FIG. 37, on the high heat conductivity film HCF formed on the entire main surface of the semiconductor substrate 1S including the area AR1, the area AR2 on which the grooves DIT are formed and the area AR3 on which the grooves DIT2 are formed, a low heat conductivity film LCF having a heat conductivity lower than that of the high heat conductivity film HCF is formed. This low heat conductivity film LCF is made of, for example, a silicon nitride film or an aluminum oxide film, and can be formed by using, for example, a CVD method and a sputtering method.

Figure 38:
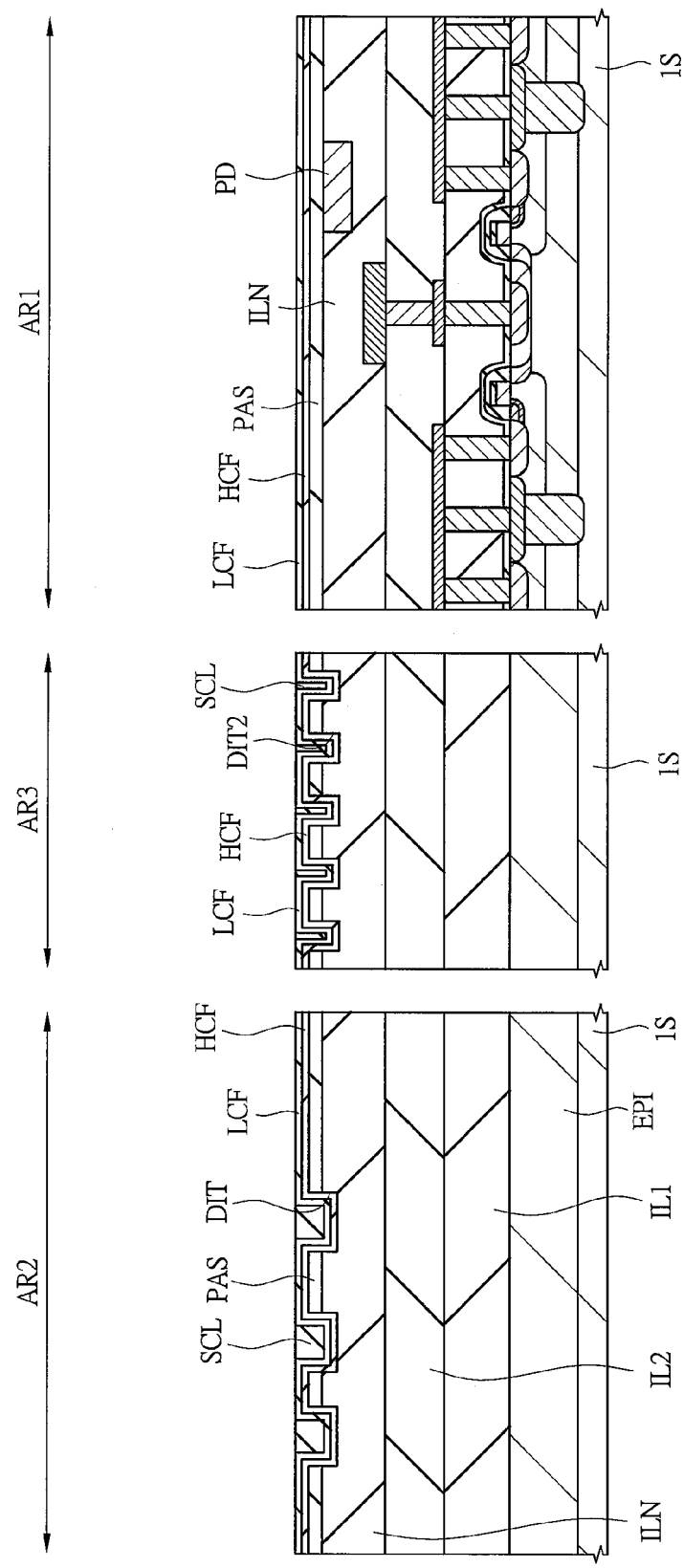
FIG. 38 is a cross-sectional view showing the manufacturing process of the semiconductor device continued from FIG. 37.

Next, as shown in FIG. 38, after a sacrificial layer is formed on the low heat conductivity film LCF including the inside of each of the grooves DIT formed on the area AR2 and the inside of each of the grooves DIT2 formed on the area AR3, the unnecessary sacrificial layer formed on the low heat conductivity film LCF is removed by using, for example, a chemical mechanical polishing method (CMP). In this manner, the sacrificial layer SCL can be buried only inside each of the grooves DIT and each of the grooves DIT2. More specifically, the sacrificial layer SCL is made of, for example, a silicon oxide film. Next, the low heat conductivity film LCF formed on the area AR1 and the area AR3 is removed by using a photolithography technique and an etching technique.

Figure 39:
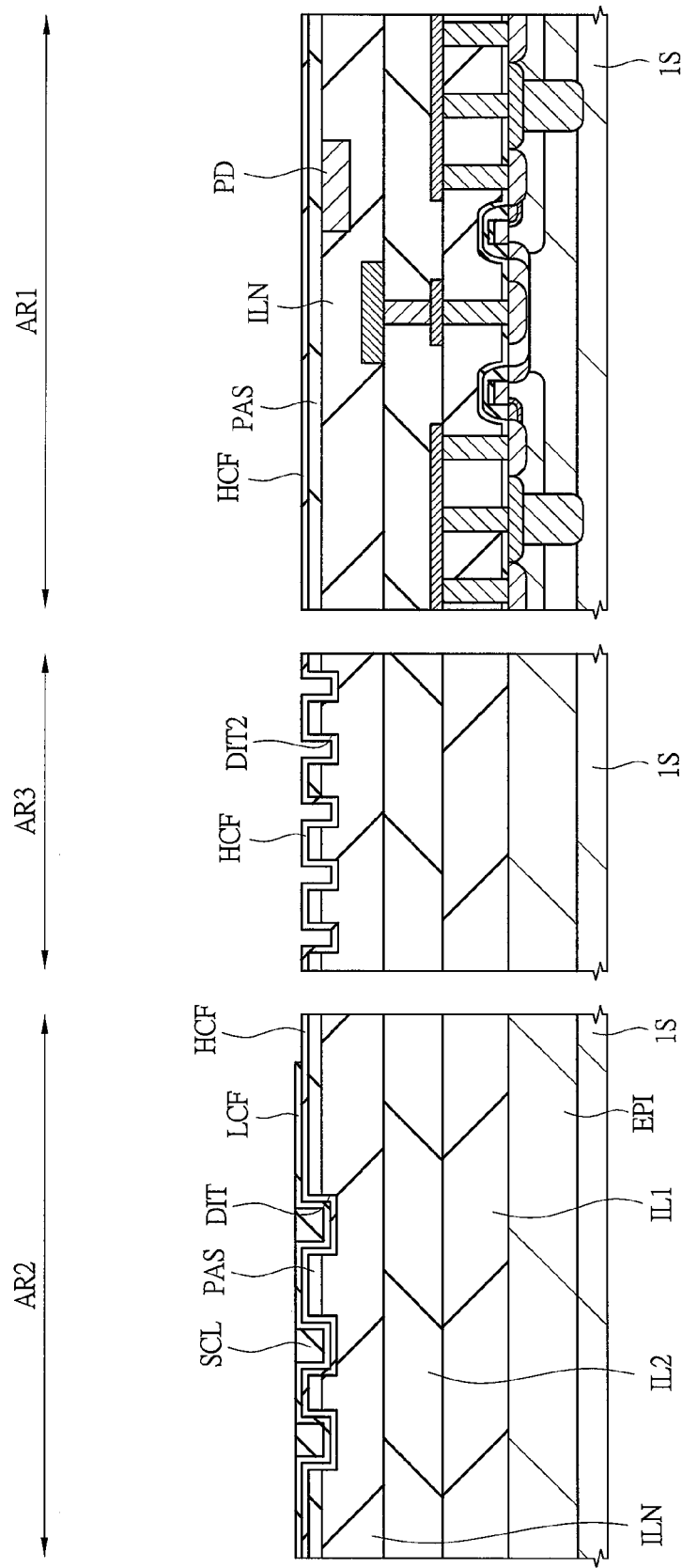
FIG. 39 is a cross-sectional view showing the manufacturing process of the semiconductor device continued from FIG. 38.

Thereafter, as shown in FIG. 39, by using a photolithography technique and an etching technique, the sacrificial layer SCL buried inside each of the grooves DIT2 of the area AR3 is removed by etching by the use of, for example, hydrofluoric acid. At this time, although the interlayer insulating film ILN is made of a silicon oxide film similar to the sacrificial layer SCL, in the third embodiment, the high heat conductivity film HCF which has an etching selectivity relative to a silicon oxide film is formed between the interlayer insulating film ILN and the sacrificial layer SCL.

For this reason, the high heat conductivity film HCF functions as an etching stopper at the time when the sacrificial layer SCL is etched, so that it is possible to protect the interlayer insulating film ILN.

Figure 40:
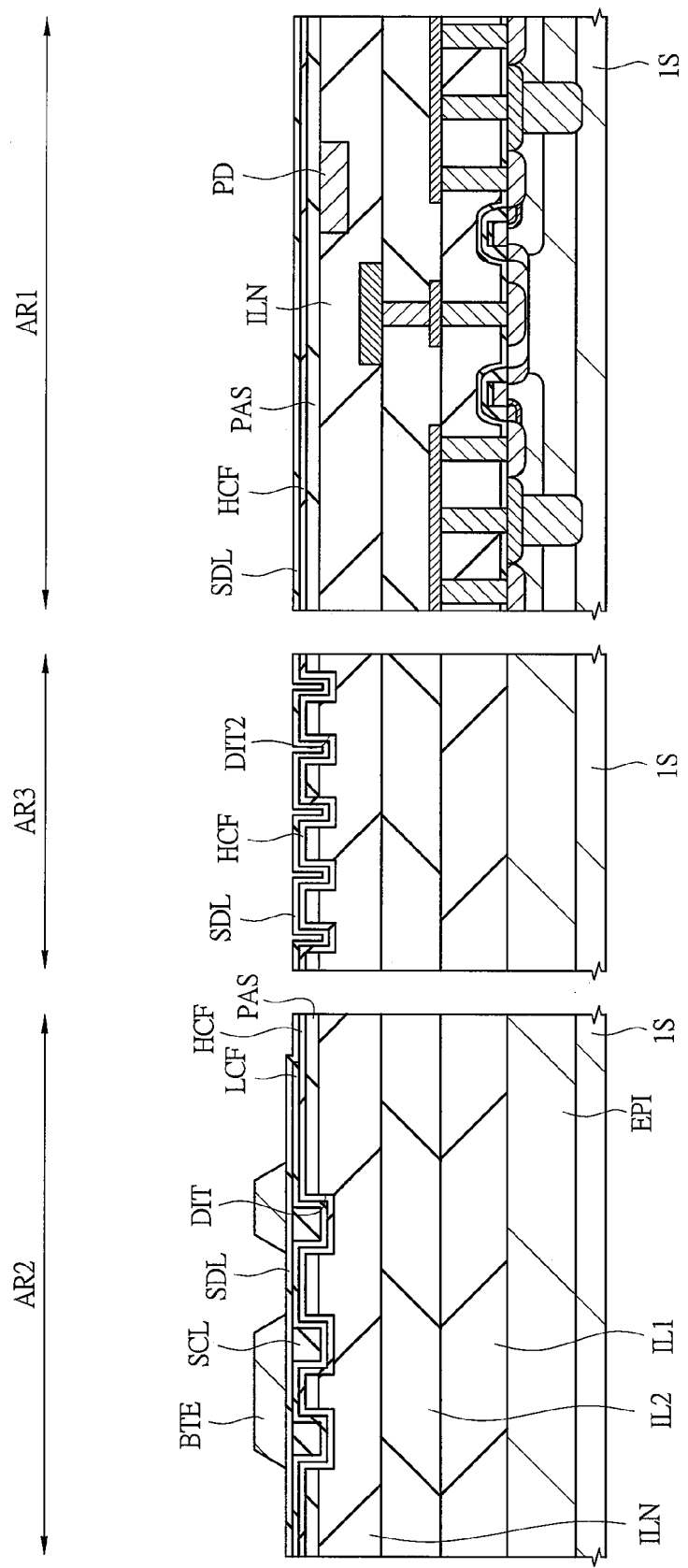
FIG. 40 is a cross-sectional view showing the manufacturing process of the semiconductor device continued from FIG. 39.

Thereafter, as shown in FIG. 40, a seed layer SDL is formed on the entire main surface of the semiconductor substrate 1S over the area AR1 to the area AR3, and a first conductor film is formed on the seed layer SDL. The seed layer SDL is made of, for example, an aluminum nitride film, and can be formed by using, for example, a sputtering method. Moreover, the first conductor film is made of, for example, a molybdenum (Mo) film, and can be formed by using, for example, a sputtering method. Next, by processing the first conductor film by using a photolithography technique and an etching technique, a lower electrode BTE is formed on the area AR2.

Figure 41:
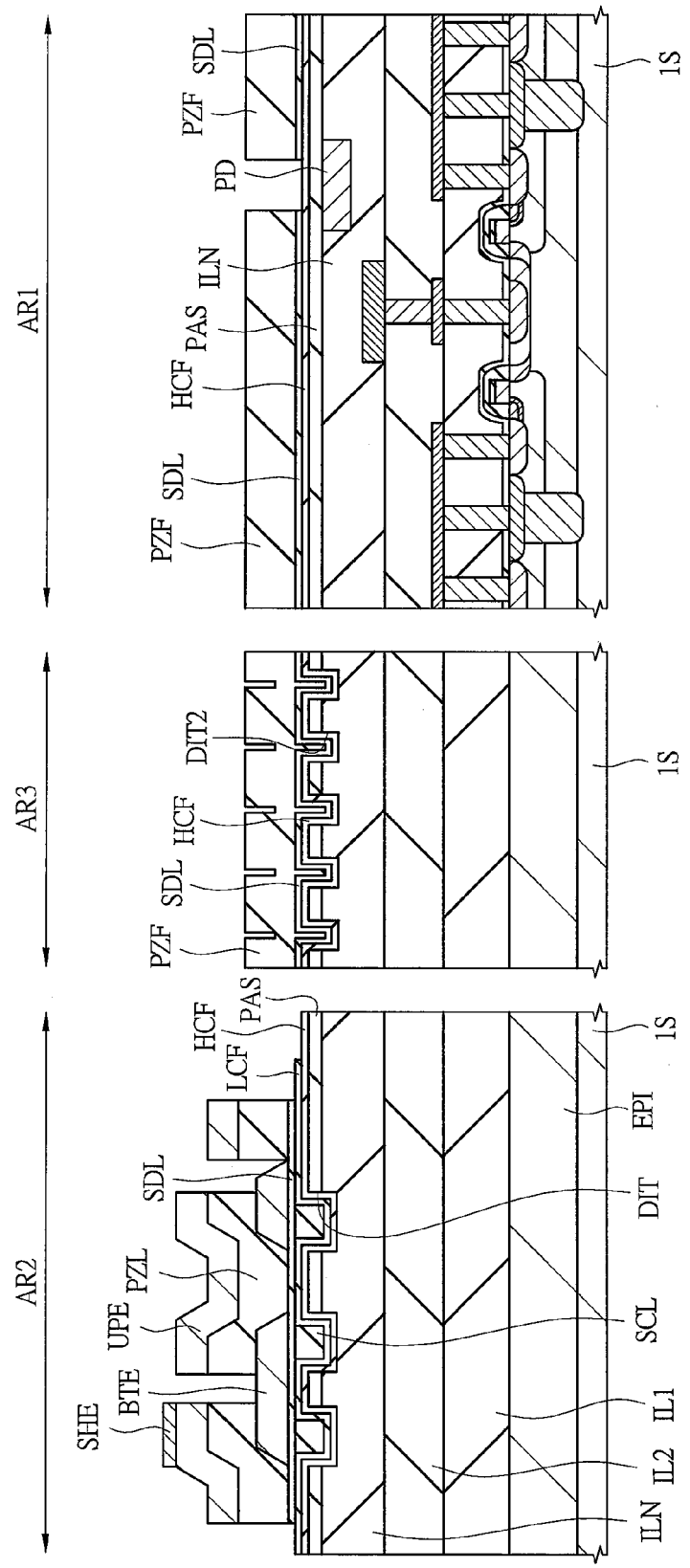
FIG. 41 is a cross-sectional view showing the manufacturing process of the semiconductor device continued from FIG. 40.

Next, as shown in FIG. 41, a piezoelectric film is formed on the entire main surface of the semiconductor substrate 1S over the area AR1, the area AR2 and the area AR3, and a second conductor film is formed on this piezoelectric film. More specifically, the piezoelectric film is made of, for example, an aluminum nitride film, and can be formed by using, for example, a sputtering method. Moreover, the second conductor film is made of, for example, a molybdenum (Mo) film, and can be formed by using, for example, a sputtering method. Subsequently, by processing the second conductor film and the piezoelectric film by using a photolithography technique and an etching technique, an upper electrode UPE made of the second conductor film is formed and a piezoelectric layer PZL made of the piezoelectric film is formed on the area AR2. Moreover, a shunt electrode SHE made of the conductor film is formed. Furthermore, with respect to the area AR1, the piezoelectric film PZF is exposed to the surface by removing the second conductor film, and by the process of processing the piezoelectric film PZF on the area AR2, the piezoelectric film PZF is removed also on an area on which the pad PD of the area AR1 is opened. Note that the seed layer SDL and the piezoelectric film PZF of the area AR1 have the same function as that of the high heat conductivity film HCF.

Figure 42:
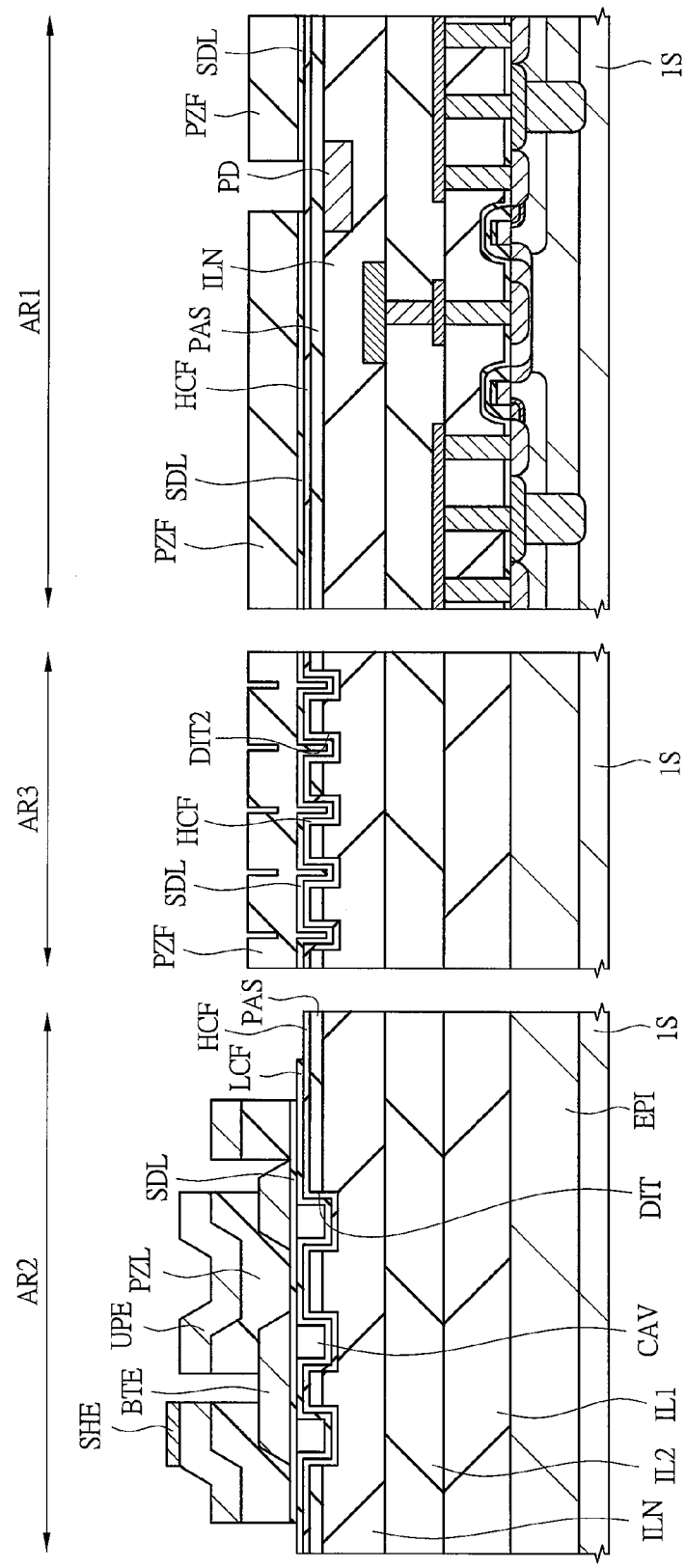
FIG. 42 is a cross-sectional view showing the manufacturing process of the semiconductor device continued from FIG. 41.

Thereafter, as shown in FIG. 42, by removing the sacrificial layer SCL buried in the grooves DIT formed on the area AR2, cavity portions CAV are formed. At this time, for example, the sacrificial layer SCL is made of a silicon oxide film, and the low heat conductivity film LCF is made of, for example, a silicon nitride film or an aluminum oxide film. Therefore, the low heat conductivity film LCF functions as an etching stopper at the time when the sacrificial layer SCL is etched. Moreover, in the third embodiment, the high heat conductivity film HCF made of, for example, an aluminum nitride film is formed as the lower layer of the low heat conductivity film LCF. For this reason, although the interlayer insulating film ILN made of a silicon oxide film similar to that of the sacrificial layer SCL is formed as the lower layer of the high heat conductivity layer HCF, when etching the sacrificial layer SCL, the low heat conductivity film LCF and the high heat conductivity film HCF function as etching stoppers, so that the interlayer insulating film ILN can be protected.

Figure 43:
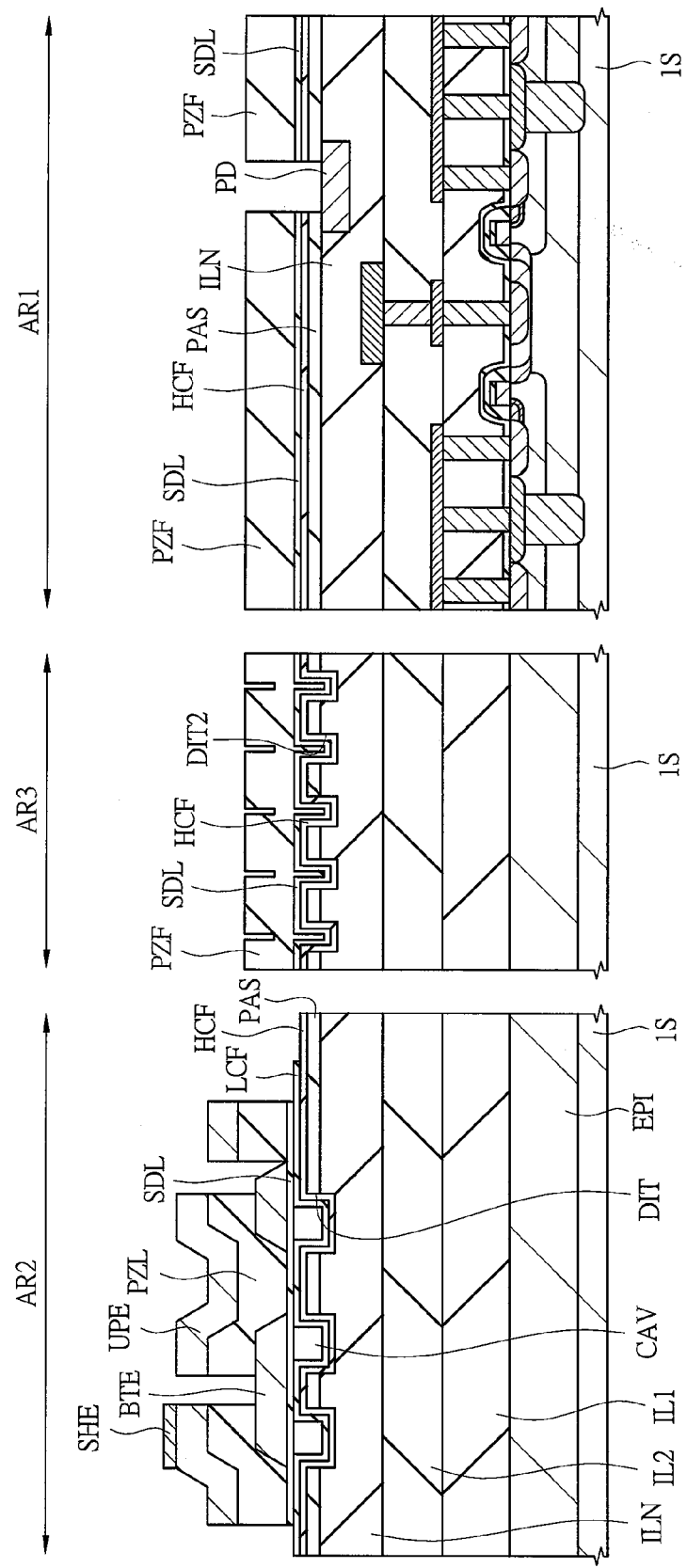
FIG. 43 is a cross-sectional view showing the manufacturing process of the semiconductor device continued from FIG. 42.

Thereafter, as shown in FIG. 43, an opening is formed in the high heat conductivity film HCF and the passivation film PAS formed on the area AR1 by using a photolithography technique and an etching technique. By this means, the surface of the pad PD formed on the area AR1 can be exposed. In this manner, the semiconductor device of the third embodiment is manufactured.

Fourth Embodiment

In the fourth embodiment, an example in which a heat-dissipation plug that penetrates the passivation film PAS to reach the semiconductor substrate 1S is formed in an area AR0 surrounding the area AR1 on which the LDMOSFET is formed will be described.

<Device Structure of Semiconductor Device in Fourth Embodiment>

Figure 44:
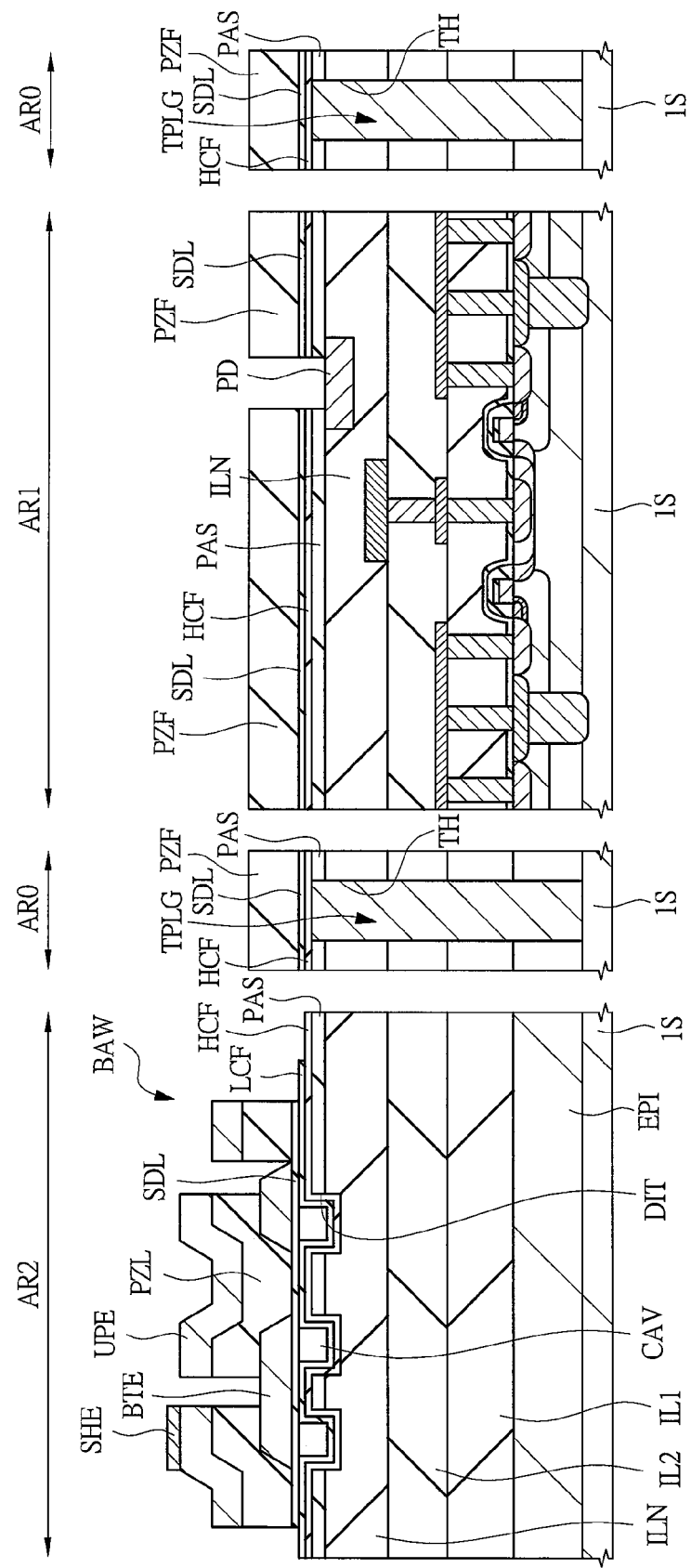
FIG. 44 is a cross-sectional view showing a configuration of a semiconductor device in the fourth embodiment.

FIG. 44 is a cross-sectional view showing a device structure of a semiconductor device in the fourth embodiment. FIG. 44 shows the structures of the area AR1, the area AR2 and the area AR0 corresponding to a peripheral area of the area AR1 of the semiconductor substrate 1S. The area AR1 is an area on which an LDMOSFET constituting a power amplifier PA is formed and the area AR2 is an area on which a thin-film piezoelectric bulk wave resonator BAW constituting a transmitting filter TXF or a receiving filter RXF is formed. In other words, also in the fourth embodiment, the LDMOSFET and the thin-film piezoelectric bulk wave resonator BAW are formed on the same semiconductor substrate 1S. Moreover, the area AR0 is formed in a peripheral area surrounding the area AR1. In this case, since the device structure of the LDMOSFET formed on the area AR1 is the same as those of the aforementioned first to third embodiments, the description thereof will be omitted. Moreover, since the device structure of the thin-film piezoelectric bulk wave resonator BAW formed on the area AR2 is also the same as those of the aforementioned second embodiment and third embodiment, the structure of the area AR0 will be mainly described.

In FIG. 44, on the area AR0 of the semiconductor substrate 1S, an epitaxial layer EPI is formed, and an interlayer insulating film IL1 made of, for example, a silicon oxide film is formed on this epitaxial layer EPI. Moreover, on the interlayer insulating film IL1, an interlayer insulating film IL2 made of, for example, a silicon oxide film is formed, and an interlayer insulating film ILN made of, for example, a silicon oxide film is formed on this interlayer insulating film IL2. On this interlayer insulating film ILN, a passivation film PAS made of, for example, a silicon nitride film is formed, and a through groove TH which extends from the surface of the passivation film PAS to reach the semiconductor substrate 1S is formed. Moreover, a conductive material is buried in this through groove TH, thereby forming a heat-dissipation plug TPLG. On the passivation film PAS in which the heat-dissipation plug TPLG is formed, a high heat conductivity film HCF is formed. Furthermore, on the high heat conductivity film HCF, a seed layer SDL and a piezoelectric film PZF made of, for example, aluminum nitride films are formed.

The characteristic of the fourth embodiment lies in that the heat-dissipation plug TPLG is formed in the area AR0 formed on the periphery of the area AR1 on which the LDMOSFET is formed. More specifically, in the fourth embodiment, the heat-dissipation plug TPLG which extends from the passivation film PAS formed on the area AR0 to reach the semiconductor substrate 1S is formed. Also, the heat-dissipation plug TPLG is directly in contact with the high heat conductivity film HCF at its upper portion. Accordingly, heat generated in the LDMOSFET is transmitted from the high heat conductivity film HCF formed on the area AR1 to the high heat conductivity film HCF formed on the area AR0. Thereafter, a part of the heat transmitted to the high heat conductivity film HCF formed on the area AR0 is dissipated from the semiconductor substrate 1S through the heat-dissipation plug TPLG that is directly in contact with the high heat conductivity film HCF. Therefore, in the fourth embodiment, since the heat-dissipation plug TPLG is provided in the area AR0 adjacent to the area AR1, heat can be efficiently dissipated from this heat-dissipation plug TPLG. More specifically, in the fourth embodiment, a part of the heat is dissipated from the heat-dissipation plug TPLG before the heat generated in the LDMOSFET reaches the thin-film piezoelectric bulk wave resonator BAW formed on the area AR2. Therefore, it is possible to suppress a temperature rise of the thin-film piezoelectric bulk wave resonator BAW caused by the heat generated in the LDMOSFET formed on the same semiconductor substrate 1S.

In particular, since the heat-dissipation plug TPLG in the fourth embodiment is formed by burying a metal film having a comparatively high heat conductivity made of, for example, tungsten (W) in the through groove TH, it is possible to improve the heat dissipation efficiency from the heat-dissipation plug TPLG.

<Manufacturing Method of Semiconductor Device in Fourth Embodiment>

Figure 45:
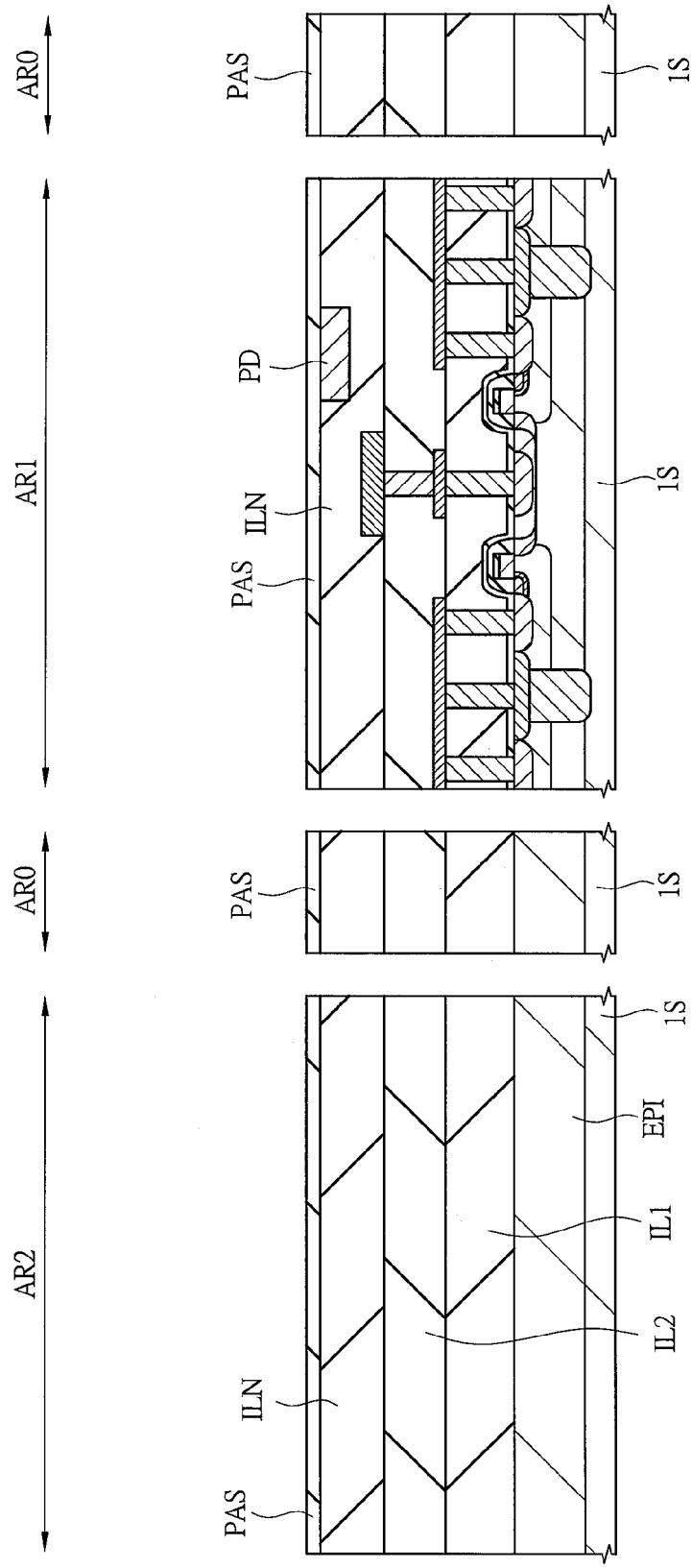
FIG. 45 is a cross-sectional view showing a manufacturing process of the semiconductor device in the fourth embodiment.

The semiconductor device in the fourth embodiment is configured as described above, and the manufacturing method thereof will be described with reference to drawings. First, as shown in FIG. 45, after an epitaxial layer EPI is formed on a semiconductor substrate 1S by using a normal semiconductor manufacturing technique, an LDMOSFET is formed on the area AR1 of the semiconductor substrate 1S. Then, over the entire main surface of the semiconductor substrate 1S including the area AR1 on which the LDMOSFET is formed, the area AR2 on which a thin-film piezoelectric bulk wave resonator BAW is formed and the area AR0 adjacent to the area AR1, an interlayer insulating film IL1 made of, for example, a silicon oxide film is formed, and a plug electrically connected to the LDMOSFET is formed in the interlayer insulating film IL1 formed on the area AR1. Then, after a first layer wiring made of, for example, an aluminum film is formed on the interlayer insulating film IL1 formed on the area AR1, an interlayer insulating film IL2 made of, for example, a silicon oxide film is formed on the interlayer insulating film IL1 formed on the entire main surface of the semiconductor substrate 1S including the area AR1 and the area AR2. Next, after a plug is formed in the interlayer insulating film IL2 formed on the area AR1, a second layer wiring made of, for example, an aluminum film is formed on the interlayer insulating film IL2 formed on the area AR1. Moreover, on the interlayer insulating film IL2 formed on the entire main surface of the semiconductor substrate 1S including the area AR1 and the area AR2, an interlayer insulating film ILN made of, for example, a silicon oxide film is formed. Subsequently, after a pad PD is formed on the interlayer insulating film ILN formed on the area AR1, a passivation film PAS made of, for example, a silicon nitride film is formed on the entire main surface of the semiconductor substrate 1S including the area AR1, the area AR2 and the area AR0.

Figure 46:
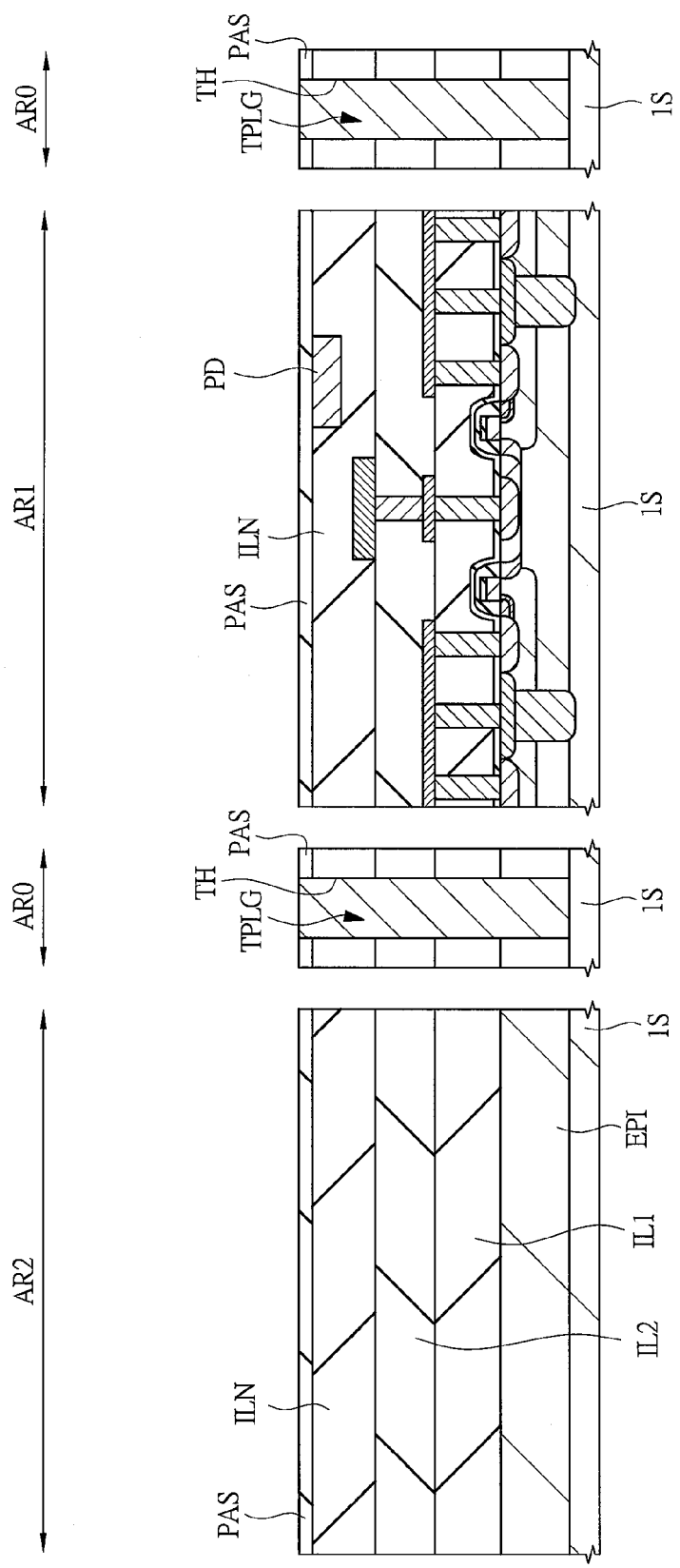
FIG. 46 is a cross-sectional view showing the manufacturing process of the semiconductor device continued from FIG. 45.

Next, as shown in FIG. 46, a through groove TH which extends from the surface of the passivation film PAS formed on the area AR0 to reach the semiconductor substrate 1S is formed by using a photolithography technique and an etching technique. Then, a metal film made of, for example, a tungsten film is formed on the surface of the passivation film PAS in which the through groove TH is formed. At this time, the metal film is formed so as to be buried also inside the through groove TH. Thereafter, the unnecessary metal film formed on the passivation film PAS is removed by using, for example, the CMP method. In this manner, it is possible to form the heat-dissipation plug TPLG obtained by burying the metal film only inside the through groove TH.

Figure 47:
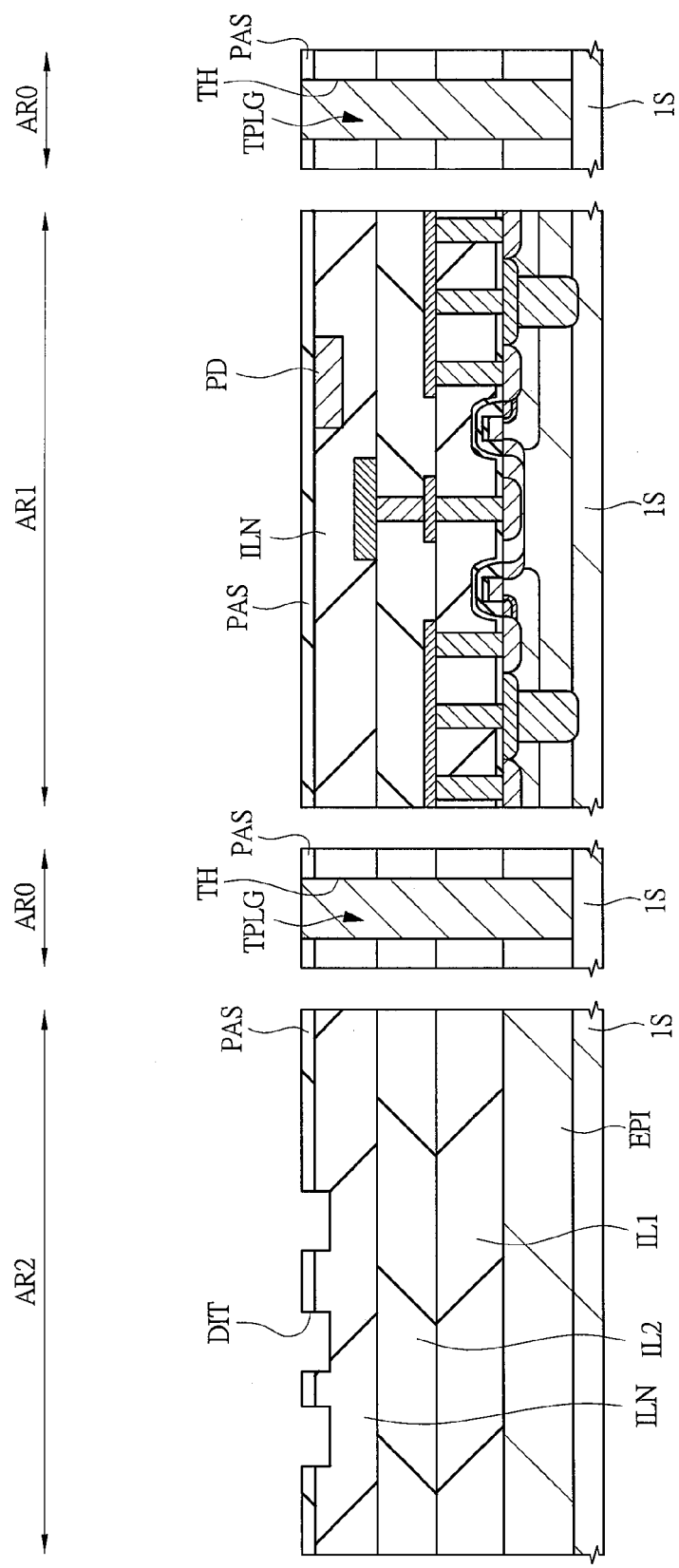
FIG. 47 is a cross-sectional view showing the manufacturing process of the semiconductor device continued from FIG. 46.

Thereafter, as shown in FIG. 47, a plurality of grooves DIT which extend from the passivation film PAS formed on the area AR2 to reach the interlayer insulating film ILN formed as the lower layer are formed by using a photolithography technique and an etching technique.

Figure 48:
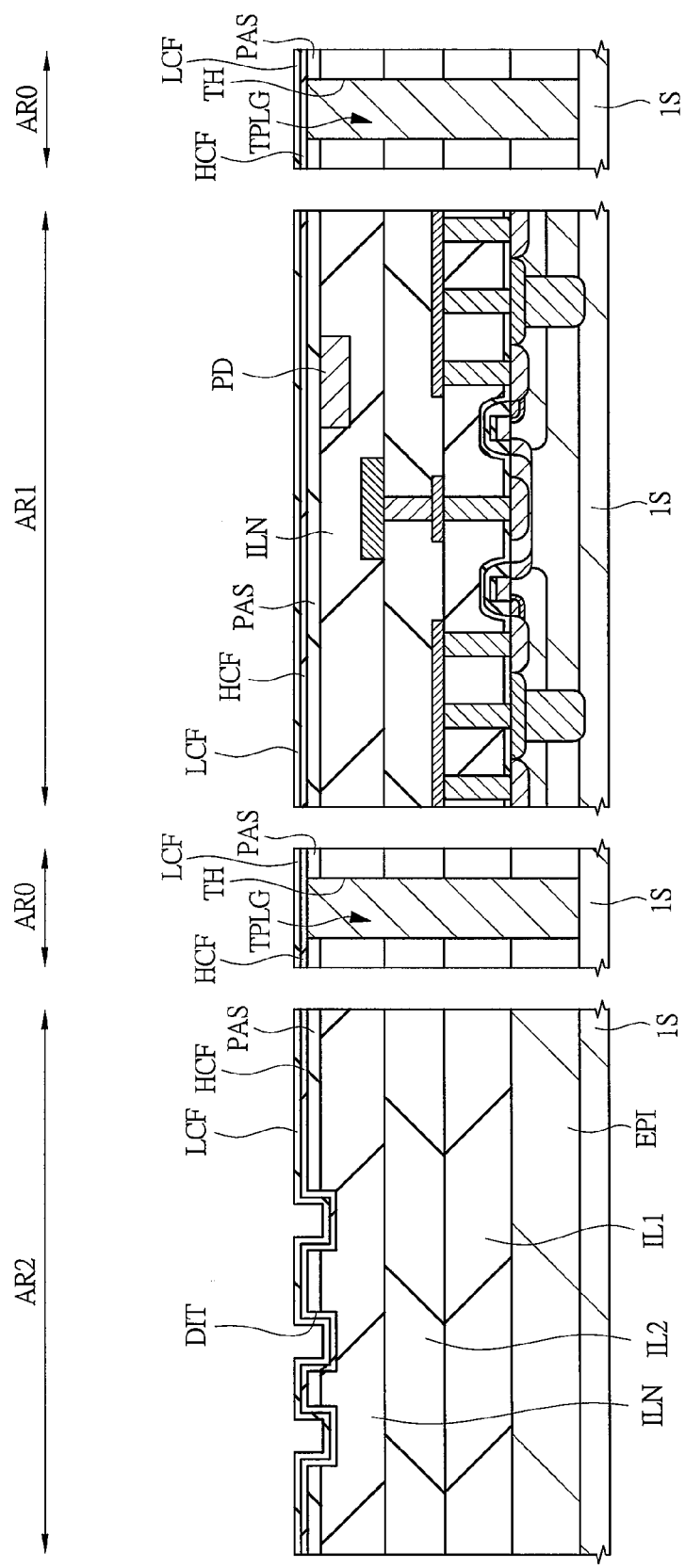
FIG. 48 is a cross-sectional view showing the manufacturing process of the semiconductor device continued from FIG. 47.

Next, as shown in FIG. 48, on the passivation film PAS in which the plurality of grooves DIT are formed, a high heat conductivity film HCF having a heat conductivity higher than that of the interlayer insulating film ILN is formed. More specifically, the high heat conductivity film HCF is formed on the entire main surface of the semiconductor substrate 1S from the passivation film PAS on the area AR2 on which the plurality of grooves DIT are formed to the passivation film PAS formed on the area AR1 through the passivation film PAS formed on the area AR0. At this time, the high heat conductivity film HCF is formed along the inner wall of each of the grooves DIT. The high heat conductivity film HCF is made of, for example, a film such as an aluminum nitride film and a magnesium oxide film having a good heat conductivity, and can be formed by using, for example, a sputtering method. In particular, in the case where the high heat conductivity film HCF is made of an aluminum nitride film, the aluminum nitride film can be formed by a reactive sputtering method carried out in an atmosphere containing nitrogen with using aluminum as a target.

Subsequently, on the high heat conductivity film HCF formed on the entire main surface of the semiconductor substrate 1S including the area AR1, the area AR2 on which the grooves DIT are formed and the area AR0 adjacent to the area AR1, a low heat conductivity film LCF having a heat conductivity lower than that of the high heat conductivity film HCF is formed. This low heat conductivity film LCF is made of, for example, a silicon nitride film or an aluminum oxide film, and can be formed by using, for example, a CVD method and a sputtering method.

Figure 49:
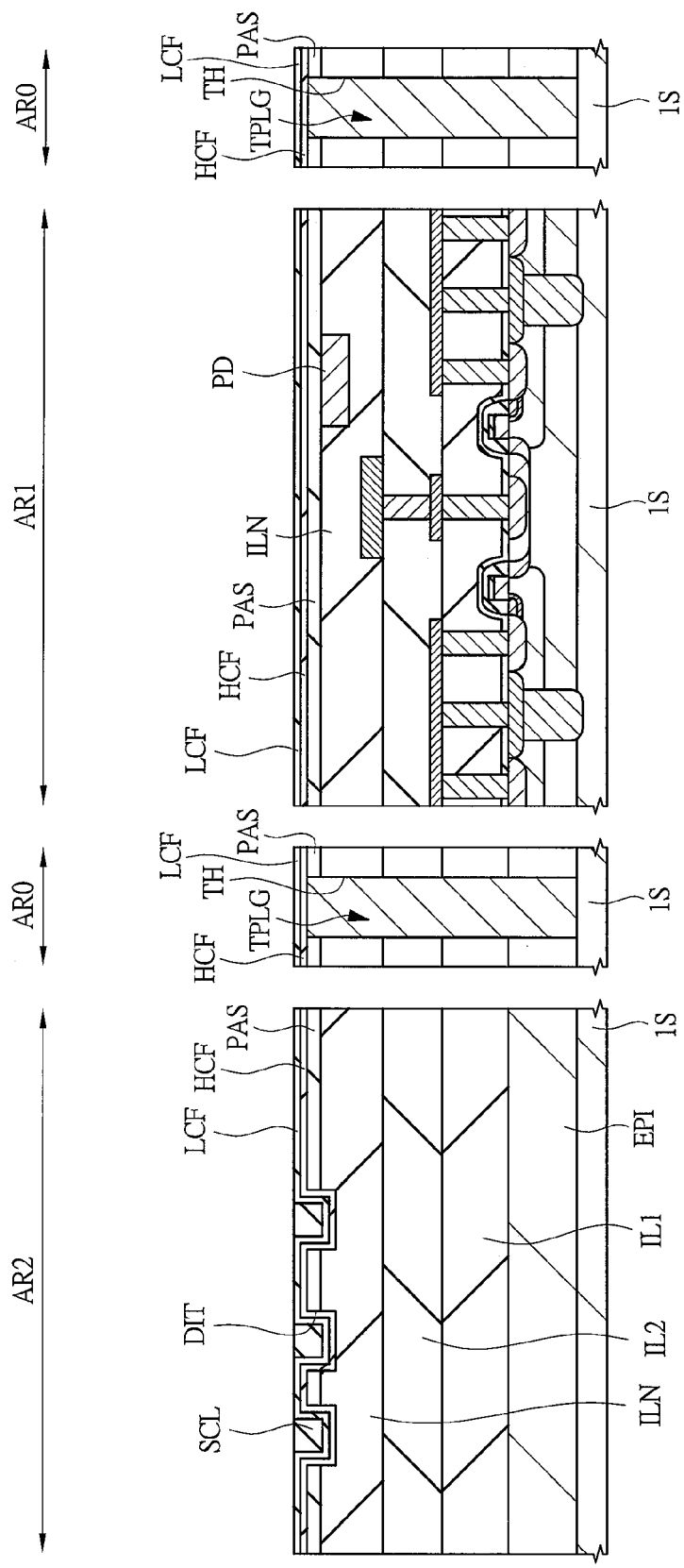
FIG. 49 is a cross-sectional view showing the manufacturing process of the semiconductor device continued from FIG. 48.

Moreover, as shown in FIG. 49, after a sacrificial layer is formed on the low heat conductivity film LCF including the inside of each of the grooves DIT formed on the area AR2, the unnecessary sacrificial layer formed on the low heat conductivity film LCF is removed by using, for example, a chemical mechanical polishing (CMP) method. In this manner, the sacrificial layer SCL can be buried only inside each of the grooves DIT. More specifically, the sacrificial layer SCL is made of, for example, a silicon oxide film.

Figure 50:
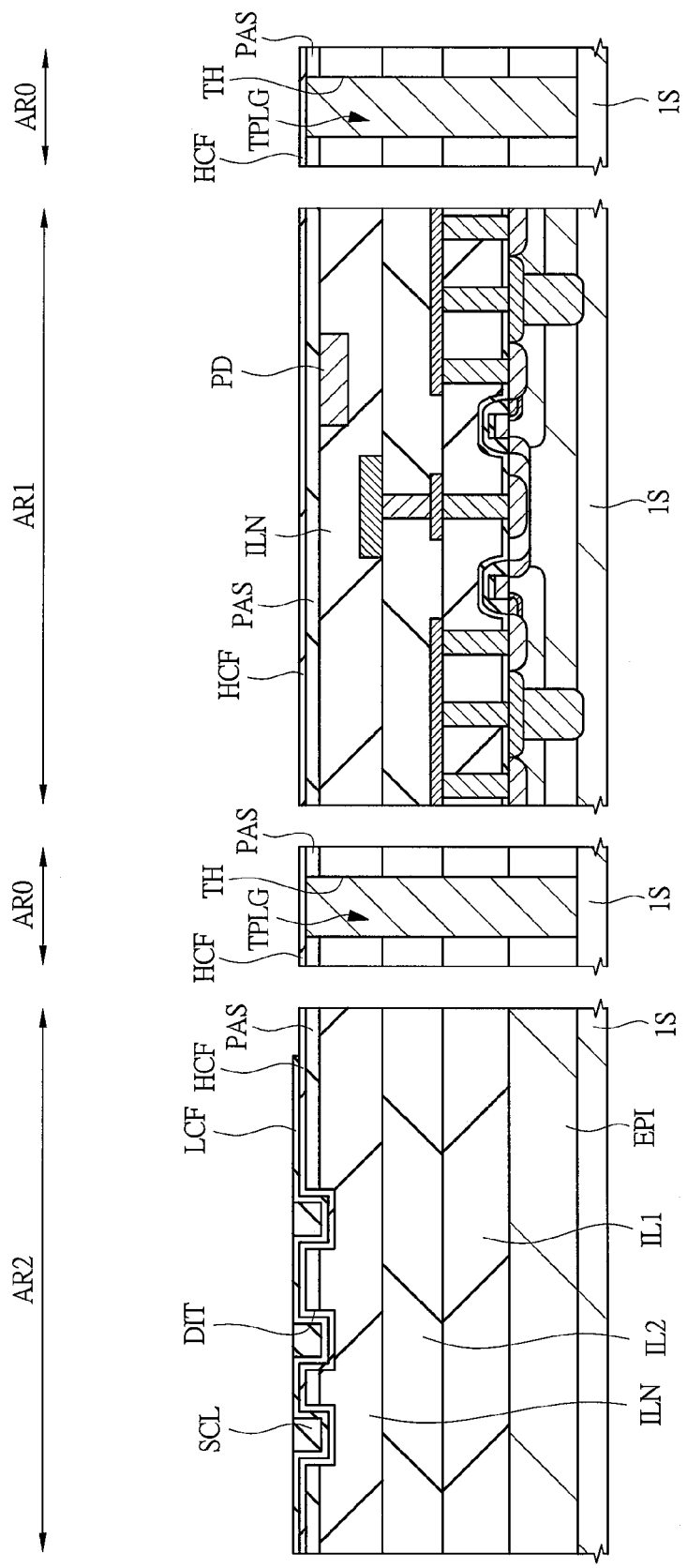
FIG. 50 is a cross-sectional view showing the manufacturing process of the semiconductor device continued from FIG. 49.

Next, as shown in FIG. 50, the low heat conductivity film LCF formed on the area AR1 and the area AR3 is removed by using a photolithography technique and an etching technique.

Figure 51:
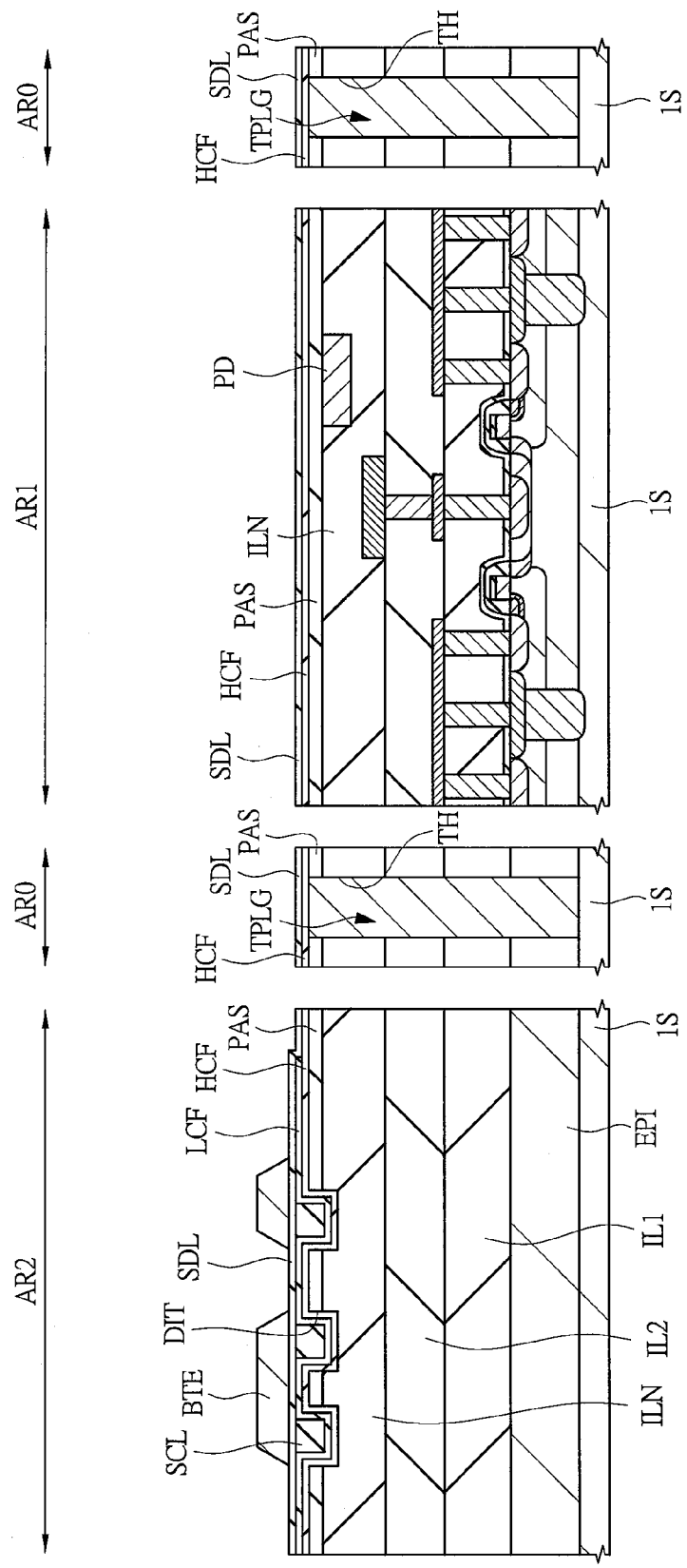
FIG. 51 is a cross-sectional view showing the manufacturing process of the semiconductor device continued from FIG. 50.

Then, as shown in FIG. 51, a seed layer SDL is formed on the entire main surface of the semiconductor substrate 1S over the area AR0, the area AR1 and the area AR2, and a first conductor film is formed on this seed layer SDL. The seed layer SDL is made of, for example, an aluminum nitride film, and can be formed by using, for example, a sputtering method. Moreover, the first conductor film is made of, for example, a molybdenum (Mo) film, and can be formed by using, for example, a sputtering method. Next, by processing the first conductor film by using a photolithography technique and an etching technique, a lower electrode BTE is formed on the area AR2.

Figure 52:
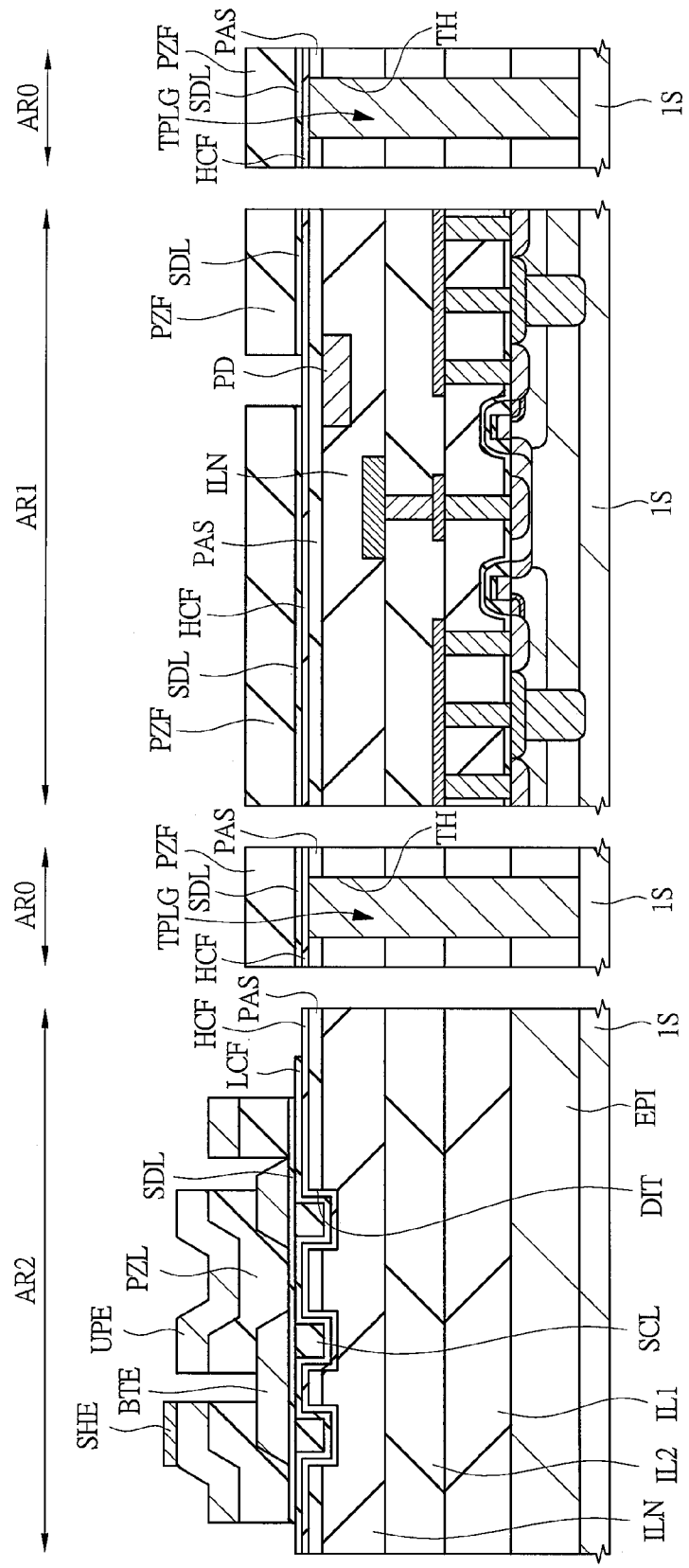
FIG. 52 is a cross-sectional view showing the manufacturing process of the semiconductor device continued from FIG. 51.

Next, as shown in FIG. 52, a piezoelectric film is formed on the entire main surface of the semiconductor substrate 1S over the area AR0, the area AR1 and the area AR2, and a second conductor film is formed on this piezoelectric film. More specifically, the piezoelectric film is made of, for example, an aluminum nitride film, and can be formed by using, for example, a sputtering method. Also, the second conductor film is made of, for example, a molybdenum (Mo) film, and can be formed by using, for example, a sputtering method. Subsequently, by processing the second conductor film and the piezoelectric film by using a photolithography technique and an etching technique, an upper electrode UPE made of the second conductor film is formed and the piezoelectric layer PZL made of the piezoelectric film is formed on the area AR2. Moreover, a shunt electrode SHE made of a conductor film is formed. Furthermore, with respect to the area AR1, the piezoelectric film PZF is exposed to the surface by removing the second conductor film, and by the process of processing the piezoelectric film PZF on the area AR2, the piezoelectric film PZF is removed also on an area on which the pad PD of the area AR1 is opened. Note that the seed layer SDL and the piezoelectric film PZF of the area AR1 have the same function as that of the high heat conductivity film HCF.

Figure 53:
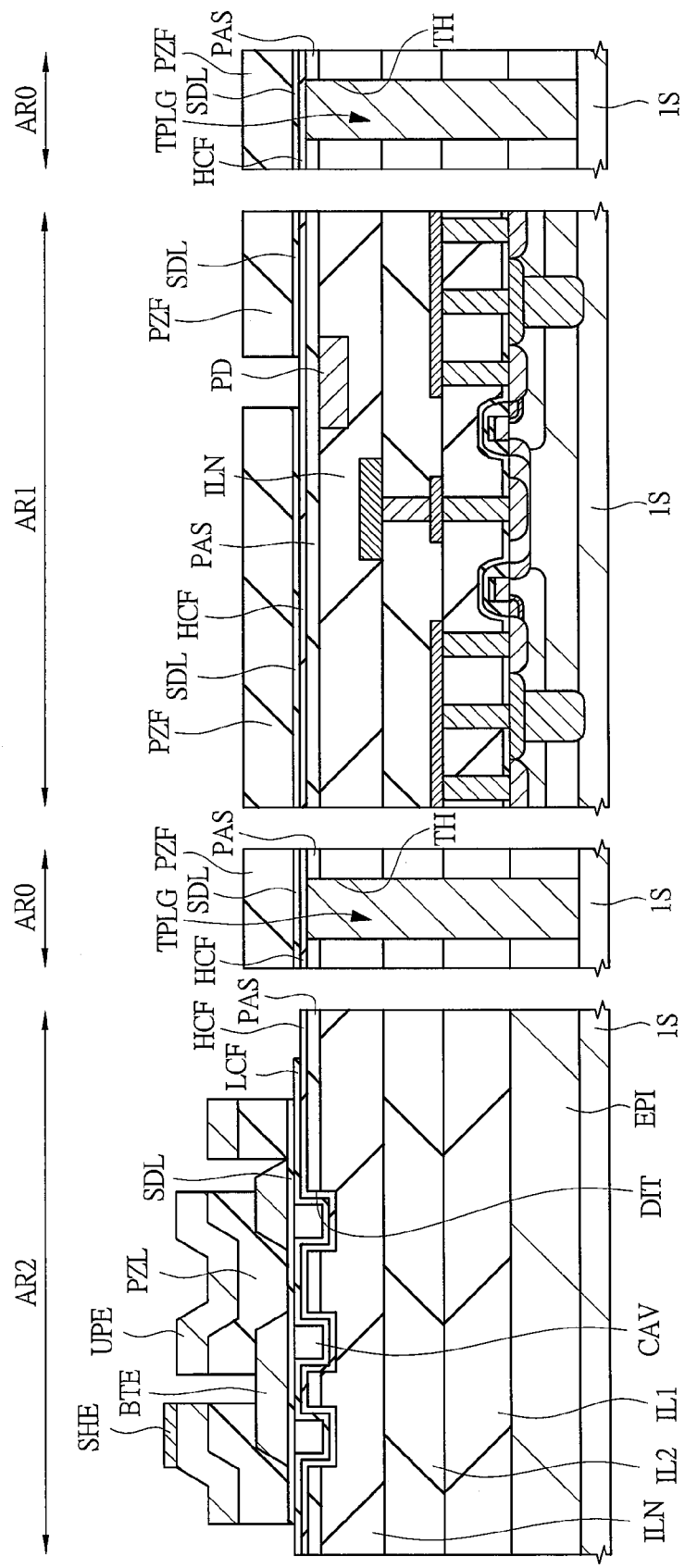
FIG. 53 is a cross-sectional view showing the manufacturing process of the semiconductor device continued from FIG. 52.

Thereafter, as shown in FIG. 53, by removing the sacrificial layer SCL buried in the grooves DIT formed on the area AR2, cavity portions CAV are formed. At this time, for example, the sacrificial layer SCL is made of a silicon oxide film, and the low heat conductivity film LCF is made of, for example, a silicon nitride film or an aluminum oxide film. Therefore, the low heat conductivity film LCF functions as an etching stopper when etching the sacrificial layer SCL. Moreover, in the fourth embodiment, the high heat conductivity film HCF made of, for example, an aluminum nitride film is formed as the lower layer of the low heat conductivity film LCF. Therefore, although the interlayer insulating film ILN which is made of a silicon oxide film similar to that of the sacrificial layer SCL is formed as the lower layer of the high heat conductivity film HCF, since the low heat conductivity film LCF and the high heat conductivity film HCF function as etching stoppers when etching the sacrificial layer SCL, it is possible to protect the interlayer insulating film ILN.

Figure 54:
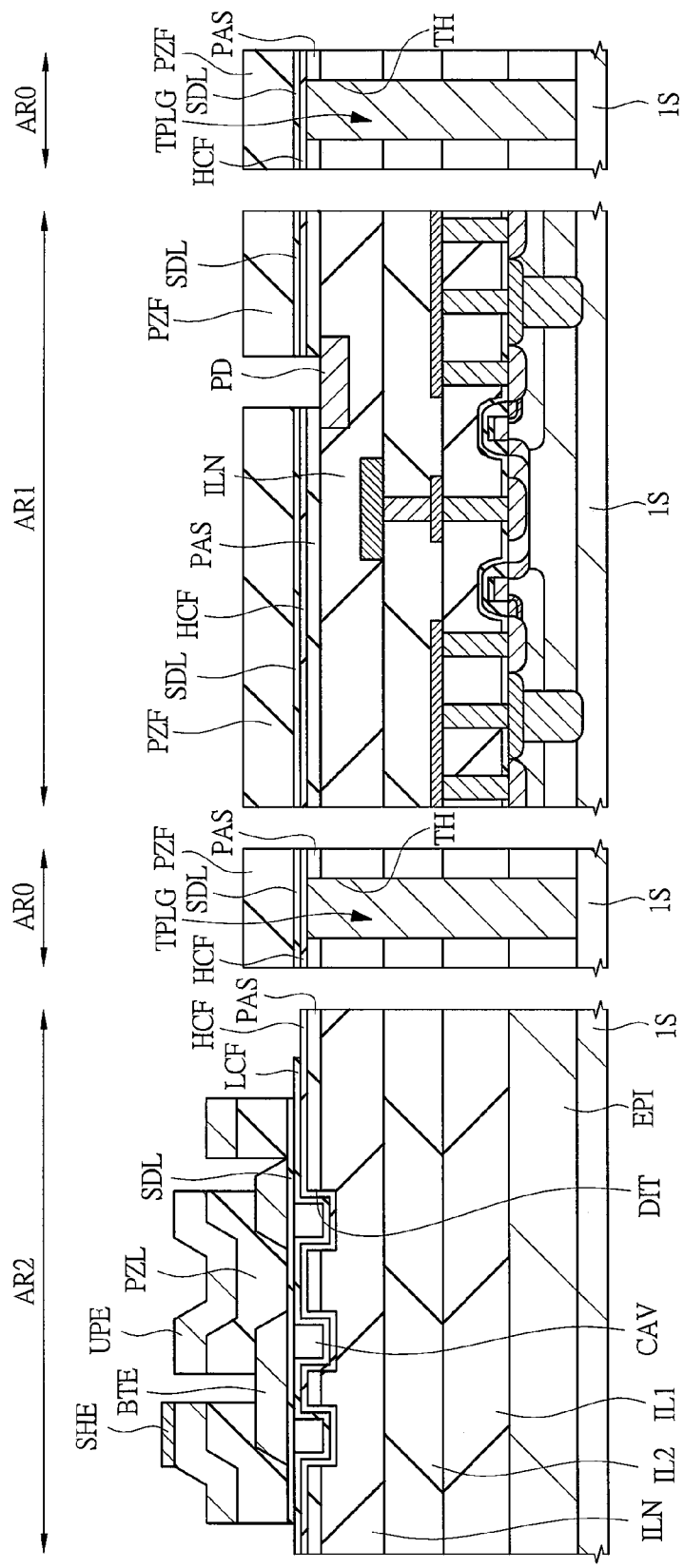
FIG. 54 is a cross-sectional view showing the manufacturing process of the semiconductor device continued from FIG. 53.

Thereafter, as shown in FIG. 54, an opening is formed in the high heat conductivity film HCF and the passivation film PAS formed on the area AR1 by using a photolithography technique and an etching technique. By this means, the surface of the pad PD formed on the area AR1 can be exposed. In this manner, the semiconductor device of the fourth embodiment is manufactured.

Fifth Embodiment

In the fifth embodiment, an example in which a heterojunction bipolar transistor (HBT) is used as the semiconductor element constituting a power amplifier PA will be described. More specifically, in the fifth embodiment, an example in which the HBT and a thin-film piezoelectric bulk wave resonator BAW are formed on the same semi-insulating substrate (in this specification, it is assumed that the semi-insulating substrate is also included in the semiconductor substrate) will be described.

For example, a semiconductor element using a III-V group compound semiconductor such as gallium arsenide (GaAs) is known. The compound semiconductor has characteristics that a mobility thereof is higher in comparison with that of silicon (Si) and a semi-insulating crystal can be obtained. Moreover, the compound semiconductor can create a mixed crystal and a heterojunction can be formed.

As the semiconductor element using the heterojunction, a heterojunction bipolar transistor (hereinafter, referred to as HBT) is known. This HBT is a bipolar transistor in which gallium arsenide is used as a base layer and indium gallium phosphide (InGaP), aluminum gallium arsenide (AlGaAs) or the like is used as an emitter layer. More specifically, the HBT is a bipolar transistor in which the heterojunction is formed by using different semiconductor materials for the base layer and the emitter layer.

By this heterojunction, the bandgap of the emitter in the base-emitter junction can be made larger than the bandgap of the base. Therefore, since the carrier injection from the emitter to the base can be made extremely larger in comparison with the carrier injection of reverse charge from the base to the emitter, the current amplification factor of the HBT is extremely large. Since the current amplification factor of the HBT is extremely large as described above, the HBT is used for, for example, the power amplifier PA mounted on a mobile phone. The device structure of the HBT will be described below.

<Device Structure of HBT>

Figure 55:
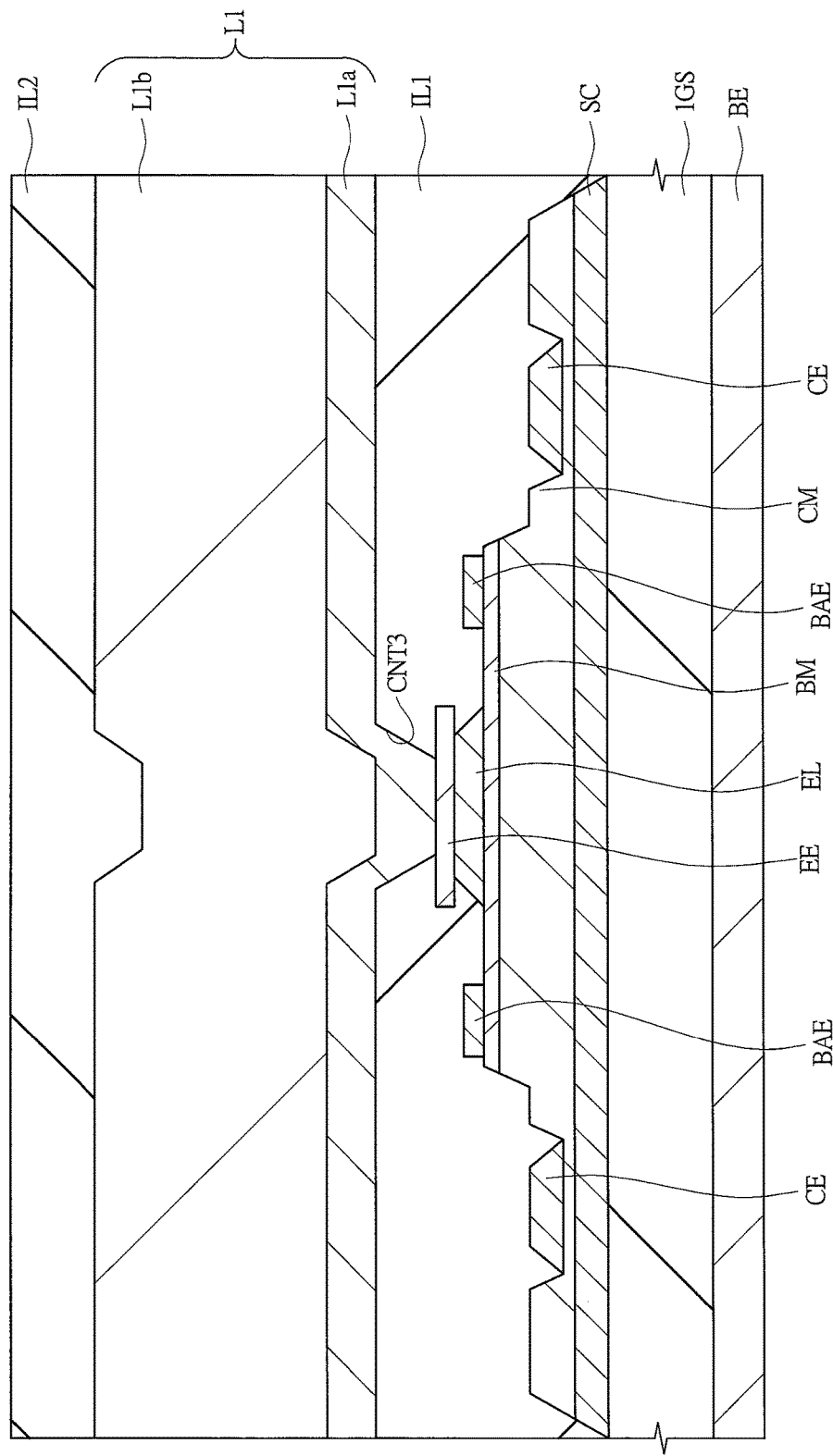
FIG. 55 is a cross-sectional view showing a device structure of an HBT in the fifth embodiment.

FIG. 55 is a cross-sectional view showing the device structure of the HBT. As shown in FIG. 55, a back surface electrode BE made of a gold film or the like is formed on a rear surface of a semi-insulating GaAs substrate (semi-insulating substrate) 1GS, and the HBT is formed on a surface (main surface) of the GaAs substrate 1GS. A sub-collector layer SC is formed on the surface of the GaAs substrate 1GS, and a collector electrode CE and a collector mesa CM are formed on this sub-collector layer SC. On the collector mesa CM, a base mesa BM is formed, and a base electrode BAE is formed on a peripheral portion of the base mesa BM. Moreover, an emitter layer EL is formed at the center portion of the base mesa BM, and an emitter electrode EE is formed on this emitter layer EL. On the HBT configured in this manner, an interlayer insulating film IL1 made of, for example, a silicon oxide film is formed. Furthermore, a connection hole CNT3 which penetrates the interlayer insulating film IL1 to reach the emitter electrode EE is formed. On the interlayer insulating film IL1 including the inside of the connection hole CNT3, a first layer wiring L1 composed of a gold wiring L1a constituting an emitter wiring and a gold wiring L1b is formed. Moreover, on the first layer wiring L1, an interlayer insulating film IL2 made of, for example, a silicon oxide film is formed.

In the HBT configured in this manner, the bandgap of the emitter in the base-emitter junction can be made larger than the bandgap of the base by the hetero junction. Therefore, since the carrier injection from the emitter to the base can be made extremely larger in comparison with the carrier injection of reverse charge from the base to the emitter, the current amplification factor of the HBT is extremely large. For this reason, the HBT can be used for the power amplifier PA. Note that, by connecting a plurality of the HBTs shown in FIG. 55 in parallel with one another, for example, the amplifier unit FAMP, the amplifier unit SAMP and the amplifier unit TAMP shown in FIG. 2 are formed.

<Device Structure of Semiconductor Device in Fifth Embodiment>

Figure 56:
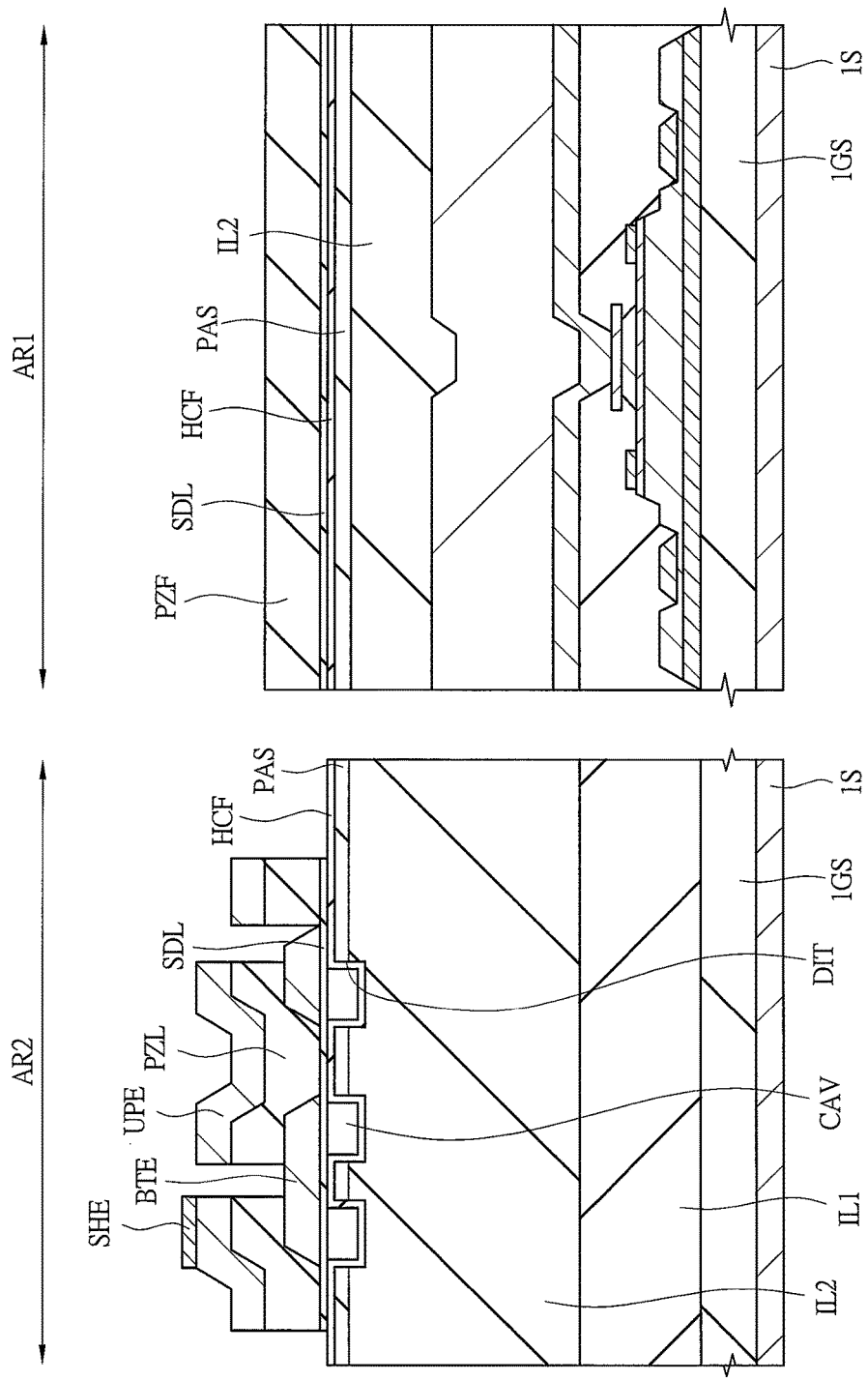
FIG. 56 is a cross-sectional view showing a configuration of a semiconductor device in the fifth embodiment.

Next, the device structure of the semiconductor device in the fifth embodiment will be described. FIG. 56 is a cross-sectional view showing the configuration of a semiconductor device in the fifth embodiment. FIG. 56 shows a structure formed on the area AR1 and the area AR2 of the GaAs substrate 1GS. The area AR1 is an area on which the HBT constituting the power amplifier PA is formed and the area AR2 is an area on which the thin-film piezoelectric bulk wave resonator BAW constituting a transmitting filter TXF or a receiving filter RXF is formed. More specifically, in the fifth embodiment, the HBT and the thin-film piezoelectric bulk wave resonator BAW are formed on the same GaAs substrate 1GS.

First, the structure formed on the area AR1 of the GaAs substrate 1GS will be described with reference to FIG. 56. In FIG. 56, on the area AR1 of the GaAs substrate 1GS, for example, the HBT having the structure shown in FIG. 55 is formed, and an interlayer insulating film made of, for example, a silicon oxide film is formed on the HBT. Moreover, on the interlayer insulating film, a plurality of wiring layers made of, for example, a gold film are formed, and an interlayer insulating film IL2 made of, for example, a silicon oxide film is formed on the wiring layers. On the interlayer insulating film IL2, a passivation film (surface protective film) PAS made of, for example, a silicon nitride film is formed. Moreover, on the passivation film PAS, a high heat conductivity film HCF having a heat conductivity higher than that of the interlayer insulating film IL2 is formed. The high heat conductivity film HCF is made of, for example, an aluminum nitride film (heat conductivity: 150 W/m·K) or a magnesium oxide film (heat conductivity: 59 W/m·K). Moreover, on the high heat conductivity film HCF, a seed layer SDL and a piezoelectric film PZF made of, for example, aluminum nitride films are formed.

Next, the structure formed on the area AR2 of the GaAs substrate 1GS will be described with reference to FIG. 56. In FIG. 56, an interlayer insulating film IL1 made of, for example, a silicon oxide film is formed on the GaAs substrate 1GS. On this interlayer insulating film IL1, an interlayer insulating film IL2 made of, for example, a silicon oxide film is formed. Moreover, on the interlayer insulating film IL2, for example, the thin-film piezoelectric bulk wave resonator BAW constituting the transmitting filter TXF or the receiving filter RXF is formed. Note that, since the configuration of the thin-film piezoelectric bulk wave resonator BAW is the same as that of the aforementioned first embodiment, the description thereof will be omitted.

The semiconductor device in the fifth embodiment is configured as described above, and the characteristics thereof will be described below. For example, the characteristic of the fifth embodiment lies in that the high heat conductivity film HCF having a heat conductivity higher than that of the interlayer insulating film IL2 is provided on the passivation film PAS as shown in FIG. 56. In other words, the characteristic in the fifth embodiment lies in that the high heat conductivity film HCF is formed on the passivation film PAS over the entire area of the GaAs substrate 1GS including the area AR1 on which the HBT is formed and the area AR2 on which the thin-film piezoelectric bulk wave resonator BAW is formed. Accordingly, heat mainly generated in the HBT is efficiently dissipated in all the directions by the high heat conductivity film HCF formed over the entire surface of the GaAs substrate 1GS. Consequently, since the temperature of the area AR1 on which the HBT is formed can be lowered, the temperature rise of the thin-film piezoelectric bulk wave resonator BAW caused by the heat generation from the HBT formed on the area AR1 can be suppressed. Therefore, in the fifth embodiment, it is possible to sufficiently suppress the temperature rise of the thin-film piezoelectric bulk wave resonator BAW caused by the heat generation from the HBT even in the case where the thin-film piezoelectric bulk wave resonator BAW and the HBT are mounted on the same GaAs substrate 1GS, with the result that it becomes possible to suppress degradation of filter characteristics (electrical characteristics) of the transmitting filter TXF and the receiving filter RXF each of which is constituted by the thin-film piezoelectric bulk wave resonator BAW.

Sixth Embodiment

In the sixth embodiment, an example in which a thin-film piezoelectric bulk wave resonator BAW constituting a transmitting filter TXF or a receiving filter RXF, a MOSFET constituting an antenna switch and an LDMOSFET constituting a power amplifier PA are formed on the same SOI substrate will be described.

In recent years, various application functions have been added to a mobile phone in addition to a voice communication function. More specifically, various functions other than the voice communication function such as audio-visual functions for distributed music, animation transmission and data transfer by the use of the mobile phone have been added to the mobile phone. In conjunction with the addition of these multiple functions to the mobile phone, there are a large number of frequency bands (GSM (registered trademark) (Global System for Mobile Communications), PCS (Personal Communication Services) and others) and modulating systems (GSM, EDGE (Enhanced Data rates for GSM Evolution), WCDMA (Wideband Code Division Multiplex Access) and others) in many countries in the world. Therefore, the mobile phone needs to be adapted to transmission and reception signals corresponding to a plurality of different frequency bands and different modulating systems. For this reason, in the mobile phone, a single antenna is compatibly used for the transmission and reception of the transmission and reception signals, and connection to the antenna is switched by an antenna switch.

Figure 57:
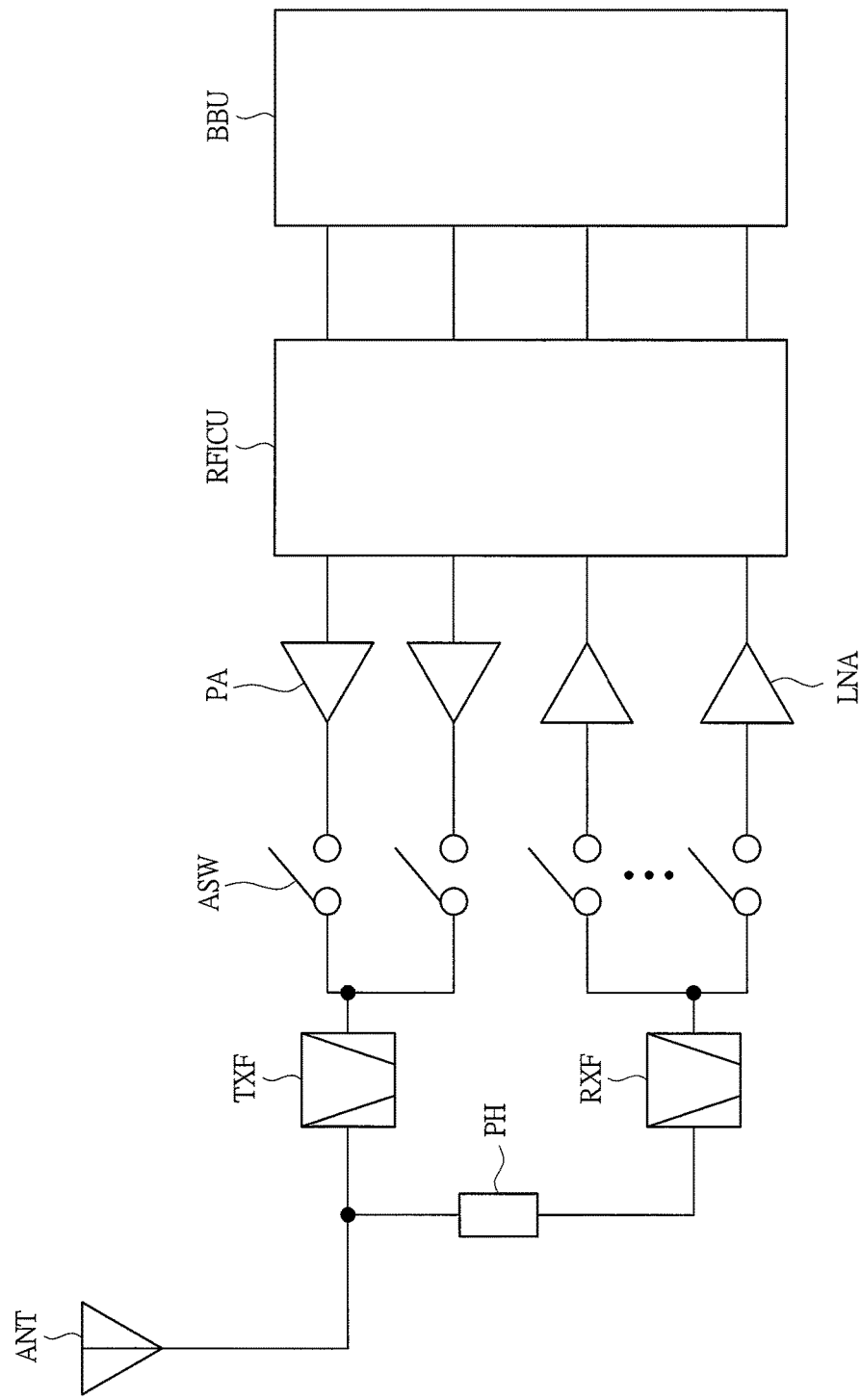
FIG. 57 is a block diagram showing a configuration of a transmitting/receiving unit of a mobile phone in the sixth embodiment.

For example, FIG. 57 is a block diagram showing a configuration of a transmitting/receiving unit of a mobile phone. As shown in FIG. 57, the mobile phone in the sixth embodiment is provided with a base-band unit BBU, a radio frequency integrated circuit unit RFICU, a power amplifier PA, a transmitting filter TXF, a receiving filter RXF, a phase shifter PH, a low noise amplifier, an antenna switch ASW and an antenna ANT.

In the mobile phone in the sixth embodiment thus configured, a plurality of transmitting paths can be selected by the antenna switch ASW, and also a plurality of receiving paths can be selected by the antenna switch ASW.

<Device Structure of Antenna Switch>

The structure of a MOSFET constituting the above-mentioned antenna switch ASW will be described below. The antenna switch ASW needs to have the capability of ensuring high quality of a transmission signal with large power and also reducing generation of an interference wave (high-order harmonics) that gives adverse effects to communications of the other frequency bands. For this reason, in the case where a field-effect transistor is used as a switching element constituting the antenna switch ASW, the field-effect transistor is required to have not only the high withstand voltage but also the capability of reducing high-order harmonic distortions.

For this reason, in order to realize the low loss and low harmonic distortions, as the field-effect transistor constituting the antenna switch ASW, a field-effect transistor formed on a GaAs substrate or a sapphire substrate, which has less parasitic capacitance and is superior in linearity (for example, HEMT (High Electron Mobility Transistor)), is used. However, the compound semiconductor substrate that is superior in high frequency characteristics is expensive, and is not desirable from the viewpoint of cost reduction of the antenna switch. In order to realize the cost reduction of the antenna switch, it is effective to use a field-effect transistor formed on an inexpensive silicon substrate. However, an inexpensive silicon substrate has a large parasitic capacitance in comparison with the expensive compound semiconductor substrate, and a harmonic distortion becomes larger than that of the field-effect transistor formed on the compound semiconductor substrate.

Therefore, in the sixth embodiment, an example in which an antenna switch ASW is constituted by a MOSFET formed on, for example, an SOI (silicon on insulator) substrate from the viewpoint of the cost reduction of the antenna switch will be described.

Figure 58:
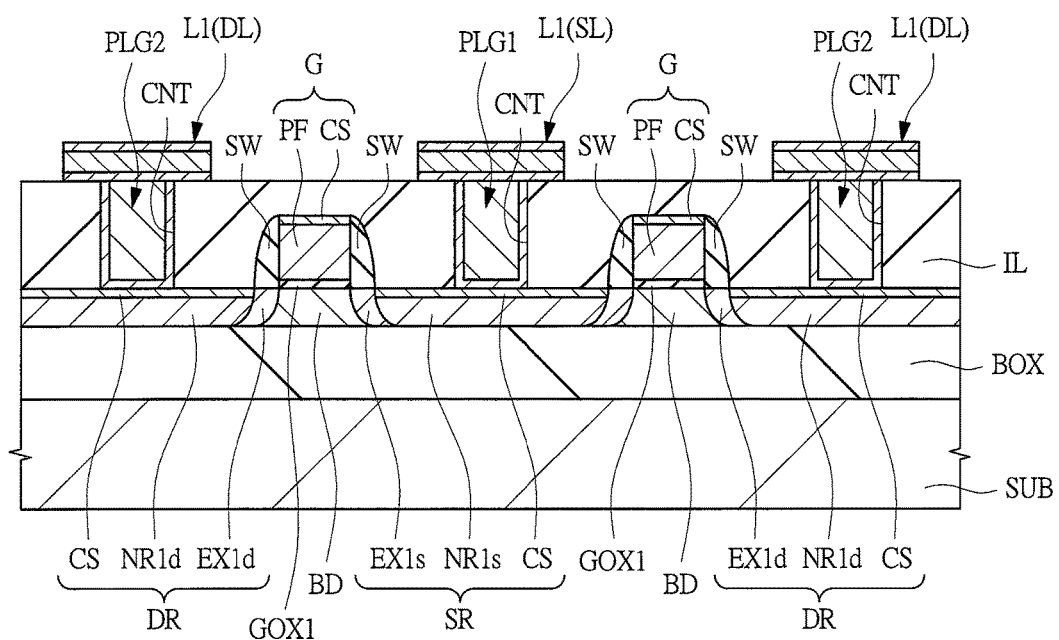
FIG. 58 is a cross-sectional view showing a device structure of a MOSFET in the sixth embodiment.

FIG. 58 is a cross-sectional view showing a cross section of the MOSFET. In FIG. 58, a buried insulating layer BOX is formed on a semiconductor substrate (support substrate) SUB, and a silicon layer is formed on this buried insulating layer BOX. The semiconductor substrate SUB, the buried insulating layer BOX and the silicon layer constitute the SOI substrate. Moreover, a MOSFET is formed on the SOI substrate. A body region BD is formed in the silicon layer of the SOI substrate. This body region BD is formed by, for example, a p-type semiconductor region in which a p-type impurity such as boron is introduced. On the body region BD, a gate insulating film GOX1 is formed, and a gate electrode G is formed on the gate insulating film GOX1. The gate insulating film GOX1 is made of, for example, a silicon oxide film. On the other hand, the gate electrode G is formed by a laminated film of a polysilicon film PF and a cobalt silicide film CS. The cobalt silicide film CS constituting one portion of the gate electrode G is formed so as to reduce the resistance of the gate electrode G.

Subsequently, sidewalls SW are formed on both side walls of the gate electrode G, and low concentration impurity diffusion regions EX1s and EX1d are formed in the silicon layer below the sidewalls SW. These low concentration impurity diffusion regions EX1s and EX1d are formed so as to be aligned with the gate electrode G. Moreover, on the outside of the low concentration impurity diffusion region EX1s, a high concentration impurity diffusion region NR1s is formed, and on the outside of the low concentration impurity diffusion region EX1d, a high concentration impurity diffusion region NR1d is formed. The high concentration impurity diffusion regions NR1s and NR1d are formed so as to be aligned with the sidewalls SW. Moreover, on the surfaces of the high concentration impurity diffusion regions NR1s and NR1d, a cobalt silicide film CS is formed. The low concentration impurity diffusion region EX1s, the high concentration impurity diffusion region NR1s and the cobalt silicide film CS constitute a source region SR, and the low concentration impurity diffusion region EX1d, the high concentration impurity diffusion region NR1d and the cobalt silicide film CS constitute a drain region DR.

The low concentration impurity diffusion regions EX1s and EX1d and the high concentration impurity diffusion regions NR1s and NR1d are both semiconductor regions in which an n-type impurity such as phosphorus or arsenic is introduced, and the concentration of the impurity introduced into the low concentration impurity diffusion regions EX1s and EX1d is lower than the concentration of the impurity introduced into the high concentration impurity diffusion regions NR1s and NR1d.

The MOSFET in the sixth embodiment is configured as described above, and a wiring structure formed on the MOSFET will be described below. In FIG. 58, an interlayer insulating film IL is formed so as to cover the MOSFET of the sixth embodiment. The interlayer insulating film IL is made of, for example, a silicon oxide film. Moreover, a contact hole CNT that reaches the source region SR and a contact hole CNT that reaches the drain region DR are formed in the interlayer insulating film IL. Furthermore, a titanium/titanium nitride film and a tungsten film are buried into the contact holes CNT, so that plugs PLG1 and PLG2 are formed. On the interlayer insulating film IL in which the plug PLG1 and the plug PLG2 are formed, a first layer wiring L1 (source wiring SL, drain wiring DL) is formed. For example, the first layer wiring L1 is formed by a laminated film of a titanium/titanium nitride film, an aluminum film and a titanium/titanium nitride film. Moreover, a multilayer wiring is formed on the first layer wiring L1, but the illustration thereof is omitted in FIG. 58. The MOSFET in the sixth embodiment is formed in the above-described manner.

<Device Structure of Semiconductor Device in Sixth Embodiment>

Figure 59:
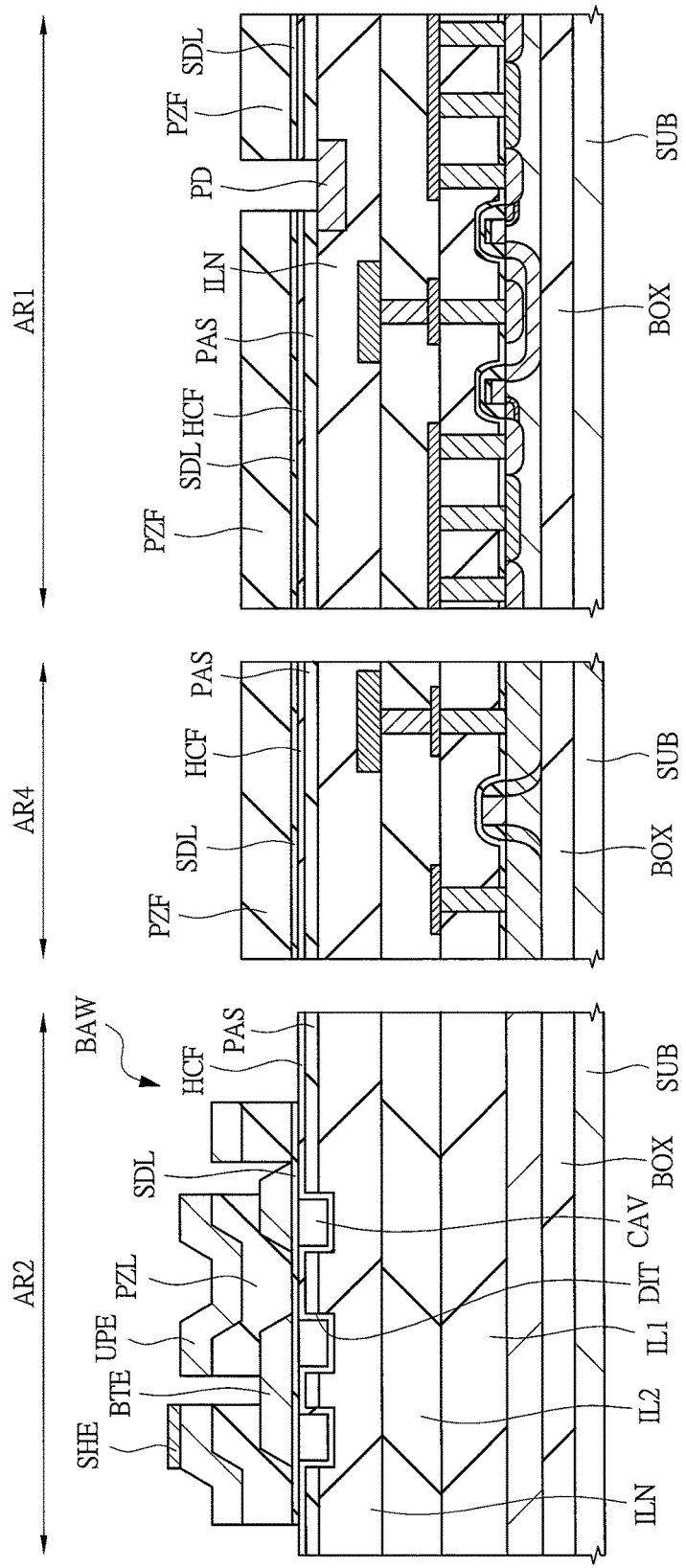
FIG. 59 is a cross-sectional view showing a configuration of a semiconductor device in the sixth embodiment.

Next, a device structure of the semiconductor device in the sixth embodiment will be described. FIG. 59 is a cross-sectional view showing the configuration of the semiconductor device in the sixth embodiment. FIG. 59 shows structures formed on the area AR1, the area AR2 and the area AR4 of an SOI substrate. The area AR1 is an area on which an LDMOSFET constituting a power amplifier PA is formed, and the area AR2 is an area on which a thin-film piezoelectric bulk wave resonator BAW constituting a transmitting filter TXF or a receiving filter RXF is formed. Moreover, the area AR4 is an area on which a MOSFET constituting an antenna switch ASW is formed. In other words, in the sixth embodiment, the LDMOSFET, the thin-film piezoelectric bulk wave resonator BAW and the MOSFET are formed on the same SOI substrate.

First, a structure formed on the area AR1 of the SOI substrate will be described with reference to FIG. 59. In FIG. 59, on the area AR1 of the SOI substrate, for example, an LDMOSFET having the structure shown in FIG. 3 is formed, and an interlayer insulating film made of, for example, a silicon oxide film is formed on this LDMOSFET. Moreover, on the interlayer insulating film, a plurality of wiring layers made of, for example, aluminum films are formed, and an interlayer insulating film ILN made of, for example, a silicon oxide film is formed on these wiring layers. On the surface of the interlayer insulating film ILN, a pad PD is formed. The pad PD functions as an external connection terminal, and for example, a bonding wire is connected thereto.

On the interlayer insulating film ILN on which the pad PD is formed, a passivation film (surface protective film) PAS made of, for example, a silicon nitride film is formed. An opening is formed in the passivation film PAS formed on the pad PD, and the pad PD is exposed through the opening. Moreover, on the passivation film PAS, a high heat conductivity film HCF having a heat conductivity higher than that of the interlayer insulating film ILN is formed. This high heat conductivity film HCF is composed of, for example, an aluminum nitride film (heat conductivity: 150 W/m·K) or a magnesium oxide film (heat conductivity: 59 W/m·K). An opening is formed also in this high heat conductivity film HCF, and the pad PD is exposed through this opening. Moreover, a seed layer SDL and a piezoelectric film PZF are formed on the passivation film PAS. Since the seed layer SDL and the piezoelectric film PZF are made of, for example, aluminum nitride films, they have the same function as that of the high heat conductivity film HCF. An opening is formed also in these seed layer SDL and piezoelectric film PZF, and the pad PD is exposed through the opening.

Next, a structure formed on the area AR2 of the SOI substrate will be described with reference to FIG. 59. In FIG. 59, on the SOI substrate, an interlayer insulating film IL1 made of, for example, a silicon oxide film is formed. On the interlayer insulating film IL1, an interlayer insulating film IL2 made of, for example, a silicon oxide film is formed. Moreover, on the interlayer insulating film IL2, an interlayer insulating film ILN made of, for example, a silicon oxide film is formed, and a thin-film piezoelectric bulk wave resonator BAW constituting a transmitting filter TXF or a receiving filter RXF is formed on the interlayer insulating film ILN. Note that, since the structure of the thin-film piezoelectric bulk wave resonator BAW is the same as that of the aforementioned first embodiment, the description thereof will be omitted.

Next, a structure formed on the area AR4 of the SOI substrate will be described with reference to FIG. 59. In FIG. 59, for example, the MOSFET (see FIG. 58) constituting the antenna switch ASW is formed on the SOI substrate, and an interlayer insulating film IL1 made of a silicon oxide film is formed so as to cover the MOSFET. On the interlayer insulating film IL1, an interlayer insulating film IL2 made of, for example, a silicon oxide film is formed. Moreover, on the interlayer insulating film IL2, an interlayer insulating film ILN made of, for example, a silicon oxide film is formed, a passivation film PAS is formed on the interlayer insulating film ILN, and a high heat conductivity film HCF is formed on this passivation film PAS. Moreover, a seed layer SDL and a piezoelectric film PZF are formed on the passivation film PAS. Since the seed layer SDL and the piezoelectric layer PZF are made of, for example, aluminum nitride films, they have the same function as that of the high heat conductivity film HCF.

The semiconductor device in the sixth embodiment is configured as described above, and the characteristics thereof will be described below. The characteristic of the sixth embodiment lies in that the high heat conductivity film HCF having a heat conductivity higher than that of the interlayer insulating film ILN is provided on the passivation film PAS as shown in FIG. 59. In other words, the characteristic in the sixth embodiment lies in that the high heat conductivity film HCF is formed on the passivation film PAS over the entire area of the SOI substrate including the area AR1 on which the LDMOSFET is formed, the area AR2 on which the thin-film piezoelectric bulk wave resonator BAW is formed and the area AR4 on which the MOSFET is formed. Accordingly, heat mainly generated in the LDMOSFET is efficiently dissipated in all the directions by the high heat conductivity film. HCF formed over the entire surface of the SOI substrate. Consequently, since the temperature of the area AR1 on which the LDMOSFET is formed can be lowered, the temperature rise of the thin-film piezoelectric bulk wave resonator BAW caused by the heat generation from the LDMOSFET formed on the area AR1 can be suppressed. Therefore, in the sixth embodiment, it is possible to sufficiently suppress the temperature rise of the thin-film piezoelectric bulk wave resonator BAW caused by the heat generation from the LDMOSFET even in the case where the thin-film piezoelectric bulk wave resonator BAW, the LDMOSFET and the MOSFET are mounted on the same SOI substrate, with the result that it becomes possible to suppress degradation of filter characteristics (electrical characteristics) of the transmitting filter TXF and the receiving filter RXF constituted by the thin-film piezoelectric bulk wave resonator BAW.

In particular, in the sixth embodiment, the area AR4 on which the MOSFET is formed is desirably provided between the area AR2 on which the thin-film piezoelectric bulk wave resonator BAW is formed and the area AR1 on which the LDMOSFET is formed. This is because it becomes possible to suppress the influences of the heat generated in the LDMOSFET formed on the area AR1 from being given to the thin-film piezoelectric bulk wave resonator BAW formed on the area AR2 by providing the area AR4 between the area AR1 and the area AR2. More specifically, in the case where the area AR1 and the area AR2 are adjacent to each other, the heat from the LDMOSFET formed on the area AR1 is likely to give adverse effects to the thin-film piezoelectric bulk wave resonator BAW formed on the area AR2, but by providing the area AR4 between the area AR1 and the area AR2, the distance between the area AR1 and the area AR2 can be made longer. As a result, it is possible to effectively suppress the influences of the heat generated in the LDMOSFET formed on the area AR1 from being given to the thin-film piezoelectric bulk wave resonator BAW formed on the area AR2.

<Modified Example of Sixth Embodiment

In the above-mentioned sixth embodiment, the case where the antenna switch ASW is constituted by a MOSFET formed on the SOI substrate has been described. However, the technical ideas of the present invention can be applied also to the case where the antenna switch ASW is formed by using an HEMT.

For example, since the HEMT is formed on a semi-insulating substrate (GaAs substrate), when the power amplifier PA is constituted by the HBT, the HEMT, the HBT and the thin-film piezoelectric bulk wave resonator BAW can be formed on the same semi-insulating substrate (GaAs substrate). Moreover, it is possible to adopt a structure in which the high heat conductivity film HCF is formed on the passivation film PAS over the entire area of the semi-insulating substrate including the area AR1 on which the HBT is formed, the area AR2 on which the thin-film piezoelectric bulk wave resonator BAW is formed and the area AR4 on which the HEMT is formed. Accordingly, heat mainly generated in the HBT is efficiently dissipated in all the directions by the high heat conductivity film HCF formed on the entire surface of the semi-insulating substrate. As a result, since the temperature of the area AR1 on which the HBT is formed can be lowered, it is possible to suppress the temperature rise of the thin-film piezoelectric bulk wave resonator BAW caused by the heat generated from the HBT formed on the area AR1.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention can be widely applied to manufacturing industries for manufacturing semiconductor devices.

EXPLANATION OF REFERENCE NUMERALS

1GS: GaAs substrate
1S: semiconductor substrate

ANT: antenna
ANT (OUT): antenna terminal
AR0: area
AR1: area
AR2: area
AR3: area
AR4: area
ASW: antenna switch
A1: frequency
A2: frequency
BAE: base electrode
BAW: thin-film piezoelectric bulk wave resonator
BAW1: thin-film piezoelectric bulk wave resonator
BAW2: thin-film piezoelectric bulk wave resonator
BAW3: thin-film piezoelectric bulk wave resonator
BAW4: thin-film piezoelectric bulk wave resonator
BAW5: thin-film piezoelectric bulk wave resonator
BAW6: thin-film piezoelectric bulk wave resonator
BAW7: thin-film piezoelectric bulk wave resonator
BBU: baseband unit
BD: body region
BE: back surface electrode
BM: base mesa
BOX: buried insulating layer
BTE: lower electrode
CAP: cap insulating film
CAV: cavity portion
CE: collector electrode
CF1: first conductor film
CF2: second conductor film
CM: collector mesa
CNT: contact hole
CNT1: contact hole
CNT2: connection hole
CNT3: connection hole
CS: cobalt silicide film
CU: control circuit
DIT: groove
DIT1: groove
DIT2: groove
DL: drain wiring
DR: drain wiring
DR1: $n^+$-type drain region
DT: groove
EE: emitter electrode
EL: emitter layer
EPI: epitaxial layer
EX1$d$: low concentration impurity diffusion region
EX1$s$: low concentration impurity diffusion region
FAMP: amplifier unit
G: gate electrode
GOX: gate insulating film
GOX1: gate insulating film
HALO: p-type halo region
HCF: high heat conductivity film
HINP: high acoustic impedance film
IL: interlayer insulating film
IL1: interlayer insulating film
IL2: interlayer insulating film
ILN: interlayer insulating film
LCF: low heat conductivity film
LIMP: low acoustic impedance film
LNA: low noise amplifier
L1: first layer wiring
L1$a$: gold wiring
L1$b$: gold wiring
L2: second layer wiring
NR1$d$: high concentration impurity diffusion region
NR1$s$: high concentration impurity diffusion region
ODR1: $n^-$-type offset drain region
ODR2: n-type offset drain region
PA: power amplifier
PAS: passivation film
PD: pad
PF: polysilicon film
PH: phase shifter
Pin (GSM): input power
PL: p-type punching layer
PLG1: plug
PLG2: plug
Pout (GSM): output signal
PR1: $p^+$-type semiconductor region
PWL: p-type well
PZF: piezoelectric film
PZL: piezoelectric layer
RFICU: radio frequency integrated circuit unit
RX: receiving terminal
RXF: receiving filer
RXMIX: receiving mixer
SAMP: amplifier unit
SC: sub-collector layer
SCL: sacrificial layer
SDL: seed layer
SHE: shunt electrode
SL: source wiring
SN: silicon nitride film
SR: source region
SR1: $n^-$-type source region
SR2: $n^+$-type source region
SUB: semiconductor substrate
SW: sidewall
SYN: synthesizer
TAMP: amplifier unit
TH: through groove
TPLG: heat-dissipation plug
TX: transmitting terminal
TXF: transmitting filter
TXMIX: transmitting mixer
UPE: upper electrode
Vcontrol (GSM): control signal

What is claimed is:
1. A semiconductor device comprising:
(a) a semiconductor substrate;
(b) a power amplifier which amplifies power of a transmission signal, outputs the transmission signal to an antenna and is formed on a first area of the semiconductor substrate;
(c) a transmission filter connected between the power amplifier and the antenna;
(d) an insulating film formed on the semiconductor substrate so as to cover the power amplifier;
(e) a high heat conductivity film which is formed on the insulating film and has a heat conductivity higher than that of the insulating film; and
wherein the transmission filter includes a thin-film piezoelectric bulk wave resonator which is formed on the insulating film formed on a second area of the semiconductor substrate, with the high heat conductivity film interposed therebetween,
wherein the semiconductor substrate is provided with a third area between the first area and the second area, and concave and convex shapes are formed on a surface of the insulating film formed on the third area of the semiconductor substrate.

2. The semiconductor device according to claim 1, wherein a low heat conductivity film having a heat conductivity lower than that of the high heat conductivity film is formed between the high heat conductivity film and the thin-film piezoelectric bulk wave resonator.

3. The semiconductor device according to claim 2, wherein the low heat conductivity film is made of an aluminum oxide film or a silicon nitride film.

4. The semiconductor device according to claim 1, wherein a groove which extends from a surface of the insulating film to reach the semiconductor substrate is formed on a periphery of the first area of the semiconductor substrate, and a conductive material is buried in the groove.

5. The semiconductor device according to claim 1, wherein the high heat conductivity film is made of an aluminum nitride film or a magnesium oxide film.

6. The semiconductor device according to claim 1, wherein concave and convex shapes are formed on a surface of the insulating film formed on the first area of the semiconductor substrate.

7. The semiconductor device according to claim 1, wherein the thin-film piezoelectric bulk wave resonator includes:

(e1) an acoustic insulating portion formed on the high heat conductivity film;

(e2) a lower electrode formed on the acoustic insulating portion;

(e3) a piezoelectric layer formed on the lower electrode; and (e4) an upper electrode formed on the piezoelectric layer.

8. The semiconductor device according to claim 7, wherein the acoustic insulating portion is formed by a cavity portion sandwiched between a concave portion formed in the insulating film and the lower electrode.

9. The semiconductor device according to claim 7, wherein the acoustic insulating portion is formed by an acoustic mirror buried in a concave portion formed in the insulating film.

* * * * *